United States Patent
Watanabe et al.

(10) Patent No.: US 6,878,508 B2
(45) Date of Patent: Apr. 12, 2005

(54) RESIST PATTERNING PROCESS

(75) Inventors: Satoshi Watanabe, Niigata-ken (JP); Tomohiro Kobayashi, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 190 days.

(21) Appl. No.: 10/193,224

(22) Filed: Jul. 12, 2002

(65) Prior Publication Data

US 2003/0108819 A1 Jun. 12, 2003

(30) Foreign Application Priority Data

| Jul. 13, 2001 | (JP) | ........................................ | 2001-213015 |
| Sep. 27, 2001 | (JP) | ........................................ | 2001-295653 |
| Feb. 22, 2002 | (JP) | ........................................ | 2002-045588 |

(51) Int. Cl.$^7$ ................................................ G03C 5/00
(52) U.S. Cl. .................... 430/325; 430/330; 430/270.1; 430/296; 525/326.8
(58) Field of Search ............................... 430/325, 330, 430/270.1, 296; 525/326.8

(56) References Cited

U.S. PATENT DOCUMENTS

| 6,207,779 B1 | 3/2001 | Chang et al. ................ 526/280 |
| 6,372,854 B1 | 4/2002 | Sunaga et al. ............ 525/326.8 |
| 6,670,498 B2 * | 12/2003 | Nishi et al. .................. 560/116 |
| 2002/0114084 A1 * | 8/2002 | Summersgill et al. ...... 359/742 |

FOREIGN PATENT DOCUMENTS

| EP | 1 004 568 A | 5/2000 |
| EP | 1099983 A1 | 5/2001 |
| EP | 1149825 A2 | 10/2001 |
| JP | 04039665 A | 2/1992 |
| JP | 05257281 A | 10/1993 |
| JP | 05257285 A | 10/1993 |
| JP | 06342212 A | 12/1994 |
| JP | 07333850 A | 12/1995 |
| JP | 09230595 A | 9/1997 |
| JP | 09244247 A | 9/1997 |
| JP | 10254139 A | 9/1998 |
| JP | 11130843 A | 5/1999 |
| JP | 11130844 A | 5/1999 |
| JP | 11130845 A | 5/1999 |
| JP | 11171982 A | 6/1999 |
| JP | 2000109545 A | 4/2000 |
| JP | 2000109545 | 4/2000 |
| JP | 2000159758 A | 6/2000 |
| JP | 2000357544 A | 12/2000 |
| JP | 2001027803 A | 1/2001 |
| WO | 97/33198 | 9/1997 |

OTHER PUBLICATIONS

Jin–Soo Kim et al., The Extension of Optical Lithography to Define Contact Holes Required at Advanced Giga–bit–Scale Integration, Journal of Photopolymer Science and Technology, vol. 13, No. 3, (2000), pp. 471–476.

Database WPI Section CH, Week 199930, Derwent Publications Ltd., London, GB; Class A17, AN 1999–352899, XP002217910 & JP 11 130844 A (Mitsui Petrochem Ind. Co. Ltd.)., May 18, 1999, Abstract.

* cited by examiner

*Primary Examiner*—Mark F. Huff
*Assistant Examiner*—Daborah Chacko-Davis
(74) *Attorney, Agent, or Firm*—Millen White Zelano & Branigan P.C.

(57) ABSTRACT

A resist patterning process is provided comprising the steps of (a) applying a resist composition onto a substrate to form a resist film, (b) prebaking the resist film, (c) exposing the prebaked resist film to a pattern of radiation, (d) post-exposure baking the exposed resist film, (e) developing the resist film to form a resist pattern, and (f) post baking the resist pattern for causing thermal flow. The resist composition contains a polymer comprising structural units of formula [I] in a backbone and having acid labile groups on side chains as a base resin and a photoacid generator.

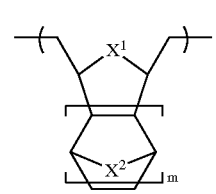

[I]

$X^1$ and $X^2$ are —O—, —S—, —NR—, —PR— or —CR$_2$—, R is H or C$_{1-20}$ alkyl, and m is 0 or an integer of 1 to 3. The invention is effective for improving the degree of integration of semiconductor LSI.

7 Claims, No Drawings

RESIST PATTERNING PROCESS

This invention relates to a resist patterning process using a positive resist composition which is sensitive to various types of radiation (including UV, deep UV, vacuum UV, electron beams and x rays as well as ArF excimer and other laser beams) and has a high sensitivity and resolution.

BACKGROUND OF THE INVENTION

Semiconductor integrated circuits have reached so great a scale of integration that large scale integrated circuits (LSI) and very large scale integrated circuits (VLSI) are now used in practice. At the same time, the minimum pattern size of integrated circuits reaches the submicron region and will become finer. Micropatterning is generally carried out by lithography, for example, by forming a thin film on a substrate, coating a resist thereon, effecting selective exposure to form a latent image of the desired pattern, developing the resist to form a resist pattern, dry etching through the resist pattern as a mask, and removing the resist, leaving the desired pattern.

As the pattern feature size becomes finer, the light source used for exposure in the lithography undergoes a transition to shorter wavelength ones such as deep-UV, vacuum-ultraviolet (VUV), electron beams (EB) and x-rays. The latest stage of lithography considers to use as the exposure light source excimer lasers (e.g., KrF laser of wavelength 248 nm and ArF laser of wavelength 193 nm) and a $F_2$ laser of wavelength 157 nm. These lasers are expected to be effective for micropatterning.

In resist compositions for forming submicron-size patterns using exposure light of shorter wavelength or in the vacuum UV region, a variety of polymers or copolymers are used. Proposed thus far are polymers or copolymers of acrylic esters or alpha-substituted acrylic esters having an adamantane skeleton and acid-eliminatable protective groups in the ester moiety (see JP-A 4-39665), polymers or copolymers of acrylic esters or alpha-substituted acrylic esters having a norbornane skeleton and acid-eliminatable protective groups in the ester moiety (see JP-A 5-257281), polymers or copolymers of cyclohexylmaleimide (see JP-A 5-257285), polymers having a cellulose skeleton in the backbone which undergoes cleavage with acid (see JP-A 6-342212), and polyvinyl alcohol and polyvinyl alcohol derivatives (see JP-A 7-333850).

However, these polymers and copolymers do not satisfy all the characteristics necessary as resist material including dry etching resistance, transparency to deep-UV, solubility in resist solvents, wettability with developers, adhesion to silicon and other substrates, and solubility in stripping agents. None of them are easy to synthesize. There is a need to have polymers satisfying the above requirements.

On the other hand, photoresist compositions comprising polymers based on aliphatic cyclic hydrocarbon as the backbone and having a cyclic skeleton bearing acid-decomposable functional groups are disclosed in WO 97/33198, JP-A 9-230595, JP-A 9-244247, and JP-A 10-254139. These cyclic polymers have good dry etching resistance and transparency to deep-UV, but leave unsolved the problems of dissolution in resist solvents in high concentrations, wettability with developers, and adhesion to silicon substrates.

To satisfy all the above-described performance factors, that is, the performance factors necessary as the base resin in positive photoresist compositions that have a good light transmittance, high sensitivity, high resolution, and high affinity to basic developers, and are capable of forming satisfactory patterns, so that the compositions are effective for semiconductor micropatterning using UV or deep UV (inclusive of excimer lasers), hydrogenated products of ring-opening metathesis polymers having a narrow molecular weight distribution were recently proposed. See JP-A 11-130843, JP-A 11-130844, JP-A 11-130845, JP-A 11-171982, JP-A 2000-109545, JP-A 2001-27803 and Japanese Patent Application No. 2000-113351.

On the other hand, the degree of integration of semiconductor LSI has increased at a rate as fast as about 4 folds every three years. The increased degree of integration is arrived at by improving the fineness of lithography. To this end, many micropatterning techniques have been proposed including ultrahigh resolution technique during exposure, thermal flow during development and during baking after resist pattern formation, and over-etching during etching. A typical method of forming micropatterns is described below.

A resist material is spin coated on a Si wafer, after which the resist coating is baked at an elevated temperature (referred to as prebaking or PB, hereinafter) and selectively exposed to light through a pattern mask. The exposed resist on the wafer is further baked at an elevated temperature (referred to as post-exposure baking or PEB, hereinafter) and developed with a developer to form a resist pattern. Using the thus formed pattern as a mask, wet or dry etching is conducted. The resist in which exposed areas become solubilized in the developer is designated positive working resist whereas the resist in which exposed areas become insolubilized is designated negative working resist. It is known that thermal flow after resist pattern formation is effective for further reduction of the diameter of contact holes (see J. S. Kim, J. C. Jung, G. Lee, M. H. Jung, K. H. Baik, J. Photopolym. Sci. Technol., 13, 471 (2000)).

Resist compositions comprising the aforementioned polymers or copolymers of acrylic esters or alpha-substituted acrylic esters having an adamantane skeleton and acid-eliminatable protective groups in the ester moiety fail to solve the problem of dry etching resistance even when the thermal flow process is introduced, and thus perform poorly as the micropatterning resist. Resist compositions comprising the aforementioned polymers based on aliphatic cyclic hydrocarbon as the backbone and having a cyclic skeleton bearing acid-decomposable functional groups do not thermally flow due to their high glass transition temperature, and inhibit the introduction of the thermal flow process.

On the other hand, techniques of combining different types of polymers as a base resin have been under study. However, when polymers of different backbone structures are combined, they are often incompatible and fail to form a homogeneous resist solution. Even when a resist solution is formed, phase separation or haze develops upon coating, failing to form a satisfactory film. Alternatively, even when a film is formed, partial stripping of the film can occur during pattern formation due to the uneven distribution of the base resin components.

SUMMARY OF THE INVENTION

An object of the present invention is to provide a resist patterning process using a positive resist composition which has a high transmittance to UV and deep UV (inclusive of excimer and other laser beams), high sensitivity, high resolution, and high affinity to basic developers, and is capable of forming satisfactory micropatterns, the process involving a conventional micropattern forming process followed by a thermal flow step on the resist pattern for improving the degree of integration of semiconductor LSI, that is, the fineness of microfabrication.

The inventors have found that a hydrogenated ring-opening metathesis polymer of cyclic olefin monomers or a mixture thereof with a poly(meth)acrylic derivative is useful as a base resin to formulate a resist composition having improved optical properties, electrical properties, high rigidity, heat resistance, substrate adhesion, weather resistance and thermal flow feasibility.

If a first embodiment, the invention provides a resist patterning process comprising (a) the first step of applying a resist composition onto a substrate to form a resist film thereon, (b) the second step of prebaking the resist film, (c) the third step of exposing the prebaked resist film to a pattern of radiation, (d) the fourth step of post-exposure baking the exposed resist film, (e) the fifth step of developing the post-exposure baked resist film to form a resist pattern, and (f) the sixth step of post baking the resist pattern for causing thermal flow thereto.

The resist composition used in the first embodiment comprises a base resin in the form of a polymer or copolymer comprising structural units of the following general formula [I] in a backbone and partially having acid labile groups on side chains and a photoacid generator capable of generating acid upon exposure to radiation.

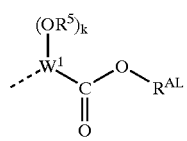

[I]

Herein $X^1$ and $X^2$ are independently selected from among —O—, —S—, —NR—, —PR—, and —CR$_2$—, wherein R is hydrogen or an alkyl group of 1 to 20 carbon atoms, and m is 0 or an integer of 1 to 3.

In the first embodiment, the base resin is most often a hydrogenated product of a ring-opening metathesis polymer comprising structural units [A] of the general formula [1], and structural units [B] of the general formula [3] and/or structural units [C] of the general formula [4].

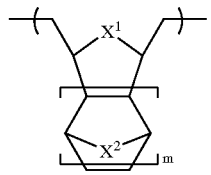

[1]

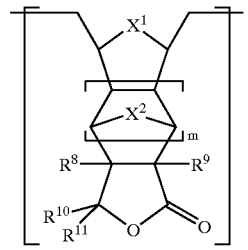

[3]

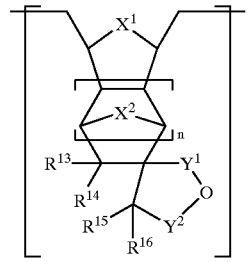

[4]

Herein at least one of $R^1$ to $R^4$ is a group having an acid labile group of the following general formula [2]:

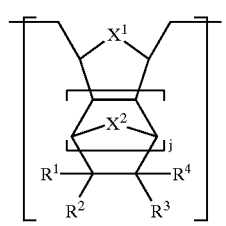

[2]

(wherein the broken line denotes a free valence bond, $R^5$ is hydrogen, a straight, branched or cyclic alkyl group of 1 to 10 carbon atoms, a straight, branched or cyclic alkoxyalkyl group of 2 to 10 carbon atoms, or a straight, branched or cyclic acyl group of 1 to 10 carbon atoms, $W^1$ is a single bond or a (k+2)-valent hydrocarbon group of 1 to 10 carbon atoms, $R^{AL}$ is an acid labile group, and k is 0 or 1); the remainder of $R^1$ to $R^4$ is independently selected from the group consisting of hydrogen, a straight, branched or cyclic alkyl group of 1 to 20 carbon atoms, a halogen atom, a straight, branched or cyclic halo-alkyl group of 1 to 20 carbon atoms, a straight, branched or cyclic alkoxy group of 1 to 20 carbon atoms, a straight, branched or cyclic alkoxyalkyl group of 2 to 20 carbon atoms, a straight, branched or cyclic alkylcarbonyloxy group of 2 to 20 carbon atoms, an arylcarbonyloxy group of 7 to 20 carbon atoms, a straight, branched or cyclic alkylsulfonyloxy group of 1 to 20 carbon atoms, an arylsulfonyloxy group of 6 to 20 carbon atoms, a straight, branched or cyclic alkoxycarbonyl group of 2 to 20 carbon atoms, and a straight, branched or cyclic alkoxycarbonylalkyl group of 3 to 20 carbon atoms; $R^8$ to $R^{11}$ each are hydrogen or a straight, branched or cyclic alkyl group of 1 to 10 carbon atoms; $R^{13}$ to $R^{16}$ each are hydrogen or a straight, branched or cyclic alkyl group of 1 to 10 carbon atoms; one of $Y^1$ and $Y^2$ is —(C=O)— and the other is —CR$^{18}_2$— wherein $R^{18}$ is hydrogen or a straight or branched alkyl group of 1 to 10 carbon atoms; j and n each are 0 or an integer of 1 to 3; $X^1$, $X^2$ and m are as defined above.

In a second embodiment, the present invention provides a resist patterning process comprising the same steps (a) to (f) as in the first embodiment, wherein the resist composition comprises a base resin in the form of a mixture of a hydrogenated product of a ring-opening metathesis polymer and a poly(meth)acrylic acid derivative and a photoacid generator capable of generating acid upon exposure to radiation.

In the second embodiment, the hydrogenated product of ring-opening metathesis polymer is most often a polymer comprising recurring units of the following general formula (I) and having a weight average molecular weight of 500 to 200,000.

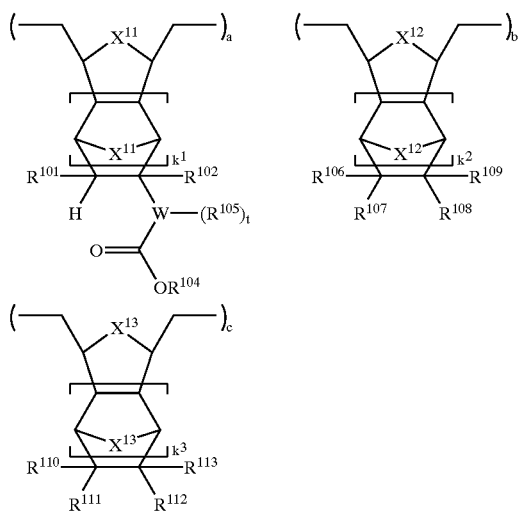

(I)

Herein $R^{101}$ is hydrogen, methyl or $CH_2CO_2R^{103}$; $R^{102}$ is hydrogen, methyl or $CO_2R^{103}$; $R^{103}$ which may be identical or different between $R^{101}$ and $R^{102}$ is a straight, branched or cyclic alkyl group of 1 to 15 carbon atoms; $R^{104}$ is an acid labile group; $R^{105}$ is a halogen atom, a hydroxyl group, a straight, branched or cyclic alkoxy, acyloxy or alkylsulfonyloxy group having 1 to 15 carbon atoms, or a straight, branched or cyclic alkoxycarbonyloxy or alkoxyalkoxy group having 2 to 15 carbon atoms, in which some or all of the hydrogen atoms on constituent carbon atoms may be substituted with halogen atoms; at least one of $R^{106}$ to $R^{109}$ is a monovalent hydrocarbon group of 1 to 15 carbon atoms having a carboxyl or hydroxyl group while the remainders of $R^{106}$ to $R^{109}$ are independently hydrogen or straight, branched or cyclic alkyl groups of 1 to 15 carbon atoms, or a pair of $R^{106}$ and $R^{107}$, $R^{107}$ and $R^{108}$, or $R^{108}$ and $R^{109}$, taken together, may form a ring with the carbon atom or atoms to which they are bonded, and in that event, one of $R^{106}$ and $R^{107}$, $R^{107}$ and $R^{108}$, or $R^{108}$ and $R^{109}$ is a divalent hydrocarbon group of 1 to 15 carbon atoms having a carboxyl or hydroxyl group while the other is a single bond or a straight, branched or cyclic alkylene group of 1 to 15 carbon atoms; at least one of $R^{110}$ to $R^{113}$ is a monovalent hydrocarbon group of 2 to 15 carbon atoms containing at least one partial structure selected front among ether, aldehyde, ketone, ester, carbonate, acid anhydride, amide and imide while the remainders of $R^{110}$ to $R^{113}$ are independently hydrogen or straight, branched or cyclic alkyl groups of 1 to 15 carbon atoms, or a pair of $R^{110}$ and $R^{111}$, $R^{111}$ and $R^{112}$, or $R^{112}$ and $R^{113}$, taken together, may form a ring with the carbon atom or atoms to which they are bonded, and in that event, one of $R^{110}$ and $R^{111}$, $R^{111}$ and $R^{112}$, or $R^{112}$ and $R^{113}$ is a divalent hydrocarbon group of 1 to 15 carbon atoms containing at least one partial structure selected from among ether, aldehyde, ketone, ester, carbonate, acid anhydride, amide and imide, while the other is a single bond or straight, branched or cyclic alkylene group of 1 to 15 carbon atoms; $X^{11}$ to $X^{13}$ each are independently a methylene group or oxygen atom, with the proviso that all $X^{11}$ to $X^{13}$ are not methylene groups at the same time; W is a single bond or a straight, branched or cyclic (t+2)-valent hydrocarbon group having 1 to 5 carbon atoms, in which at least one methylene group may be substituted with an oxygen atom to form a chain-like or cyclic ether or two hydrogen atoms on a common carbon may be substituted with an oxygen atom to form a ketone; $k^1$ to $k^3$ each are independently 0 or 1, t is 0, 1 or 2, "a," "b" and "c" representative of compositional ratios of the corresponding recurring units are such numbers that $0<a<1$, $0 \leq b<1$, $0 \leq c<1$ and $a+b+c=1$, the recurring units introduced in the respective compositional ratios "a," "b" and "c" each may be of one or more types.

DESCRIPTION OF THE PREFERRED EMBODIMENTS

First Embodiment

In the first embodiment, the resist patterning process of the present invention starts with a resist composition which uses as a base resin a polymer or copolymer comprising structural units of the following general formula [I] in a backbone and partially having acid labile groups on side chains.

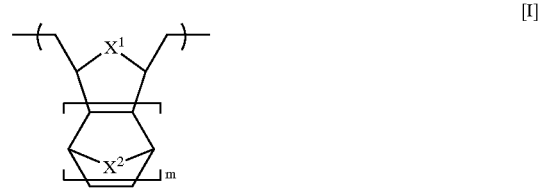

[I]

Herein $X^1$ and $X^2$ are independently selected from among —O—, —S—, —NR—, —PR—, and —$CR_2$—, wherein R is hydrogen or an alkyl group of 1 to 20 carbon atoms, especially 1 to 10 carbon atoms, and m is 0 or an integer of 1 to 3.

The base resin used in the first embodiment is described in detail. The preferred resist composition of the present invention uses as the base resin a hydrogenated product of a ring-opening metathesis polymer comprising structural units [A] of the general formula [1], and structural units [B] of the general formula [3] and/or structural units [C] of the general formula [4], shown below.

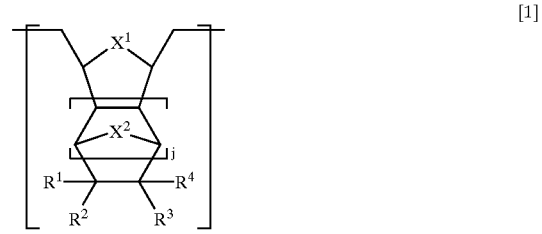

[1]

-continued

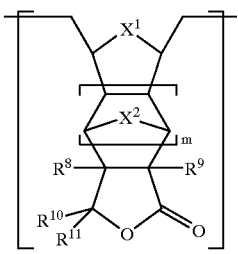
[3]

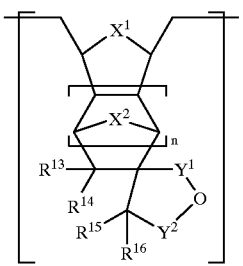
[4]

In formula [1], at least one of $R^1$ to $R^4$ is a group having an acid labile group of the following general formula [2].

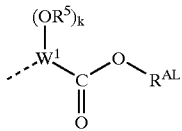
[2]

In this formula and throughout the specification, the broken line denotes a free valence bond. $R^5$ is hydrogen, a straight, branched or cyclic alkyl group of 1 to 10 carbon atoms, a straight, branched or cyclic alkoxyalkyl group of 2 to 10 carbon atoms, or a straight, branched or cyclic acyl group of 2 to 10 carbon atoms. $W^1$ is a single bond or a (k+2)-valent hydrocarbon group of 1 to 10 carbon atoms, $R^{AL}$ is an acid labile group, and k is 0 or 1.

For the $R^5$ groups, suitable straight, branched or cyclic $C_{1-10}$ alkyl groups include methyl, ethyl, propyl, isopropyl, n-butyl, isobutyl, tert-butyl, cyclopentyl, cyclohexyl, 1-ethylcyclopentyl, and 1-ethylcyclohexyl; suitable straight, branched or cyclic $C_{2-10}$ alkoxyalkyl groups include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl; and suitable straight, branched or cyclic $C_{1-10}$ acyl groups include formyl, acetyl, pivaloyl and cyclohexylcarbonyl. Of these $R^5$ groups, straight or branched $C_{1-6}$ alkyl groups, straight, branched or cyclic $C_{2-7}$ alkoxyalkyl groups and straight or branched $C_{2-7}$ acyl groups are preferred, with hydrogen, methyl, ethyl, methoxymethyl, 1-ethoxyethyl, tetrahydrofuran-2-yl and acetyl being most preferred.

For the $W^1$ groups, the (k+2)-valent $C_{1-10}$ hydrocarbon groups are, in the case of k=0, straight, branched or cyclic, divalent $C_{1-10}$ hydrocarbon groups, for example, methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene and 1,4-cyclohexylene. Of these, methylene, ethylidene, ethylene, 1-methylethylene, 2-methylethylene, trimethylene and 2-methyltrimethylene are preferred. Exemplary groups in the case of k=1 are those hydrocarbon groups enumerated in the case of k=0, from which one hydrogen atom at an arbitrary position is eliminated to provide a valence bond.

The acid labile groups represented by $R^{AL}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

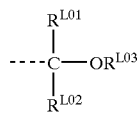
(L1)

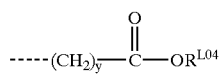
(L2)

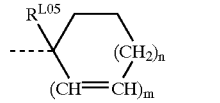
(L3)

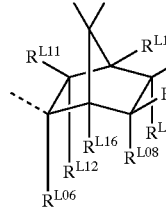
(L4)

$R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples are the substituted alkyl groups shown below.

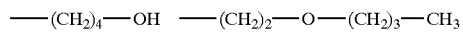

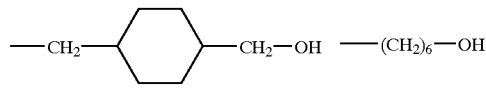

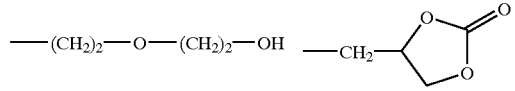

A pair of $R^{L01}$ and $R^{L02}$, $R^{L01}$ and $R^{L03}$, or $R^{L02}$ and $R^{L03}$ may bond together to form a ring. Each of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl. Also included are groups of formulae [16-1] to [16-3] shown below, and 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

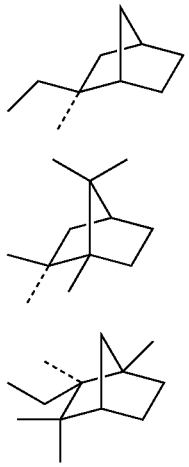

[16-1]

[16-2]

[16-3]

$R^{L05}$ is a monovalent hydrocarbon group of 1 to 8 carbon atoms which may contain a hetero atom or a substituted or unsubstituted aryl group of 6 to 20 carbon atoms. Examples of the monovalent hydrocarbon group which may contain a hetero atom include straight, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and substituted groups in which some hydrogen atoms on the foregoing groups are substituted with hydroxyl, alkoxy, carboxy, alkoxycarbonyl, oxo, amino, alkylamino, cyano, mercapto, alkylthio, sulfo or other groups. Exemplary aryl groups are phenyl, methylphenyl, naphthyl, anthryl, phenanthryl, and pyrenyl. Letter m is equal to 0 or 1, n is equal to 0, 1, 2 or 3, and 2 m+n is equal to 2 or 3.

$R^{L06}$ is a monovalent hydrocarbon group of 1 to 8 carbon atoms which may contain a hetero atom or a substituted or unsubstituted aryl group of 6 to 20 carbon atoms. Examples of these groups are the same as exemplified for $R^{L05}$.

$R^{L07}$ to $R^{L16}$ independently represent hydrogen or monovalent hydrocarbon groups of 1 to 15 carbon atoms which may contain a hetero atom. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R_{L07}$ to $R^{L16}$, taken together, form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$–$C_{15}$ hydrocarbon group which may contain a hetero atom, when they form a ring, examples of which are the ones exemplified above for the monovalent hydrocarbon groups, with one hydrogen atom being eliminated. Two of $R^{L07}$ to $R^{L16}$ which are attached to adjoining carbon atoms (for example, a pair of $R^{L07}$ and $R^{L09}$, $R^{L09}$ and $R^{L15}$, $R^{L13}$ and $R^{L15}$, or a similar pair) may bond together directly to form a double bond.

Of the acid labile groups of formula (L1), the straight and branched ones are exemplified by the following groups.

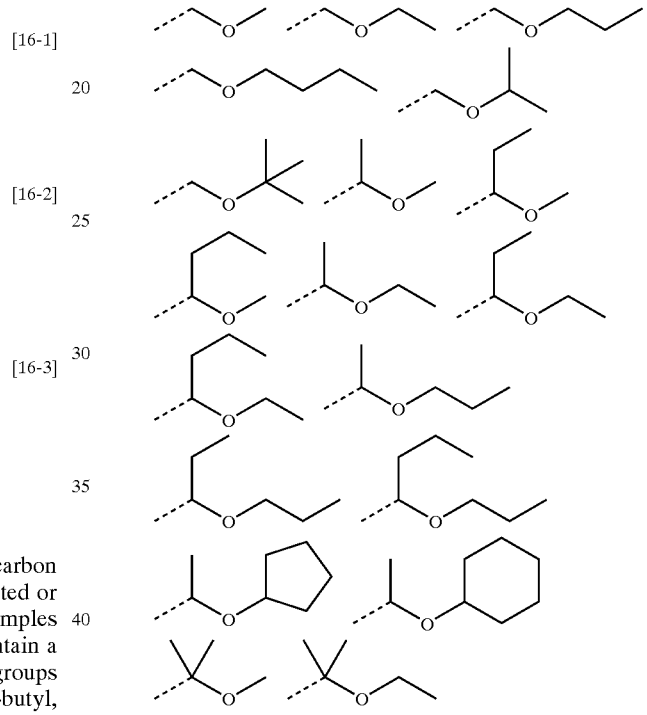

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, 3-ethyl-1-cyclohexen-3-yl, 1-cyclohexylpentyl, and 1-(2-norbornyl)cyclopentyl groups.

The acid labile groups of formula (L4) are exemplified by the following groups.

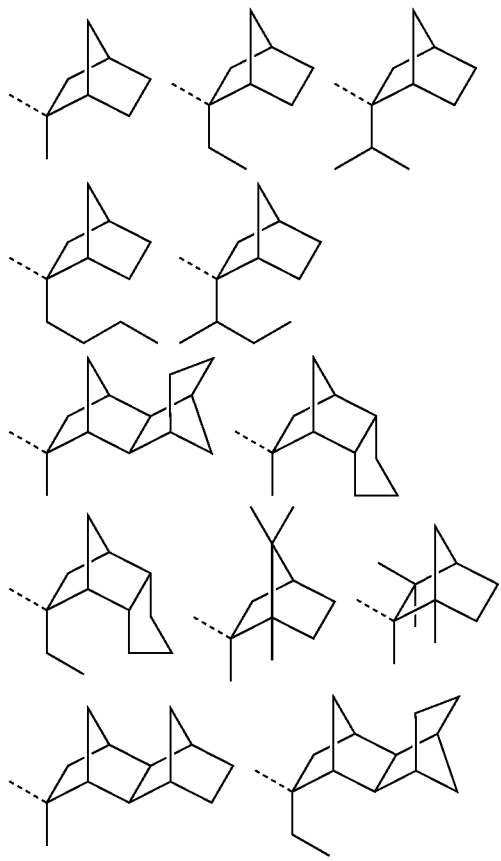

Examples of the tertiary alkyl groups of 4 to 20 carbon atoms, trialkylsilyl groups in which each alkyl moiety has 1 to 6 carbon atoms, and oxoalkyl groups of 4 to 20 carbon atoms are as exemplified for $R^{L04}$.

It is noted that the acid labile groups described above may be used alone or in combination of two or more. Use of plural types of acid labile groups allows for fine adjustment of pattern profiles.

The remainder of $R^1$ to $R^4$ are independently selected from among hydrogen; straight, branched or cyclic $C_{1-20}$ alkyl groups such as methyl, ethyl, propyl, isopropyl, n-butyl, tert-butyl, cyclohexyl and menthyl; halogen atoms such as chloro, bromo, iodo and fluoro; straight, branched or cyclic $C_{1-20}$ halo-alkyl groups such as fluoromethyl, chloromethyl, bromomethyl, difluoromethyl, dichloromethyl, dibromomethyl, trifluoromethyl, trichloromethyl and tribromomethyl; straight, branched or cyclic $C_{1-20}$ alkoxy groups such as methoxy, ethoxy, isopropoxy, n-butoxy, tert-butoxy and menthoxy; straight, branched or cyclic $C_{2-20}$ alkoxyalkyl groups such as methoxymethyl, methoxyethyl, tert-butoxymethyl, tert-butoxyethyl and methoxymenthol as well as alkoxy saccharides such as methylglucose; straight, branched or cyclic $C_{2-20}$ alkylcarbonyloxy groups such as acetoxy; $C_{7-20}$ arylcarbonyloxy groups such as naphthoyloxy; straight, branched or cyclic $C_{1-20}$ alkylsulfonyloxy groups such as mesyloxy; $C_{6-20}$ arylsulfonyloxy groups such as tosyloxy; straight, branched or cyclic $C_{2-20}$ alkoxycarbonyl groups such as methoxycarbonyl, ethoxycarbonyl, n-propoxycarbonyl, isopropoxycarbonyl, n-butoxycarbonyl, tert-butoxycarbonyl and cyclohexyloxycarbonyl; and straight, branched or cyclic $C_{3-20}$ alkoxycarbonylalkyl groups such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl and cyclohexyloxycarbonylmethyl. Preferred among these groups are hydrogen, straight, branched or cyclic $C_{1-20}$ alkyl groups, straight, branched or cyclic $C_{1-20}$ alkoxy groups, straight, branched or cyclic $C_{2-20}$ alkoxyalkyl groups, straight, branched or cyclic $C_{2-20}$ alkylcarbonyl groups, and straight, branched or cyclic $C_{3-20}$ alkoxycarbonylalkyl groups. Most preferred are hydrogen, straight or branched $C_{1-10}$ alkyl groups, straight or branched $C_{2-10}$ alkoxycarbonyl groups, and straight or branched $C_{3-10}$ alkoxycarbonylalkyl groups.

$X^1$ and $X^2$ are independently selected from among —O—, —S—, —NR—, —PR—, and —CR$_2$—. R is hydrogen or an $C_{1-20}$ alkyl group. The subscript j is 0 or an integer of 1 to 3. $X^1$ and $X^2$ are preferably —O— or —CH$_2$—. More preferably, all $X^1$ and $X^2$ are, either —O— or —CH$_2$—. Also preferably, j is 0 or 1.

Illustrative examples of the structural units of formula [1] are structural units [A] of the chemical formulae [17-1-1] through [17-4-16] below.

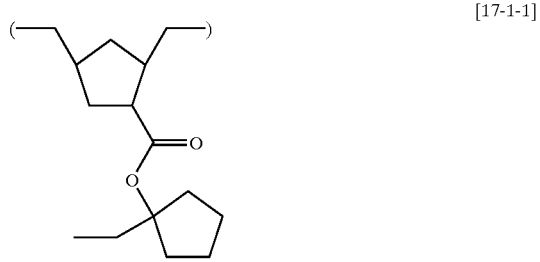

[17-1-1]

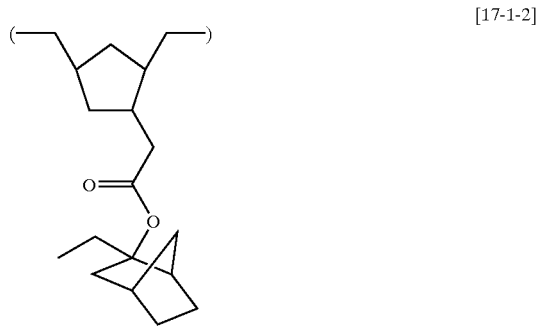

[17-1-2]

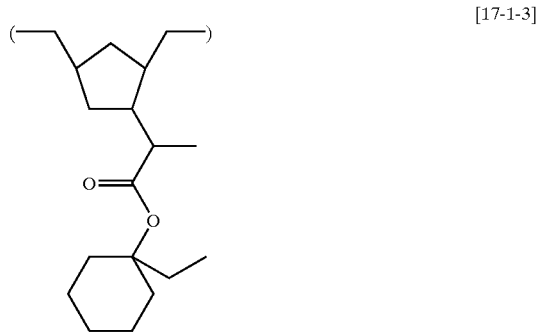

[17-1-3]

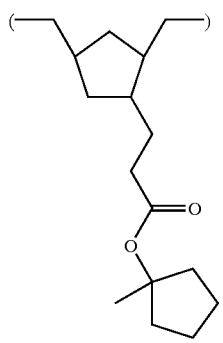
[17-1-4]
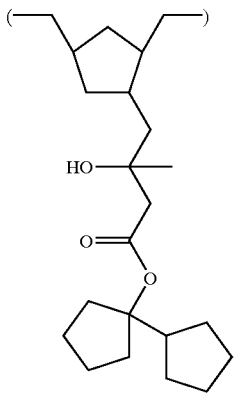
[17-1-8]
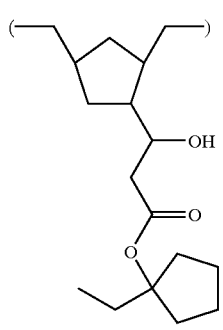
[17-1-5]
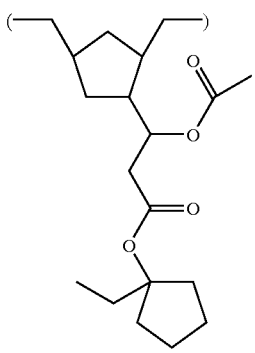
[17-1-9]
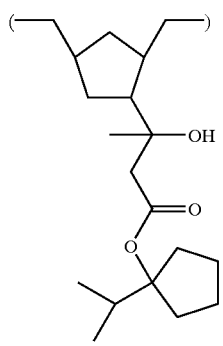
[17-1-6]
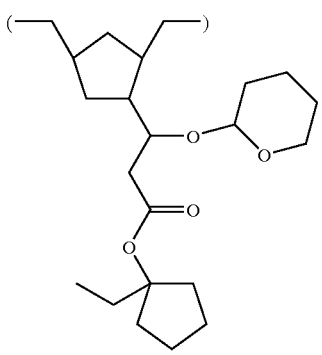
[17-1-10]
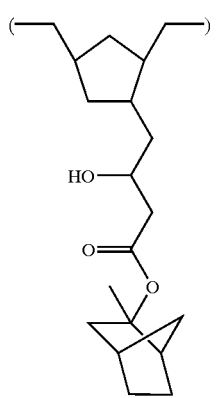
[17-1-7]
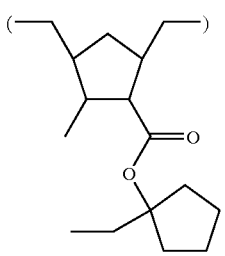
[17-1-11]
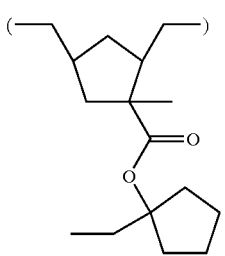
[17-1-12]

[17-1-13] 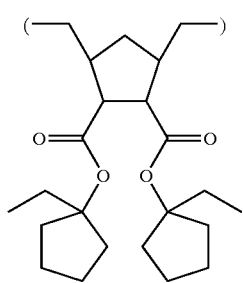
[17-1-14] 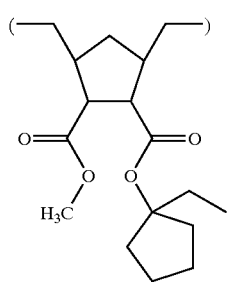
[17-1-15] 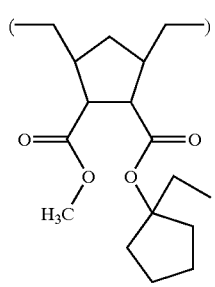
[17-1-16] 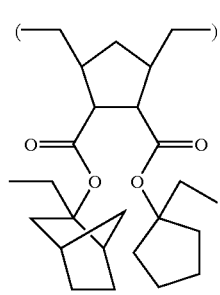
[17-2-1] 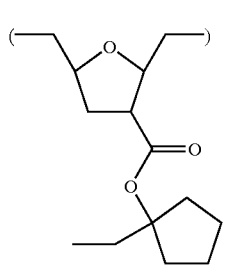
[17-2-2] 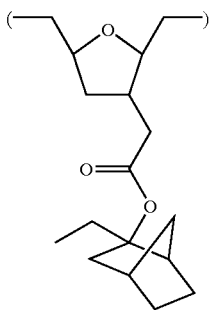
[17-2-3] 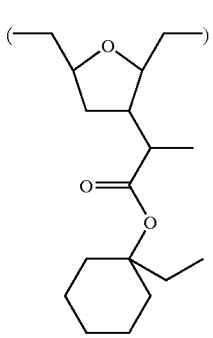
[17-2-4] 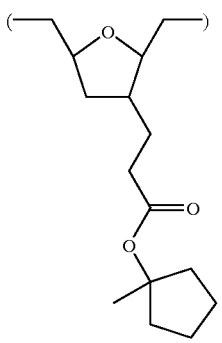
[17-2-5] 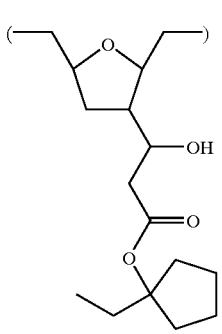
[17-2-6] 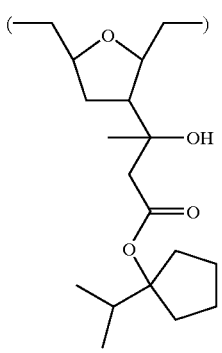

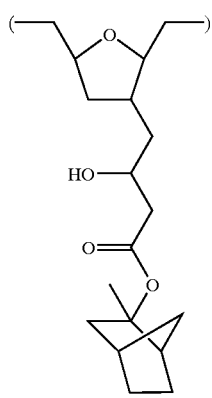
[17-2-7]
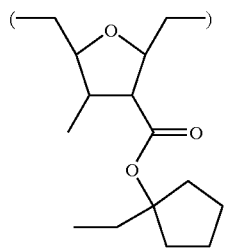
[17-2-11]
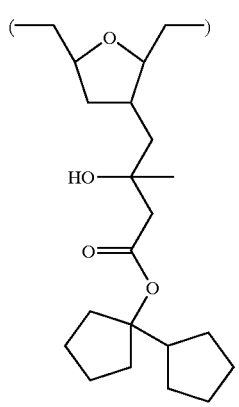
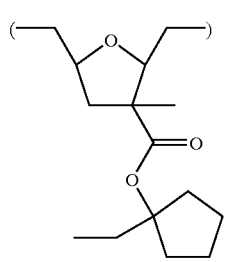
[17-2-12]
[17-2-8]
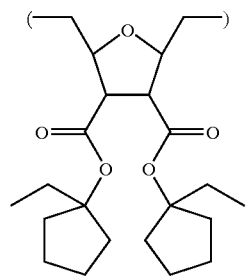
[17-2-13]
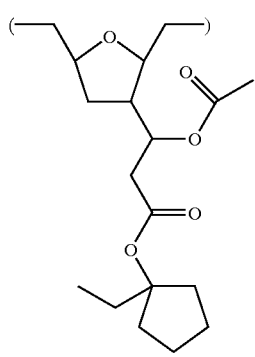
[17-2-14]
[17-2-9]
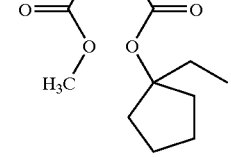
[17-2-15]
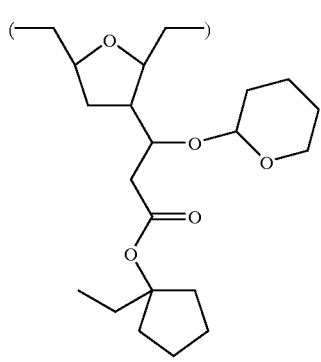
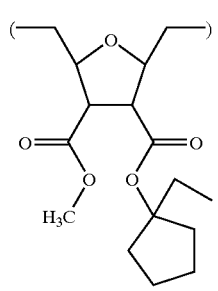
[17-2-10]
[17-2-16]
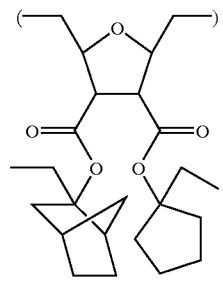

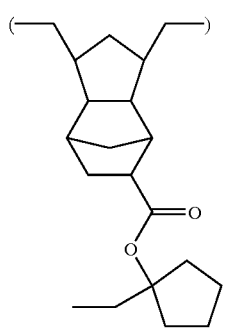
[17-3-1]
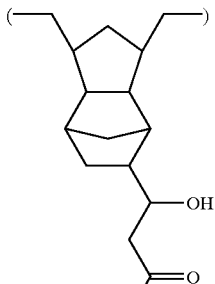
[17-3-5]
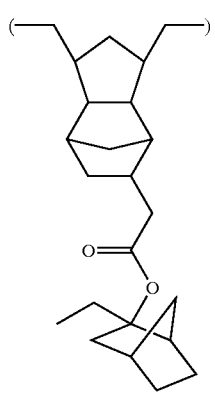
[17-3-2]
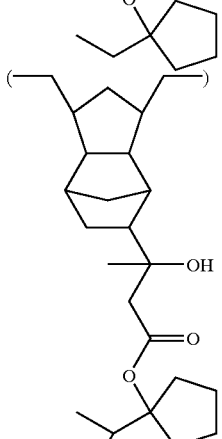
[17-3-6]
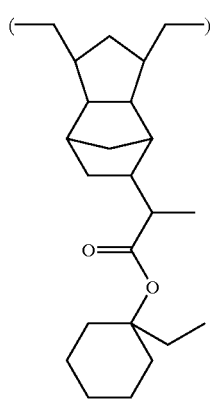
[17-3-3]
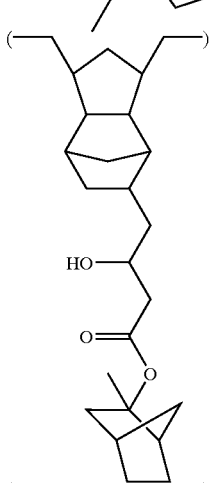
[17-3-7]
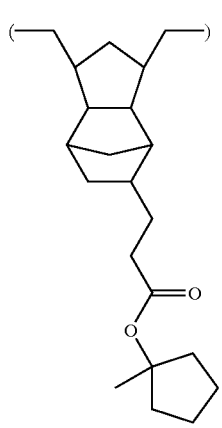
[17-3-4]
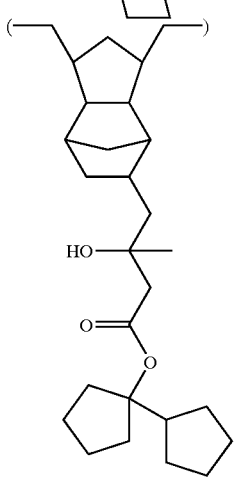
[17-3-8]

[17-3-9] 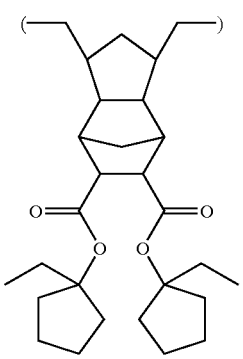
[17-3-10] 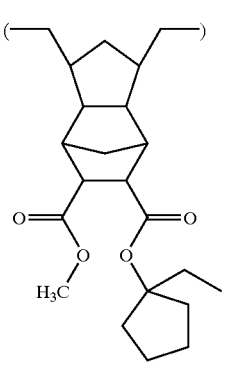
[17-3-11] 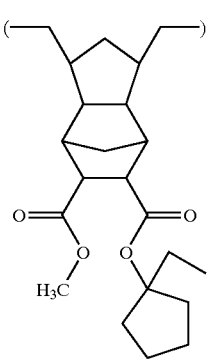
[17-3-12] 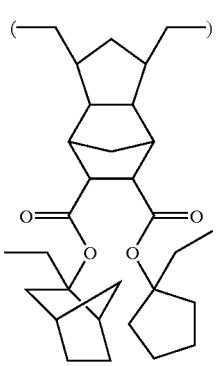
[17-3-13] 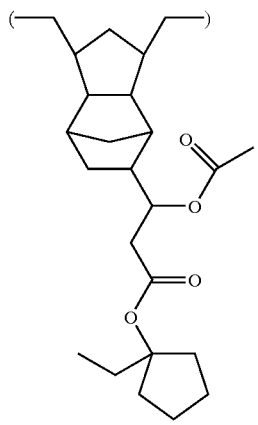
[17-3-14] 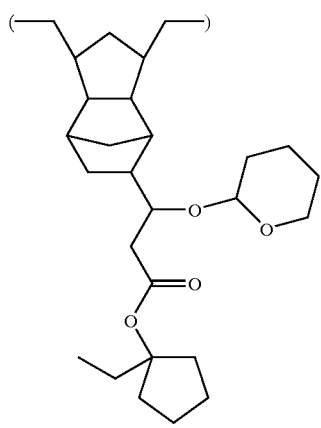
[17-3-15] 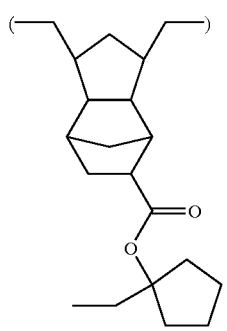
[17-3-16] 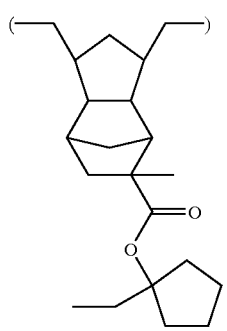

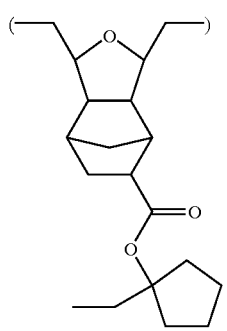
[17-4-1]
[17-4-5]
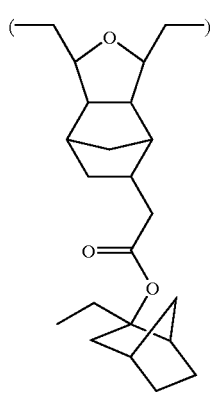
[17-4-2]
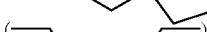
[17-4-6]
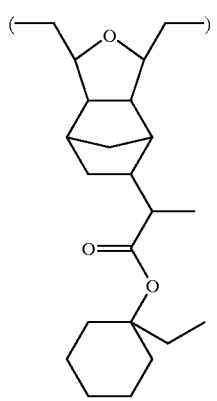
[17-4-3]
[17-4-7]
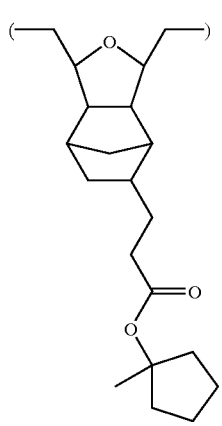
[17-4-4]
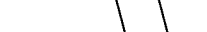
[17-4-8]

[17-4-9]

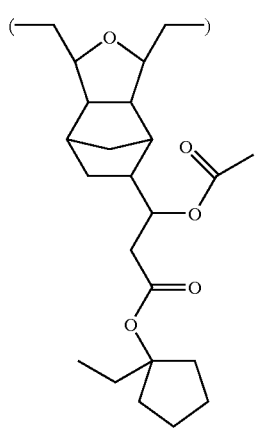

[17-4-10]

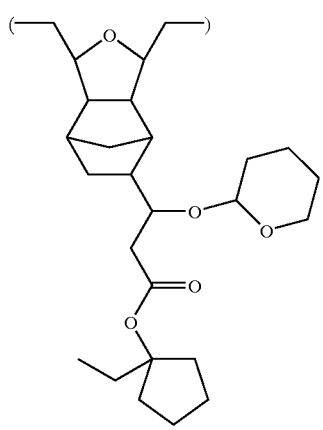

[17-4-11]

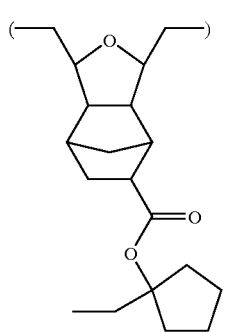

[17-4-12]

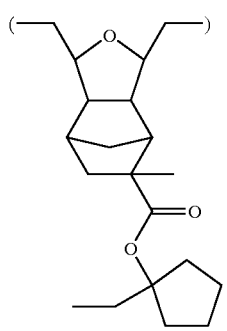

[17-4-13]

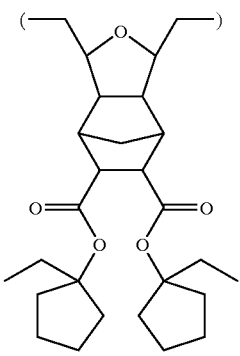

[17-4-14]

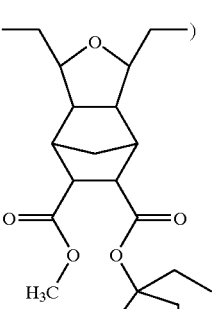

[17-4-15]

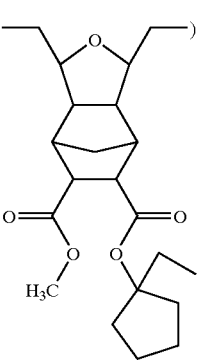

[17-4-16]

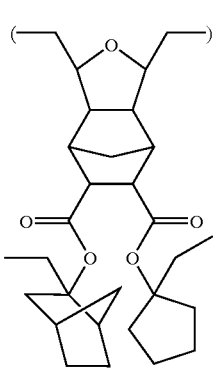

In formula [3], $R^8$ to $R^{11}$ are each independently hydrogen or straight, branched or cyclic $C_{1-10}$ alkyl groups such as methyl, ethyl, n-propyl, isopropyl, n-butyl, tert-butyl, cyclohexyl or menthyl. $X^1$ and $X^2$ have the same meaning as above. The subscript m is 0 or an integer of 1 to 3 and preferably 0 or 1.

Illustrative examples of the structural units of formula [3] are structural units [B] of the chemical formulae [18-1] through [18-16] below.

[18-1] 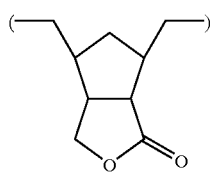
[18-2] 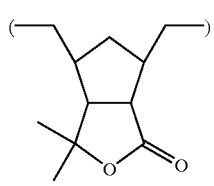
[18-3] 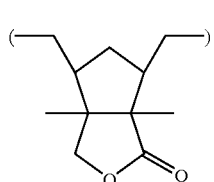
[18-4] 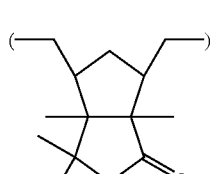
[18-5] 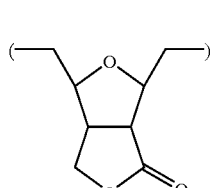
[18-6] 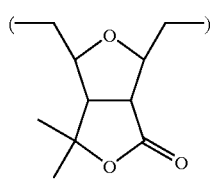
[18-7] 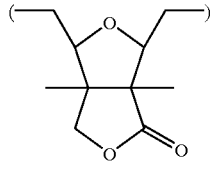
[18-8] 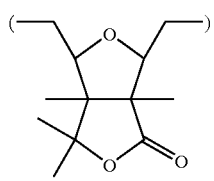
[18-9] 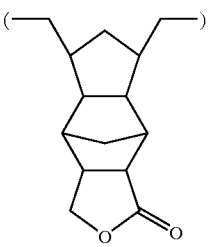
[18-10] 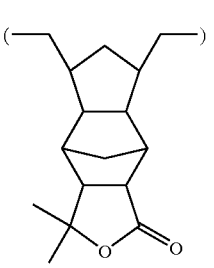
[18-11] 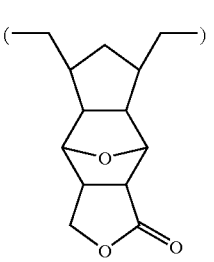
[18-12] 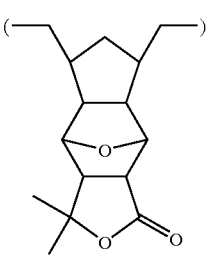
[18-12] 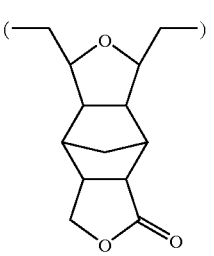
[18-14] 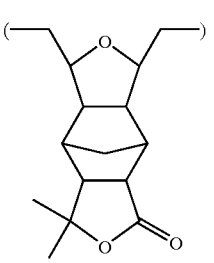

[18-15]

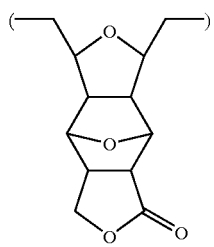

[18-16]

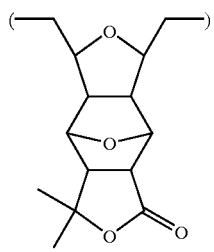

In formula [4], $R^{13}$ to $R^{16}$ are each independently hydrogen or straight, branched or cyclic $C_{1-10}$ alkyl groups such as methyl, ethyl, n-propyl, isopropyl, n-butyl, tert-butyl, cyclohexyl or menthyl. $X^1$ and $X^2$ have the same meaning as above. The subscript n is 0 or an integer of 1 to 3 and preferably 0 or 1. One of $Y^1$ and $Y^2$ is —(C=O)— and the other is —$CR^{18}{}_2$— wherein $R^{18}$ is hydrogen or a straight or branched $C_{1-10}$ alkyl group. Suitable $R^{18}$ groups include hydrogen and straight or branched $C_{1-10}$ alkyl groups such as methyl, ethyl, n-propyl, isopropyl, n-butyl, or tert-butyl. Also preferably one of $Y^1$ and $Y^2$ is —(C=O)— and the other is —$CH_2$—.

Illustrative examples of the structural units of formula [4] are structural units [C] of the chemical formulae [19-1] through [19-16] below.

[19-1]

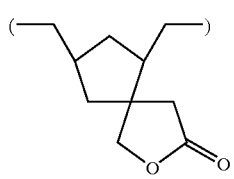

[19-2]

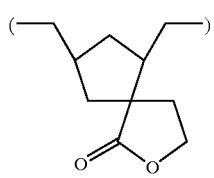

[19-3]

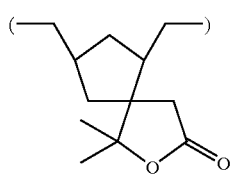

[19-4]

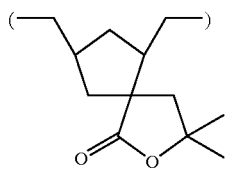

[19-5]

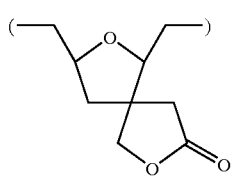

[19-6]

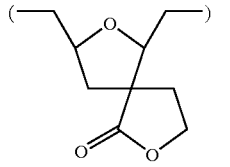

[19-7]

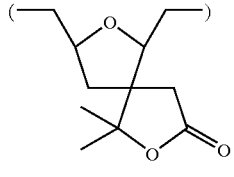

[19-8]

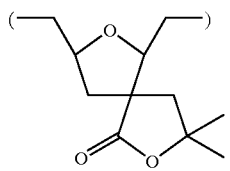

[19-9]

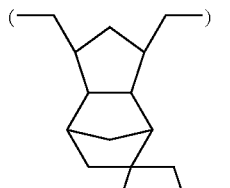

[19-10]

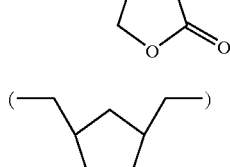

[19-11]

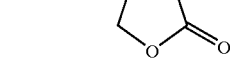
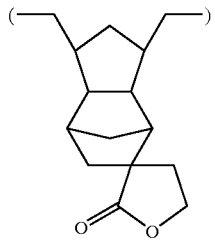

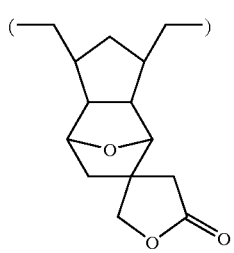

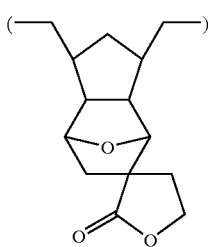

[19-12]

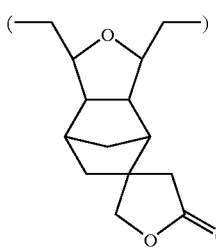

[19-13]

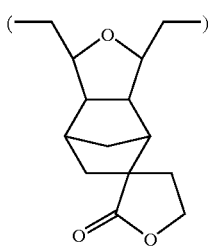

[19-14]

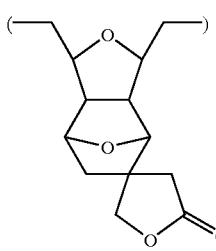

[19-15]

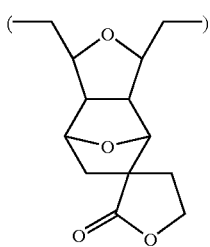

[19-16]

In the polymer according to the invention, the structural units [A] of formula [1] and the structural units [B] of formula [3] and/or the structural units [C] of formula [4] are incorporated in such a molar ratio [A]/([B]+[C]) between 20/80 and 99/1. It is essential that a certain amount of the structural units [B] and/or [C] be present in addition to the structural units [A]. The structural units [A] contain a cyclic alkyl tertiary ester group of formula [2], that is, a group which is decomposable with the acid generated from a photoacid generator upon exposure, to form a carboxylic acid, and are necessary to form a resist pattern by development with aqueous alkali after exposure. The structural units [B] and/or [C] are necessary to exert adhesion to substrates to be processed, such as silicon substrates. A molar ratio [A]/([B]+[C]) of less than 20/80 can lead to underdevelopment whereas a molar ratio in excess of 99/1 fails to manifest adhesion to substrates to be processed. Preferably their molar ratio [A]/([B]+[C]) is between 20/80 and 95/5, more preferably between 25/75 and 90/10, and most preferably between 30/70 and 85/15. The proportion of these structural units controlled within the above range is adequate to prepare a resist composition, and is very important in preparing a resist composition by dissolving the polymer in a polar solvent such as 2-heptanone along with a polar photoacid generator or photosensitive agent, the resist composition being applied to substrates to be processed, such as silicon substrates. That is, when a resist composition is prepared, the hydrogenated product of ring-opening metathesis polymer has a high solubility or high dissolution rate in the polar solvent, ensuring that a uniform smooth coating film is formed.

In the hydrogenated products of ring-opening metathesis polymer used herein, it is preferred that at least either one of structural units [B] and [C] be essentially included. Ternary copolymers composed of structural units [B] and [C] in addition to structural units [A] are acceptable although binary copolymers composed of structural units [A] and only one of structural units [B] and [C] are preferred.

The hydrogenated products of ring-opening metathesis polymer used herein have a polydispersity index Mw/Mn in a relatively narrow range of 1.0 to 2.0, wherein Mw is a weight average molecular weight and Mn is a number average molecular weight. The molecular weight distribution largely governs the resolution when the polymer is used as a resist material, and a narrower molecular weight distribution ensures to form a pattern at a higher resolution. The polydispersity index is preferably in the range of 1.0 to 1.8 and more preferably in the range of 1.0 to 1.6. The hydrogenated products of ring-opening metathesis polymer used herein most often have a number average molecular weight (Mn) of about 500 to 200,000, preferably about 1.000 to 100,000, more preferably about 3,000 to 50,000, and even more preferably about 3,000 to 20,000. It is understood that Mn and Mw are measured by gel permeation chromatography (GPC) relative to polystyrene.

The hydrogenated products of ring-opening metathesis polymer used herein may be constructed of structural units [A] and [B] and/or [C], each of one type. It is acceptable that either one or each of the structural units is composed of structural units of more than one type. Illustrative are hydrogenated products of ring-opening metathesis polymer, in which the structural units [A] include structural units [A-1] and [A-2] of the general formulae [1-1] and [1-2]:

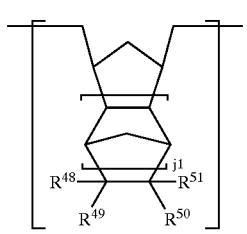

[1-1]

wherein at least one of $R^{48}$ to $R^{51}$ is a functional group having a cyclic alkyl tertiary ester group of the general formula [2], the remainder of $R^{48}$ to $R^{51}$ are independently selected from among hydrogen, a straight, branched or cyclic $C_{1-20}$ alkyl group, a halogen atom, a straight, branched or cyclic $C_{1-20}$ halo-alkyl group, a straight, branched or cyclic $C_{1-20}$ alkoxy group, a straight, branched or cyclic $C_{2-20}$ alkoxyalkyl group, a straight, branched or cyclic $C_{2-20}$ alkylcarbonyloxy group, a $C_{6-20}$ arylcarbonyloxy group, a straight, branched or cyclic $C_{1-20}$ alkylsulfonyloxy group, a $C_{6-20}$ arylsulfonyloxy group, a straight, branched or cyclic $C_{2-20}$ alkoxycarbonyl group, and a straight, branched or cyclic $C_{3-20}$ alkoxycarbonylalkyl group, and j1 is 0 or an integer of 1 to 3,

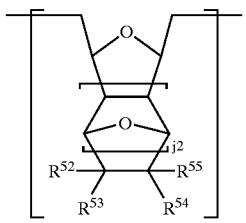

[1-2]

wherein at least one of $R^{52}$ to $R^{55}$ is a functional group having a cyclic alkyl tertiary ester group of the general formula [2], the remainder of $R^{52}$ to $R^{55}$ are independently selected from among hydrogen, a straight, branched or cyclic is $C_{1-20}$ alkyl group, a halogen atom, a straight, branched or cyclic $C_{1-20}$ halo-alkyl group, a straight, branched or cyclic $C_{1-20}$ alkoxy group, a straight, branched or cyclic $C_{1-10}$ alkoxyalkyl group, a straight, branched or cyclic $C_{1-10}$ alkylcarbonyloxy group, a $C_{6-20}$ arylcarbonyloxy group, a straight, branched or cyclic $C_{1-20}$ alkylsulfonyloxy group, a $C_{6-20}$ arylsulfonyloxy group, a straight, branched or cyclic $C_{2-20}$ alkoxycarbonyl group, and a straight, branched or cyclic $C_{3-20}$ alkoxycarbonylalkyl group, and j2 is 0 or an integer of 1 to 3; and the structural units [B] include structural units [B-1] and [B-2] of the general formulae [3-1] and [3-2]:

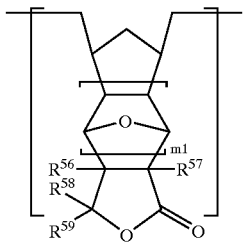

[3-1]

wherein $R^{56}$ to $R^{59}$ are each independently hydrogen or a straight, branched or cyclic $C_{1-10}$ alkyl group, and m1 is 0 or an integer of 1 to 3,

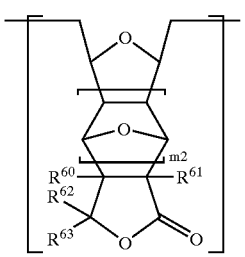

[3-2]

wherein $R^{60}$ to $R^{63}$ are each independently hydrogen or a straight, branched or cyclic $C_{1-10}$ alkyl group, and m2 is 0 or an integer of 1 to 3, and/or the structural units [C] include structural units [C-1] and [C-2] of the general formulae [4-1] and [4-2]:

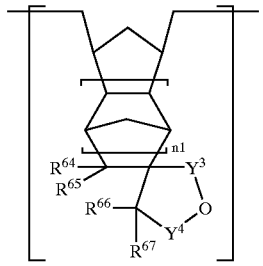

[4-1]

wherein $R^{64}$ to $R^{67}$ are each independently hydrogen or a straight, branched or cyclic $C_{1-10}$ alkyl group, one of $Y^3$ and $Y^4$ is —(C=O)— and the other is —CH$_2$—, and n1 is 0 or an integer of 1 to 3,

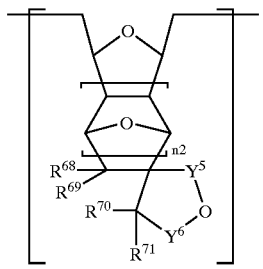

[4-2]

wherein $R^{68}$ to $R^{71}$ are each independently hydrogen or a straight, branched or cyclic $C_{1-10}$ alkyl group, one of $Y^5$ and $Y^6$ is —(C=O)— and the other is —CH$_2$—, and n2 is 0 or an integer of 1 to 3.

In addition to the structural units [A] and [B] and/or [C], the preferred hydrogenated products of ring-opening metathesis copolymer used herein include additional structural units [D] of the following general formula [5] because further improvements in substrate adhesion and developer affinity are expected.

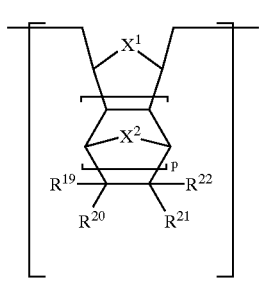

[5]

In formula [5], at least one of $R^{19}$ to $R^{22}$ is a functional group having a carboxyl group of the following general formula [6]:

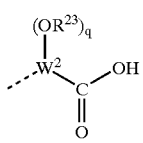

[6]

wherein the broken line denotes a free valence bond, $R^{23}$ is hydrogen, a straight, branched or cyclic $C_{1-10}$ alkyl group, a straight, branched or cyclic $C_{2-10}$ alkoxyalkyl group, or a straight, branched or cyclic $C_{1-10}$ acyl group, $W^2$ is a single bond or a (q+2)-valent $C_{1-10}$ hydrocarbon group, and q is 0 or 1, the remainder of $R^{19}$ to $R^{22}$ are independently selected from among hydrogen, a straight, branched or cyclic $C_{1-20}$ alkyl group, a halogen atom, a straight, branched or cyclic $C_{1-20}$ halo-alkyl group, a straight, branched or cyclic $C_{1-20}$ alkoxy group, a straight, branched or cyclic $C_{2-20}$ alkoxyalkyl group, a straight, branched or cyclic $C_{2-20}$ alkylcarbonyloxy group, a $C_{6-20}$ arylcarbonyloxy group, a straight, branched or cyclic $C_{1-20}$ alkylsulfonyloxy group, a $C_{6-20}$ arylsulfonyloxy group, a straight, branched or cyclic $C_{2-20}$ alkoxycarbonyl group, and a straight, branched or cyclic $C_{3-20}$ alkoxycarbonylalkyl group, $X^1$ and $X^2$ are as defined above, p is 0 or an integer of 1 to 3.

For the $R^{23}$ groups, suitable straight, branched or cyclic $C_{1-10}$ alkyl groups include methyl, ethyl, propyl, isopropyl, n-butyl, isobutyl, tert-butyl, cyclopentyl, cyclohexyl, 1-ethylcyclopentyl, and 1-ethylcyclohexyl; suitable straight, branched or cyclic $C_{2-20}$ alkoxyalkyl groups include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl; and suitable straight, branched or cyclic $C_{1-10}$ acyl groups include formyl, acetyl, pivaloyl and cyclohexylcarbonyl. Of these $R^{23}$ groups, straight or branched $C_{1-6}$ alkyl groups, straight, branched or cyclic $C_{2-7}$ alkoxyalkyl groups and straight or branched $C_{2-7}$ acyl groups are preferred with hydrogen, methyl, ethyl, methoxymethyl, 1-ethoxyethyl, tetrahydrofuran-2-yl and acetyl being most preferred.

For the $W^2$ groups, the (q+2)-valent $C_{1-10}$ hydrocarbon groups are, in the case of q=0, straight, branched or cyclic, divalent $C_{1-10}$ hydrocarbon groups, for example, methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene and 1,4-cyclohexylene. Of these, methylene, ethylidene, ethylene, 1-methylethylene. 2-methylethylene, trimethylene and 2-methyltrimethylene are preferred. Exemplary groups in the case of q=1 are those hydrocarbon groups enumerated in the case of q=0, from which one hydrogen atom at an arbitrary position is eliminated to provide a valence bond. Most preferably $W^2$ is a single bond.

The remainder of $R^{19}$ to $R^{22}$ are independently selected from among hydrogen; straight, branched or cyclic $C_{1-20}$ alkyl groups such as methyl, ethyl, propyl, isopropyl, n-butyl, tert-butyl, cyclohexyl and menthyl; halogen atoms such as chloro, bromo, iodo and fluoro; straight, branched or cyclic $C_{1-20}$ halo-alkyl groups such as fluoromethyl, chloromethyl, bromomethyl, difluoromethyl, dichloromethyl, dibromomethyl, trifluoromethyl, trichloromethyl and tribromomethyl; straight, branched or cyclic $C_{1-12}$ alkoxy groups such as methoxy, ethoxy, isopropoxy, n-butoxy, tert-butoxy and menthoxy; straight, branched or cyclic $C_{2-20}$ alkoxyalkyl groups such as methoxymethyl, methoxyethyl, tert-butoxymethyl, tert-butoxyethyl and methoxymenthol as well as alkoxy saccharides such as methylglucose; straight, branched or cyclic $C_{2-20}$ alkylcarbonyloxy groups such as acetoxy; $C_{6-20}$ arylcarbonyloxy groups such as naphthoyloxy; straight, branched or cyclic $C_{1-20}$ alkylsulfonyloxy groups such as mesyloxy; $C_{6-20}$ arylsulfonyloxy groups such as tosyloxy; straight, branched or cyclic $C_{2-20}$ alkoxycarbonyl groups such as methoxycarbonyl, ethoxycarbonyl, n-propoxycarbonyl, isopropoxycarbonyl, n-butoxycarbonyl, tert-butoxycarbonyl and cyclohexyloxycarbonyl; and straight, branched or cyclic $C_{3-20}$ alkoxycarbonylalkyl groups such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl and cyclohexyloxycarbonylmethyl. Preferred among these groups are hydrogen, straight, branched or cyclic $C_{1-20}$ alkyl groups, straight, branched or cyclic $C_{1-20}$ alkoxy groups, straight, branched or cyclic $C_{2-20}$ alkoxyalkyl groups, straight, branched or cyclic $C_{2-20}$ alkylcarbonyl groups, and straight, branched or cyclic $C_{3-20}$ alkoxycarbonylalkyl groups. Most preferred are hydrogen, straight or branched $C_{1-10}$ alkyl groups, straight or branched $C_{2-10}$ alkoxycarbonyl groups, and straight or branched $C_{3-10}$ alkoxycarbonylalkyl groups.

Illustrative $R^{23}$ groups include hydrogen and straight or branched $C_{1-10}$ alkyl groups such as methyl, ethyl, n-propyl, isopropyl, n-butyl, or tert-butyl. The subscript p is preferably 0 or 1.

Illustrative examples of the structural units of formula [5] are structural units [D] of the chemical formulae [20-1-1] through [20-4-16] below.

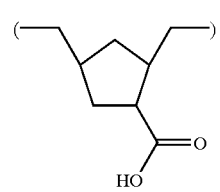

[20-1-1]

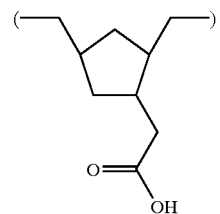

[20-1-2]

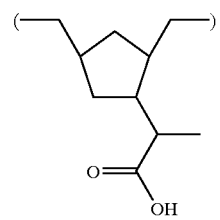

[20-1-3]

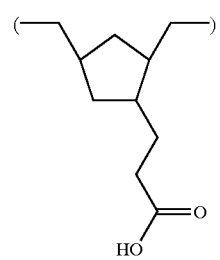

[20-1-4]

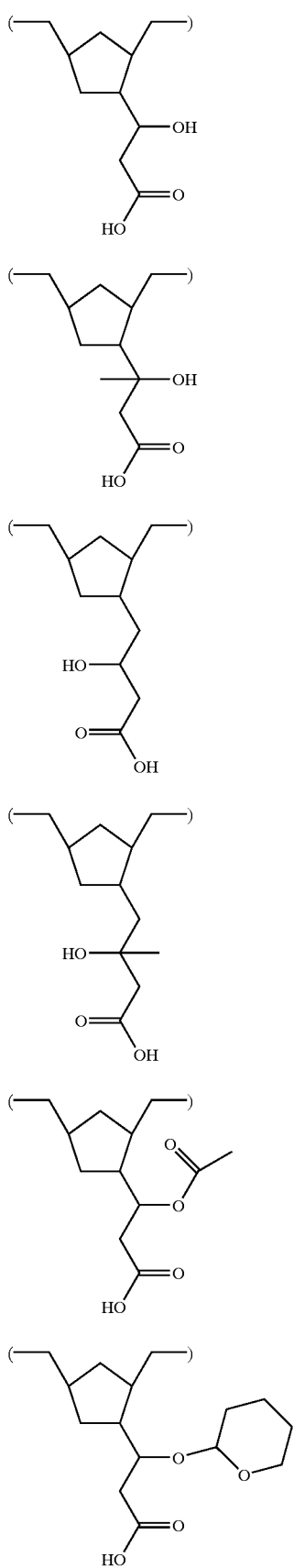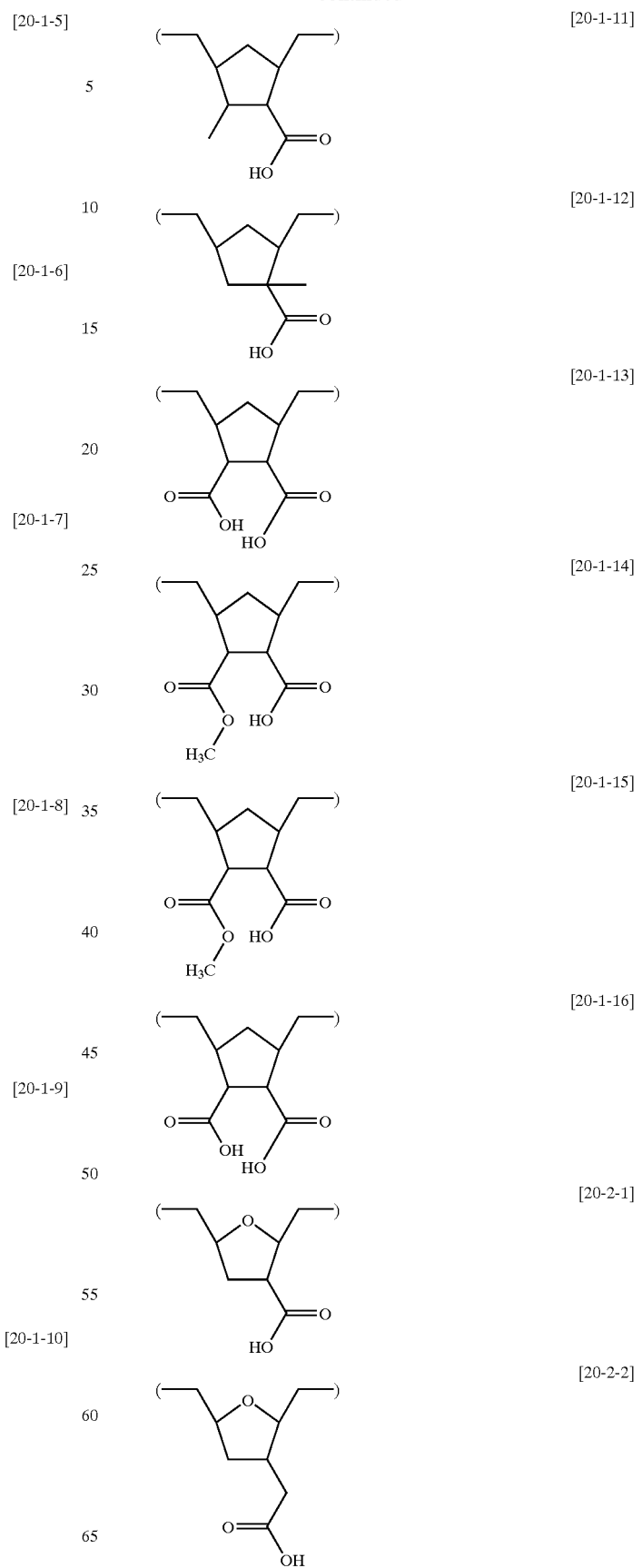

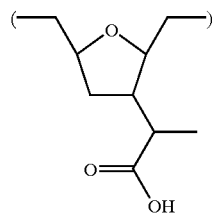
[20-2-3]
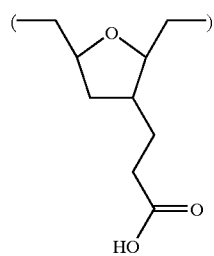
[20-2-4]
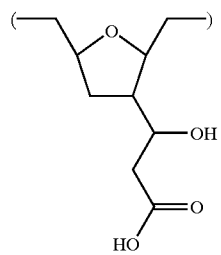
[20-2-5]
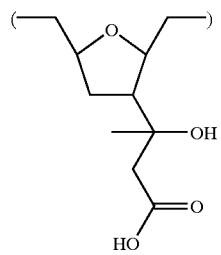
[20-2-6]
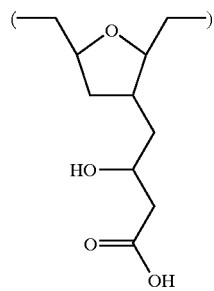
[20-2-7]
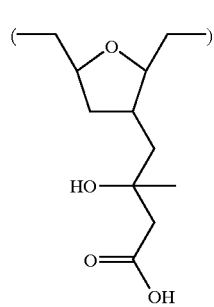
[20-2-8]
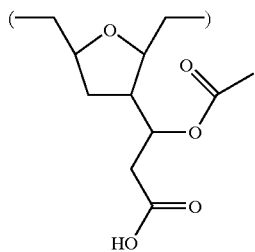
[20-2-9]
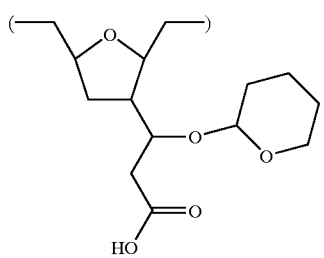
[20-2-10]
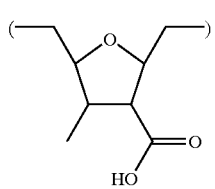
[20-2-11]
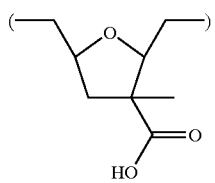
[20-2-12]
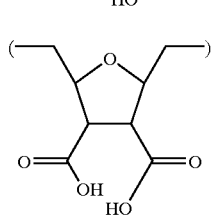
[20-2-13]
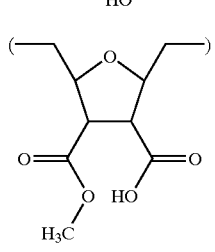
[20-2-14]
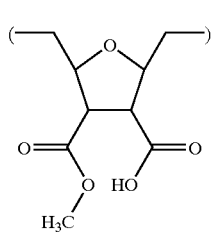
[20-2-15]

[20-2-16]
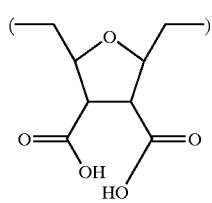
[20-3-1]
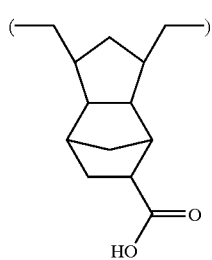
[20-3-2]
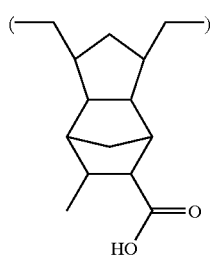
[20-3-3]
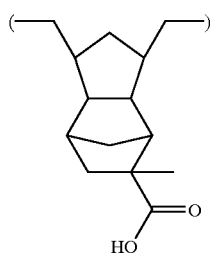
[20-3-4]
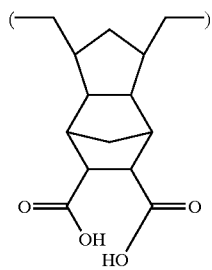
[20-3-5]
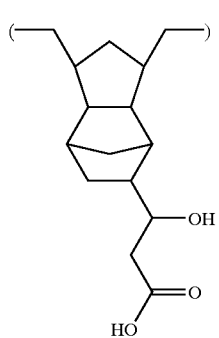
[20-3-6]
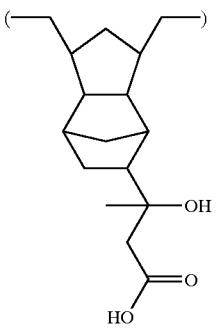
[20-3-7]
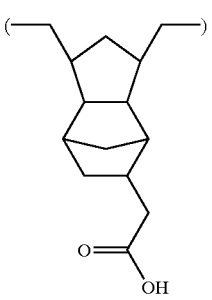
[20-3-8]
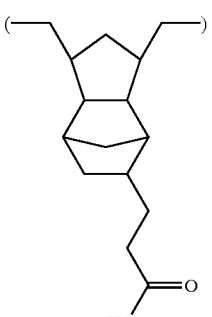
[20-3-9]
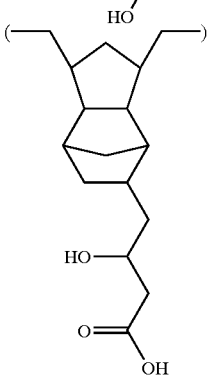
[20-3-10]
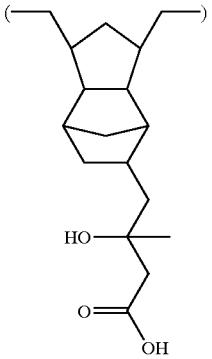

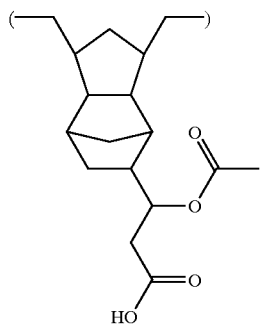 [20-3-11]
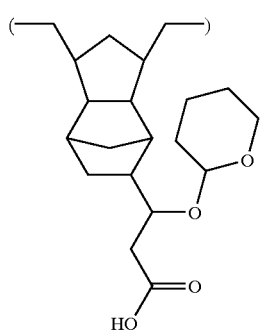 [20-3-12]
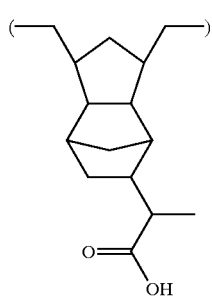 [20-3-13]
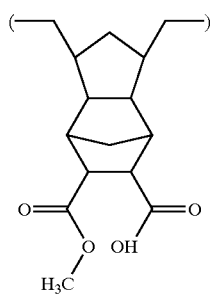 [20-3-14]
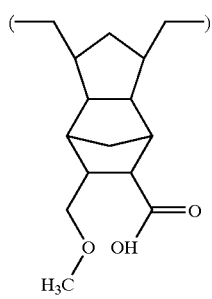 [20-3-15]
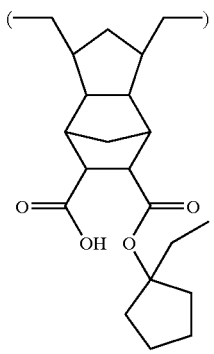 [20-3-16]
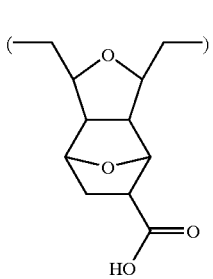 [20-4-1]
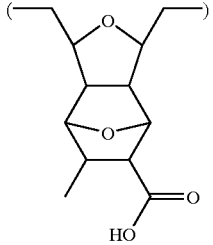 [20-4-2]
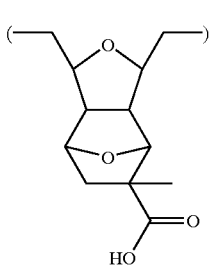 [20-4-3]
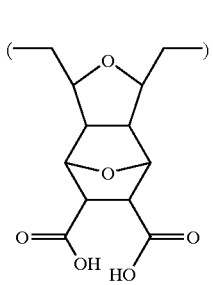 [20-4-4]

[20-4-5]
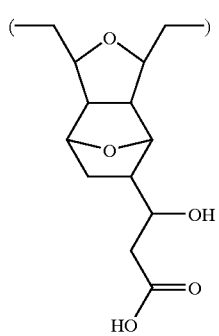
[20-4-6]
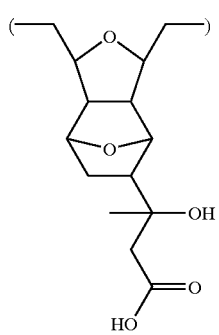
[20-4-7]
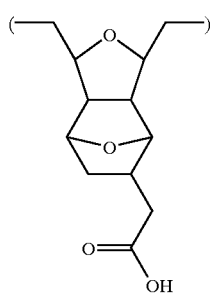
[20-4-8]
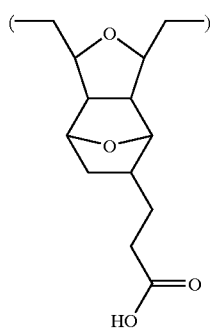
[20-4-9]
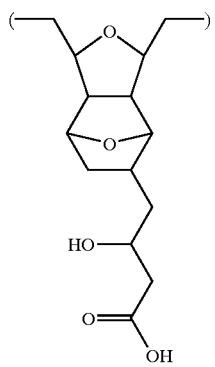
[20-4-10]
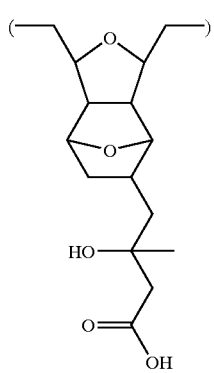
[20-4-11]
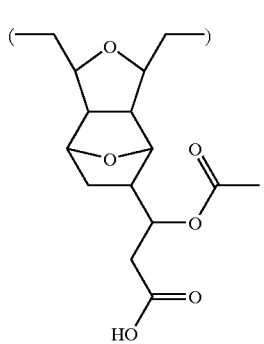
[20-4-12]
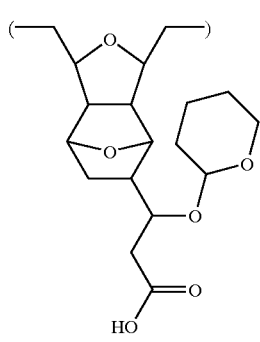
[20-4-13]
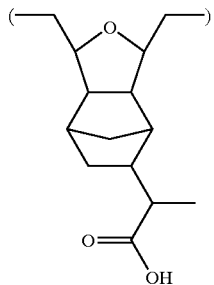
[20-4-14]
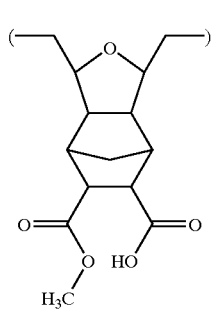

[20-4-15]

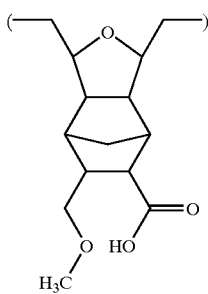

[20-4-16]

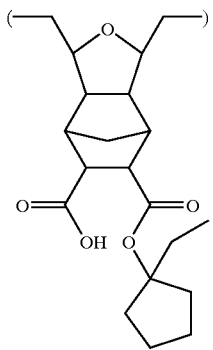

In the preferred embodiment of the invention, the molar ratio of the total of structural units [A] of formula [1], structural units [B] of formula [3] and structural units [C] of formula [4] to the structural units [D] of formula [5], that is, ([A]+[B]+[C])/[D] is between 100/0 and 20/80. It is preferred that a certain amount of the structural units [D] be present in addition to the structural units [A], [B] and [C]. The structural units [D] serve to exceptionally improve the adhesion to substrates to be processed, such as silicon substrates and improve the affinity to developers. Preferably their molar ratio ([A]+[B]+[C])/[D] is between 98/2 and 50/50, more preferably between 97/3 and 60/40, and most preferably between 95/5 and 70/30.

In addition to the structural units [A] and [B] and/or [C] and preferably [D], the preferred hydrogenated products of ring-opening metathesis copolymer used herein include additional structural units [E] of the following general formula [7].

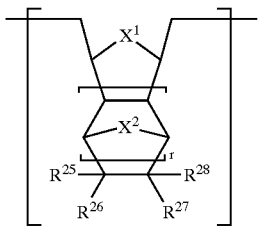

[7]

In formula [7], at least one of $R^{25}$ to $R^{28}$ is a functional group having a carboxylate group of the following general formula [8]:

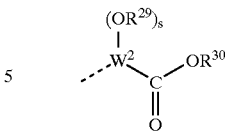

[8]

wherein the broken line denotes a free valence bond, $R^{29}$ is hydrogen, a straight, branched or cyclic $C_{1-10}$ alkyl group, a straight, branched or cyclic $C_{2-20}$ alkoxyalkyl group, or a straight, branched or cyclic $C_{1-10}$ acyl group, $R^{30}$ is a straight, branched or cyclic $C_{1-10}$ alkyl group, a straight, branched or cyclic $C_{2-10}$ alkoxyalkyl group, or a straight, branched or cyclic $C_{1-20}$ halo-alkyl group, $W^3$ is a single bond or a (s+2)-valent $C_{1-10}$ hydrocarbon group, and s is 0 or 1, the remainder of $R^{25}$ to $R^{28}$ are independently selected from among hydrogen, a straight, branched or cyclic $C_{1-20}$ alkyl group, a halogen atom, a straight, branched or cyclic $C_{1-20}$ halo-alkyl group, a straight, branched or cyclic $C_{1-20}$ alkoxy group, a straight, branched or cyclic $C_{2-20}$ alkoxyalkyl group, a straight, branched or cyclic $C_{2-20}$ alkylcarbonyloxy group, a $C_{6-20}$ arylcarbonyloxy group, a straight, branched or cyclic $C_{1-20}$ alkylsulfonyloxy group, a $C_{6-20}$ arylsulfonyloxy group, a straight, branched or cyclic $C_{2-20}$ alkoxycarbonyl group, and a straight, branched or cyclic $C_{3-20}$ alkoxycarbonylalkyl group. $X^1$ and $X^2$ are as defined above, r is 0 or an integer of 1 to 3.

For the $R^{28}$ groups, suitable straight, branched or cyclic $C_{1-10}$ alkyl groups include methyl, ethyl, propyl, isopropyl, n-butyl, isobutyl, tert-butyl, cyclopentyl, cyclohexyl, 1-ethylcyclopentyl, and 1-ethylcyclohexyl; suitable straight, branched or cyclic $C_{2-20}$ alkoxyalkyl groups include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl; and suitable straight, branched or cyclic $C_{1-10}$ acyl groups include formyl, acetyl, pivaloyl and cyclohexylcarbonyl. Of these $R^{28}$ groups, straight or branched $C_{1-6}$ alkyl groups, straight, branched or cyclic $C_{2-7}$ alkoxyalkyl groups and straight or branched $C_{2-7}$ acyl groups are preferred, with hydrogen, methyl, ethyl, methoxymethyl, 1-ethoxyethyl, tetrahydrofuran-2-yl and acetyl being most preferred.

For the $R^{29}$ groups, suitable straight, branched or cyclic $C_{1-10}$ alkyl groups include methyl, ethyl, propyl, isopropyl, n-butyl, isobutyl, tert-butyl; suitable straight, branched or cyclic $C_{2-10}$ alkoxyalkyl groups include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl and tetrahydropyran-2-yl; and suitable straight, branched or cyclic $C_{1-20}$ halo-alkyl groups include fluoromethyl, chloromethyl, bromomethyl, difluoromethyl, dichloromethyl, dibromomethyl, trifluoromethyl, trichloromethyl and tribromomethyl. Of these $R^{29}$ groups, straight or branched $C_{1-10}$ alkyl groups are preferred, with methyl, ethyl, propyl, isopropyl, n-butyl, isobutyl and tert-butyl being most preferred.

For the $W^3$ groups, the (s+2)-valent $C_{1-10}$ hydrocarbon groups are, in the case of s=0, straight, branched or cyclic, divalent $C_{1-10}$ hydrocarbon groups, for example, methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene and 1,4-cyclohexylene. Of these, methylene, ethylidene, ethylene, 1-methylethylene, 2-methylethylene, trimethylene and 2-methyltrimethylene are preferred. Exemplary groups in the case of s=1 are those hydrocarbon groups enumerated in the case of s=0, from which one hydrogen atom at an arbitrary position is eliminated to provide a valence bond. Most preferably $W^3$ is a single bond.

The remainder of $R^{24}$ to $R^{27}$ are independently selected from among hydrogen; straight, branched or cyclic $C_{1-20}$ alkyl groups such as methyl, ethyl, propyl, isopropyl, n-butyl, tert-butyl, cyclohexyl and menthyl; halogen atoms such as chloro, bromo, iodo and fluoro; straight, branched or cyclic $C_{1-20}$, halo-alkyl groups such as fluoromethyl, chloromethyl, bromomethyl, difluoromethyl, dichloromethyl, dibromomethyl, trifluoromethyl, trichloromethyl and tribromomethyl; straight, branched or cyclic $C_{1-12}$ alkoxy groups such as methoxy, ethoxy, isopropoxy, n-butoxy, tert-butoxy and menthoxy; straight, branched or cyclic $C_{2-20}$ alkoxyalkyl groups such as methoxymethyl, methoxyethyl, tert-butoxymethyl, tert-butoxyethyl and methoxymenthol as well as alkoxy saccharides such as methylglucose; straight, branched or cyclic $C_{2-20}$ alkylcarbonyloxy groups such as acetoxy; $C_{6-20}$ arylcarbonyloxy groups such as naphthoyloxy; straight, branched or cyclic $C_{1-20}$ alkylsulfonyloxy groups such as mesyloxy; $C_{6-20}$ arylsulfonyloxy groups such as tosyloxy; straight, branched or cyclic $C_{2-20}$ alkoxycarbonyl groups such as methoxycarbonyl, ethoxycarbonyl, n-propoxycarbonyl, isopropoxycarbonyl, n-butoxycarbonyl, tert-butoxycarbonyl and cyclohexyloxycarbonyl; and straight, branched or cyclic $C_{3-20}$ alkoxycarbonylalkyl groups such as methoxycarbonylmethyl, 2-(methoxycarbonyl)ethyl, 1-(methoxycarbonyl)ethyl, ethoxycarbonylmethyl, 2-(ethoxycarbonyl)ethyl, n-propoxycarbonylmethyl, isopropoxycarbonylmethyl, n-butoxycarbonylmethyl, tert-butoxycarbonylmethyl and cyclohexyloxycarbonylmethyl. Preferred among these groups are hydrogen, straight, branched or cyclic $C_{1-20}$ alkyl groups, straight, branched or cyclic $C_{2-20}$ alkoxy groups, straight, branched or cyclic $C_{2-20}$ alkoxyalkyl groups, straight, branched or cyclic $C_{2-20}$ alkylcarbonyl groups, and straight, branched or cyclic $C_{3-20}$ alkoxycarbonylalkyl groups. Most preferred are hydrogen, straight or branched $C_{1-10}$ alkyl groups, straight or branched $C_{2-10}$ alkoxycarbonyl groups, and straight or branched $C_{3-10}$ alkoxycarbonylalkyl groups.

$X^1$ and $X^2$ are as defined above, and may be the same or different when r is 1 to 3. Illustrative $R^{30}$ groups include hydrogen and straight or branched $C_{1-10}$ alkyl groups such as methyl, ethyl, n-propyl, isopropyl, n-butyl, or tert-butyl. The subscript r is preferably 0 or 1.

Illustrative examples of the structural units of formula [7] are structural units [E] of the chemical formulae [21-1-1] through [21-4-16] below.

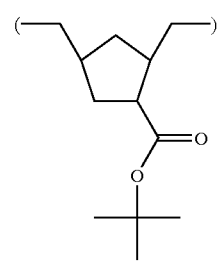

[21-1-1]

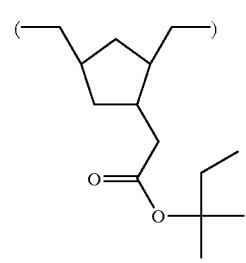

[21-1-2]

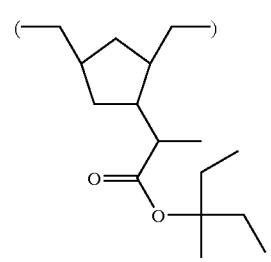

[21-1-3]

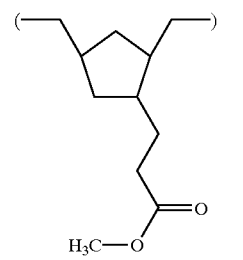

[21-1-4]

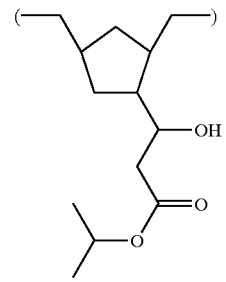

[21-1-5]

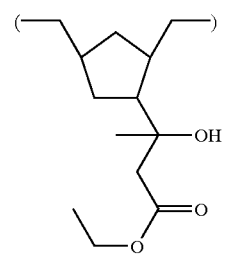

[21-1-6]

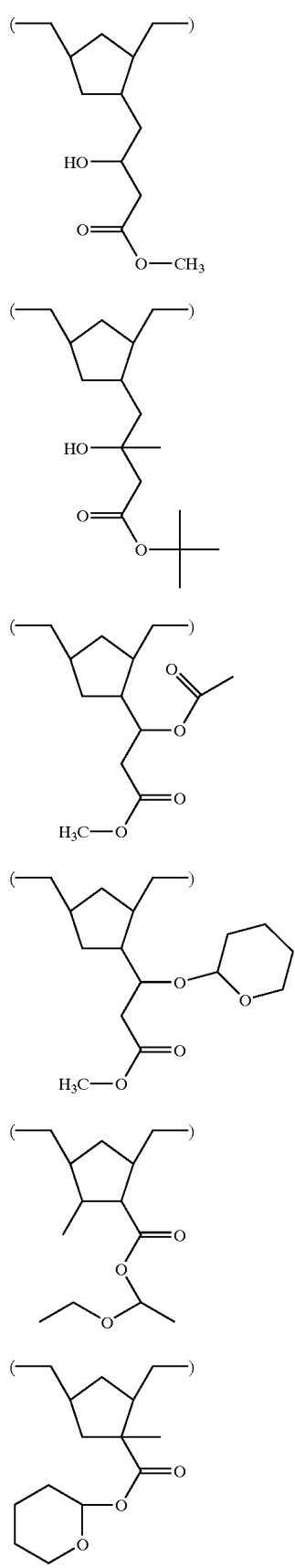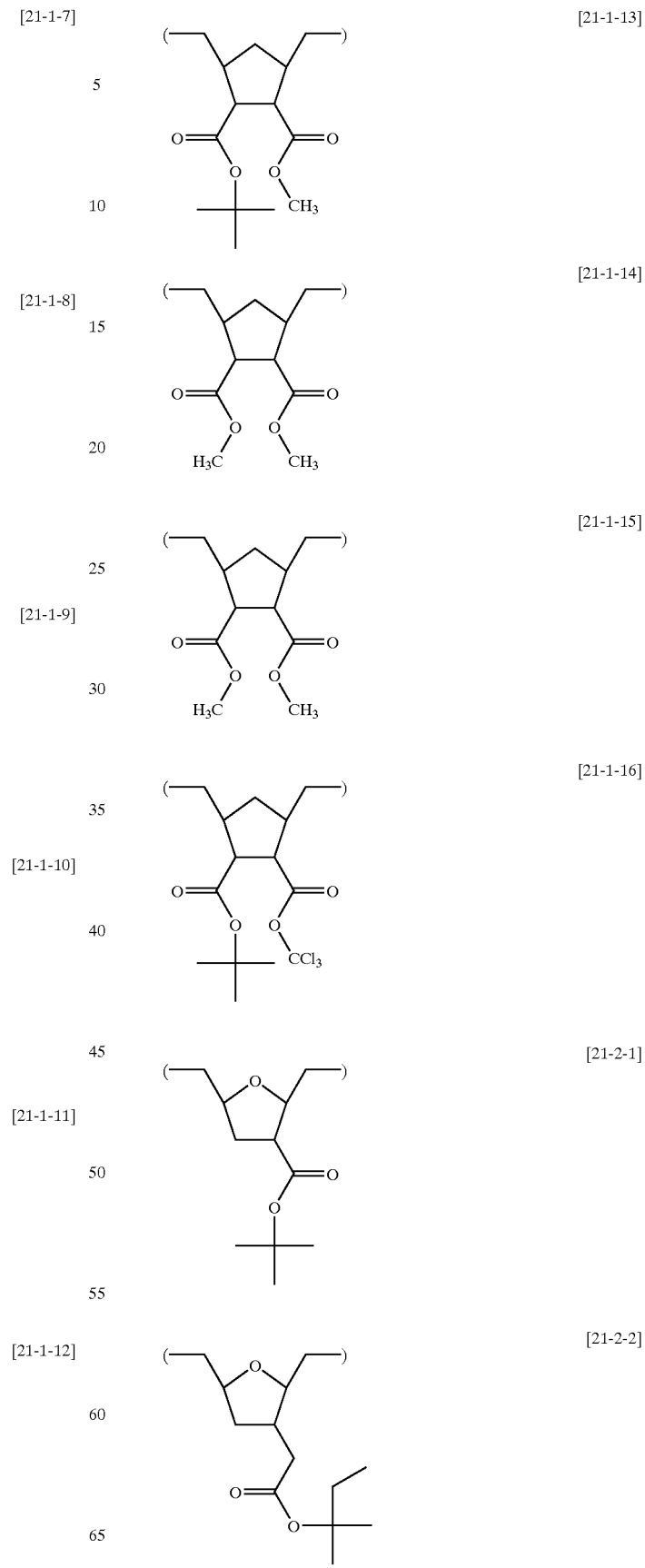

[21-2-3]
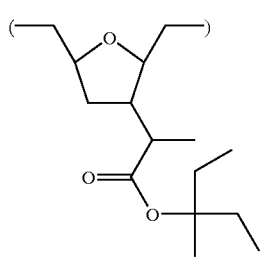
[21-2-4]
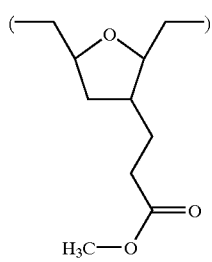
[21-2-5]
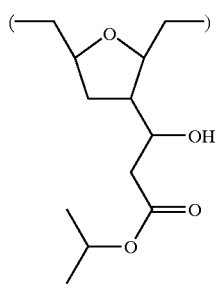
[21-2-6]
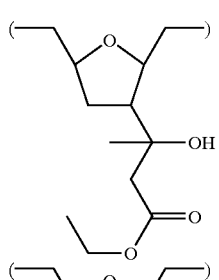
[21-2-7]
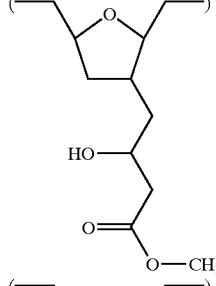
[21-2-8]
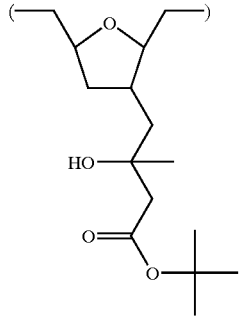
[21-2-9]
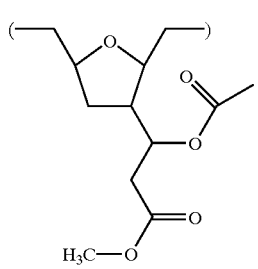
[21-2-10]
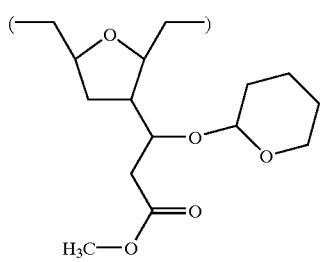
[21-2-11]
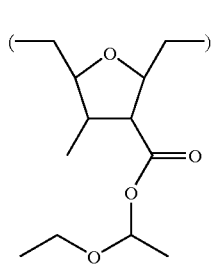
[21-2-12]
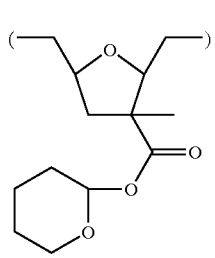
[21-2-13]
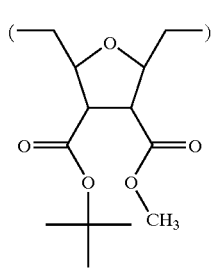
[21-2-14]
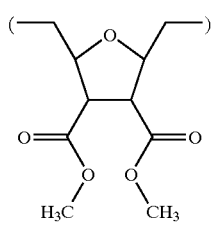

[21-2-15]
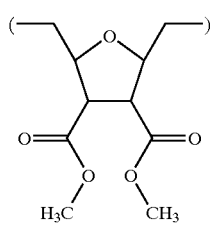
[21-2-16]
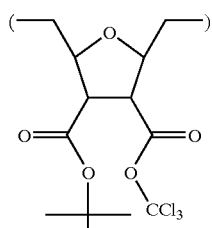
[21-3-1]
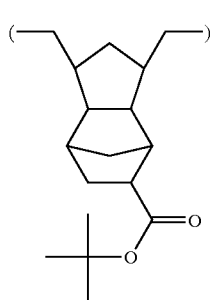
[21-3-2]
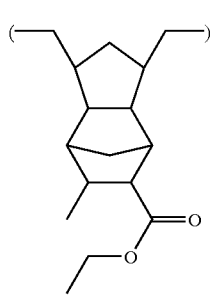
[21-3-3]
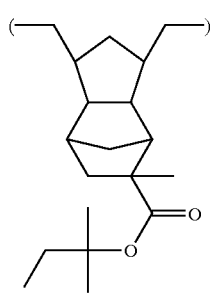
[21-3-4]
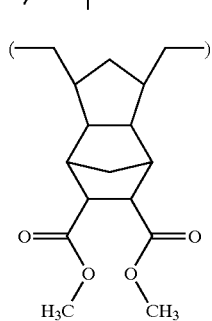
[21-3-5]
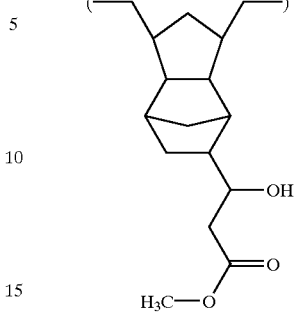
[21-3-6]
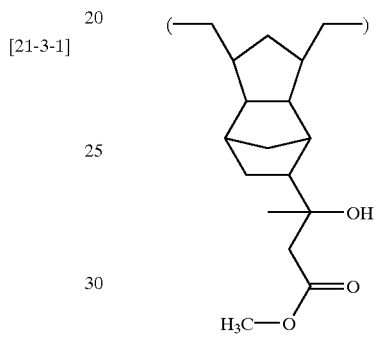
[21-3-7]
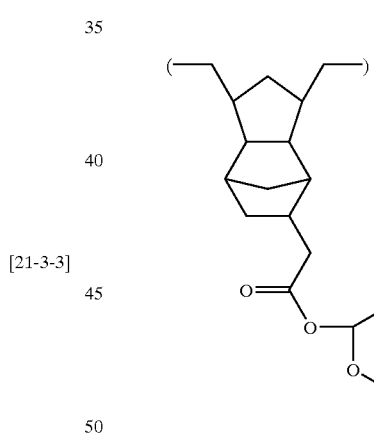
[21-3-8]
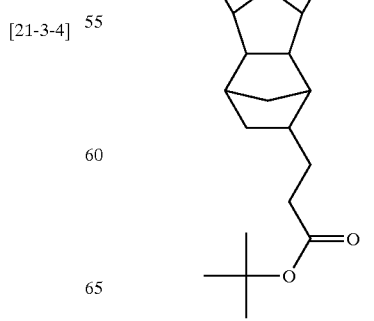

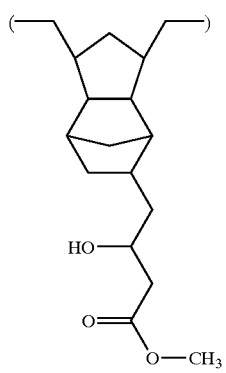
[21-3-9]
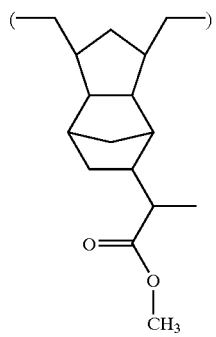
[21-3-13]
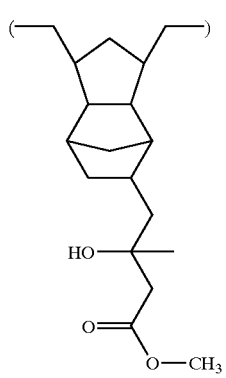
[21-3-10]
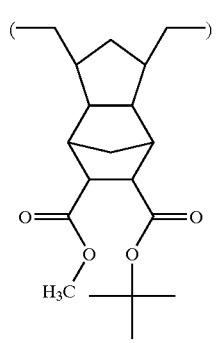
[21-3-14]
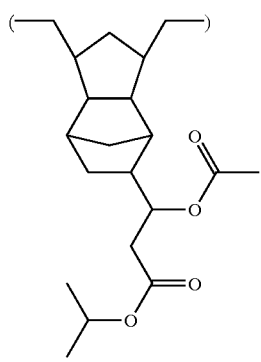
[21-3-11]
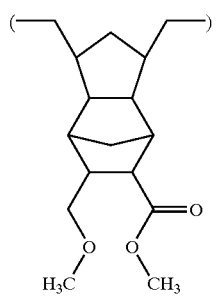
[21-3-15]
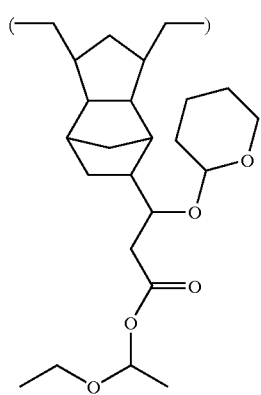
[21-3-12]
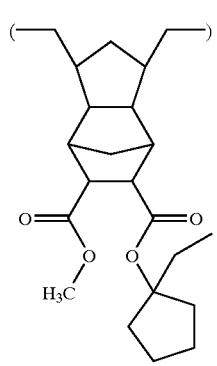
[21-3-16]
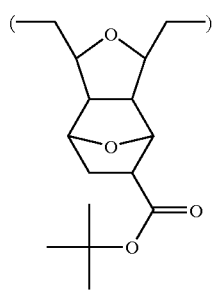
[21-4-1]

[21-4-2]
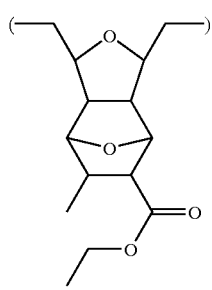
[21-4-3]
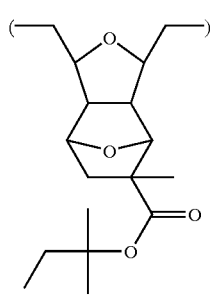
[21-4-4]
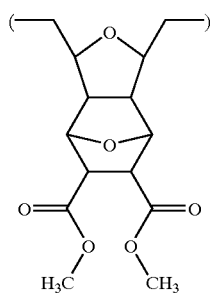
[21-4-5]
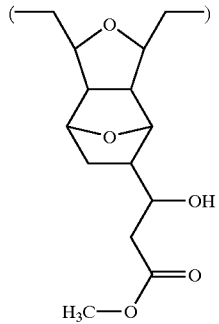
[21-4-6]
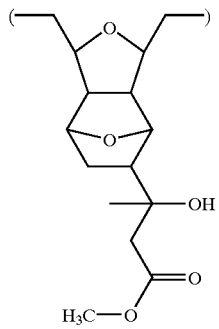
[21-4-7]
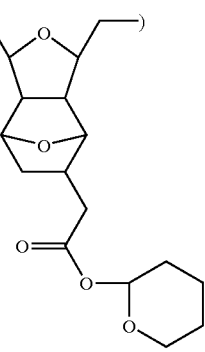
[21-4-8]
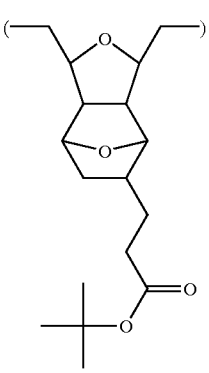
[21-4-9]
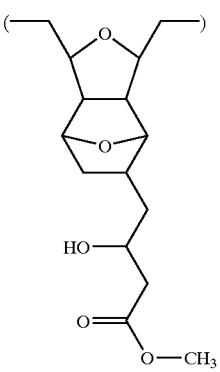
[21-4-10]
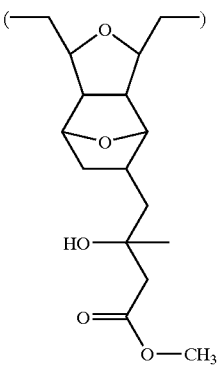

-continued

[21-4-11]

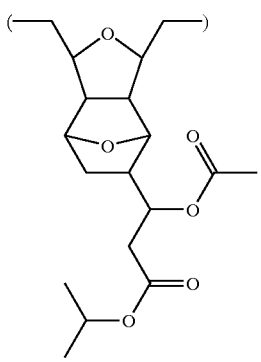

[21-4-12]

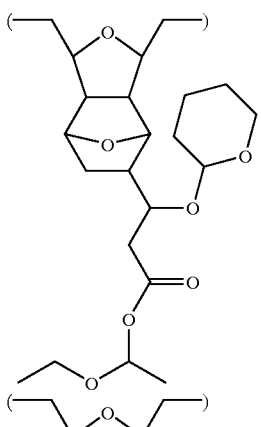

[21-4-13]

[21-4-14]

[21-4-15]

-continued

[21-4-16]

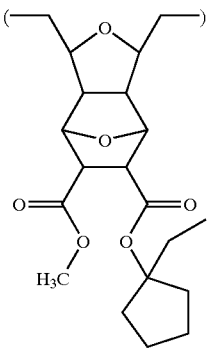

In addition to the structural units [A] and [B] and/or [C] and preferably [D] and/or [E], the preferred hydrogenated products of ring-opening metathesis copolymer used herein may include additional structural units [F] of the following general formula [22].

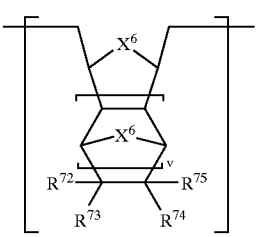

[22]

In formula [22], $R^{72}$ to $R^{75}$ are each independently selected from among hydrogen, straight, branched or cyclic $C_{1-20}$ alkyl groups, halogen atoms, straight, branched or cyclic $C_{1-20}$ halo-alkyl groups, straight, branched or cyclic $C_{1-20}$ alkoxy groups, straight, branched or cyclic $C_{2-20}$ alkoxyalkyl groups, hydroxy groups, straight, branched or cyclic $C_{1-20}$ hydroxyalkyl groups, cyano groups, straight, branched or cyclic $C_{2-20}$ cyanoalkyl groups, straight, branched or cyclic $C_{2-20}$ alkylcarbonyloxy groups, straight, branched or cyclic $C_{3-20}$ alkylcarbonyloxyalkyl groups, $C_{6-20}$ arylcarbonyloxy groups, straight, branched or cyclic $C_{1-21}$ alkylsulfonyloxy groups, straight, branched or cyclic $C_{2-20}$ alkylsulfonyloxyalkyl groups, and $C_{6-20}$ arylsulfonyloxy groups; $X^6$ is —O— or —$CR^{76}_2$— and may be the same or different; $R^{76}$ is hydrogen or a straight or branched $C_{1-10}$ alkyl group; v is 0 or an integer of 1 to 3.

It is noted that the structural units [F] may be introduced in an amount of 0 to 50 mol %, especially 0 to 30 mol % based on the total moles of the structural units [A] to [E].

In the hydrogenated products of ring-opening metathesis copolymer used herein, the molar ratio of the structural units [A] of formula [1] to the structural units [B] of formula [3] and/or the structural units [C] of formula [4], that is, [A]/([B]+[C]) is most often between 20/80 and 99/1. The structural units [A] contain a cyclic alkyl tertiary ester group of formula [2], that is, a group which is decomposable with the acid generated from a photoacid generator upon exposure, and are necessary to form a resist pattern by development with aqueous alkali after exposure. The structural units [B] and/or [C] are necessary to exert adhesion to

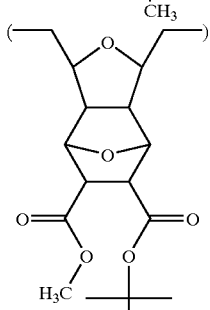

substrates to be processed, such as silicon substrates. A molar ratio [A]/([B]+[C]) of less than 20/80 can lead to under-development whereas a molar ratio in excess of 99/1 fails to manifest adhesion to substrates to be processed. Owing to the carboxylic groups included, the structural units [D] of formula [6] serve to improve the adhesion to substrates to be processed, such as silicon substrates and the solubility in solvents. The preferred embodiment of the invention wherein the molar ratio of the total of structural units [A], [B] and [C] to the structural units [D], that is, ([A]+[B]+[C])/[D] is between 100/0 and 20/80 is effective for improving the wetting tension with aqueous alkali during development after exposure, eliminating development variations. The proportion of these structural units controlled within the above range is adequate to prepare a resist composition, and is very important in preparing a resist composition by dissolving the polymer in a polar solvent such as 2-heptanone along with a polar photoacid generator or photosensitive agent, the resist composition being applied to substrates to be processed, such as silicon substrates. That is, when a resist composition is prepared, the hydrogenated product of ring-opening metathesis polymer has a high solubility or high dissolution rate in the polar solvent, ensuring that a uniform smooth coating film is formed. Where the polymer includes structural units [E] in addition to structural units [A] and [B] and/or [C], which means the containment of ester groups having different reactivity from the ester groups in structural units [A], this preferred embodiment has the advantage that the ability to decompose during exposure can be freely controlled. In this preferred embodiment, the molar ratio of structural units ([A]+[B]+ µl)/[E] is preferably between 100/0 and 40/60. If the structural units [E] has acid labile groups, they may be included as a substitute for the structural units [A]. Again in that event, the preferred molar ratio of such structural units. ([E]+[B]+[C])/[D] is between 100/0 and 20/80.

The hydrogenated products of ring-opening metathesis copolymer used herein can be obtained by polymerizing cyclic olefin monomers corresponding to structural units [A] of formula [1], structural units [B] of formula [3] and/or structural units [C] of formula [4], and optionally, structural units [E] of formula [7] and also optionally, structural units [F] of formula [22], respectively, in the presence of a ring-opening metathesis catalyst, and hydrogenating the resulting polymer in the presence of a hydrogenation catalyst.

The cyclic olefin monomer corresponding to structural units [A] of formula [1] is one having a structure of the general formula [9] shown below; the cyclic olefin monomer corresponding to structural units [B] of formula [3] is one having a structure of the general formula [10] shown below; the cyclic olefin monomer corresponding to structural units [C] of formula [4] is one having a structure of the general formula [11] shown below; the cyclic olefin monomer corresponding to structural units [E] of formula [7] is one having a structure of the general formula [23] shown below; and the cyclic olefin monomer corresponding to structural units [F] of formula [22] is one having a structure of the general formula [23] shown below.

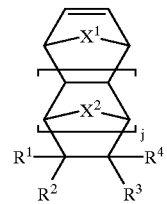

[9]

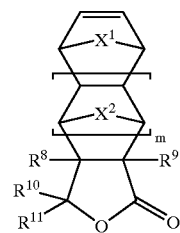

[10]

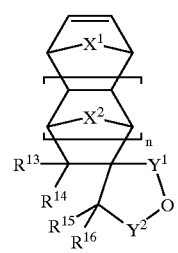

[11]

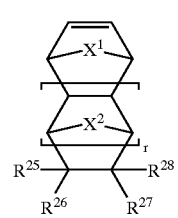

[12]

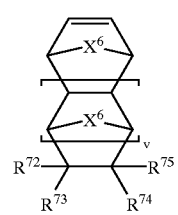

[23]

Herein, $R^1$ to $R^{75}$, $X^1$, $X^2$, $X^6$, $Y^1$, $Y^2$, j, m, n, r and v are as defined previously.

The hydrogenated products of ring-opening metathesis copolymer used herein are often prepared by polymerizing the aforementioned cyclic olefin monomers in the presence of a living ring-opening metathesis catalyst, and preferably in the presence of a chain transfer agent such as an olefin or diene, and in a solvent or without a solvent, and then hydrogenating the resulting polymer in a solvent under a hydrogen pressure in the presence of a hydrogenation catalyst.

By decomposing at least some of the cyclic alkyl tertiary ester groups of formula [2] and/or the ester groups of formula [8] in the hydrogenated product of ring-opening metathesis copolymer obtained by polymerization and hydrogenation, to convert them into carboxylic acid, there can be obtained a hydrogenated product of ring-opening metathesis polymer comprising structural units [A] of formula [1], structural units [B] of formula [3] and/or structural units [C] of formula [4], structural units [D] of formula [5], and optionally, structural units [E] of formula [7] and also optionally, structural units [F] of formula [22], wherein the molar ratio of structural units [A]/([B]+[C]) is from 20/80 to 99/1 and the polydispersity index Mw/Mn is from 1.0 to 2.0.

The method of decomposing at least some of the cyclic alkyl tertiary ester groups of formula [2] and/or the ester groups of formula [8] to convert them into carboxylic acid may be any of conventional methods which include, but are not limited to, hydrolysis under basic conditions, hydrolysis under acidic conditions, hydrolysis under neutral conditions, and acidolysis.

After the hydrogenated product of ring-opening metathesis polymer having carboxylic acid functional groups is obtained by the above method, the carboxylic acid functional groups can be converted to ester whereby a hydrogenated product of ring-opening metathesis polymer comprising structural units [A] of formula [1], structural units [B] of formula [3] and/or structural units [C] of formula [4], and optionally, structural units [D] of formula [5], and optionally, structural units [E] of formula 17] and also optionally, structural units [E] of formula [22], wherein the molar ratio of structural units [A]/([B]+[C]) is from 20/80 to 99/1 and the polydispersity index Mw/Mn is from 1.0 to 2.0 is obtainable.

The method of converting the carboxylic acid functional groups into ester may be any of conventional methods which include, but are not limited to, esterification through dehydrating condensation reaction with alcohols, esterification with ortho-alkylating agents, esterification by addition of olefins in the presence of acids, esterification by condensation reaction with halides using organic basic compounds, alkoxyalkyl esterification by addition of alkyl vinyl ethers, esterification involving conversion of carboxylic acid to acid halide with the aid of thionyl chloride or the like and contact with alcohols, and esterification by contacting metal salts of carboxylic acid with halides.

Second Embodiment

In the resist pattern forming process according to the second embodiment of the present invention, the base resin used in the resist composition is a mixture of a hydrogenated product of ring-opening metathesis polymer and a poly(meth)acrylic acid derivative.

The (second) hydrogenated product of ring-opening metathesis polymer used herein is a polymer comprising recurring units of the following general formula (I) and having a weight average molecular weight of 500 to 200,000.

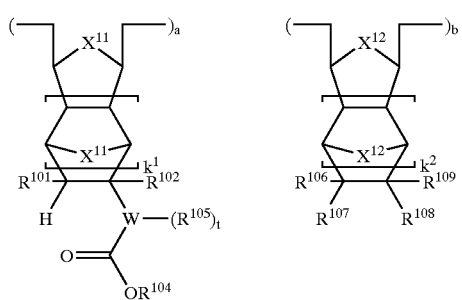

(I)

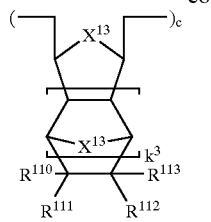

-continued

Herein $R^{101}$ is hydrogen, methyl or $CH_2CO_2R^{103}$; $R^{102}$ is hydrogen, methyl or $CO_2R^{103}$; $R^{103}$ which may be identical or different between $R^{101}$ and $R^{102}$ is a straight, branched or cyclic alkyl group of 1 to 15 carbon atoms; $R^{104}$ is an acid labile group; $R^{105}$ is a halogen atom, a hydroxyl group, a straight, branched or cyclic alkoxy, acyloxy or alkylsulfonyloxy group having 1 to 15 carbon atoms, or a straight, branched or cyclic alkoxycarbonyloxy or alkoxyalkoxy group having 2 to 15 carbon atoms, in which some or all of the hydrogen atoms on constituent carbon atoms may be substituted with halogen atoms; at least one of $R^{106}$ to $R^{109}$ is a monovalent hydrocarbon group of 1 to 15 carbon atoms having a carboxyl or hydroxyl group while the remainders of $R^{106}$ to $R^{109}$ are independently hydrogen or straight, branched or cyclic alkyl groups of 1 to 15 carbon atoms, or a pair of $R^{106}$ and $R^{107}$, $R^{107}$ and $R^{108}$, or $R^{108}$ and $R^{109}$, taken together, may form a ring with the carbon atom or atoms to which they are bonded, and in that event, one of $R^{106}$ and $R^{107}$, $R^{107}$ and $R^{108}$ or $R^{108}$ and $R^{109}$ is a divalent hydrocarbon group of 1 to 15 carbon atoms having a carboxyl or hydroxyl group while the other is a single bond or a straight, branched or cyclic alkylene group of 1 to 15 carbon atoms; at least one of $R^{110}$ to $R^{113}$ is a monovalent hydrocarbon group of 2 to 15 carbon atoms containing at least one partial structure selected from among ether, aldehyde, ketone, ester, carbonate, acid anhydride, amide and imide while the remaining R's are independently hydrogen or straight, branched or cyclic alkyl groups of 1 to 15 carbon atoms, or a pair of $R^{110}$ and $R^{111}$, $R^{111}$ and $R^{112}$, or $R^{112}$ and $R^{113}$, taken together, may form a ring with the carbon atom or atoms to which they are bonded, and in that event, one of $R^{110}$ and $R^{111}$, $R^{111}$ and $R^{112}$, or $R^{112}$ and $R^{113}$ is a divalent hydrocarbon group of 1 to 15 carbon atoms containing at least one partial structure selected from among ether, aldehyde, ketone, ester, carbonate, acid anhydride, amide and imide, while the other is a single bond or straight, branched or cyclic alkylene group of 1 to 15 carbon atoms; $X^{11}$ to $X^{13}$ each are independently a methylene group or oxygen atom, with the proviso that all $X^{11}$ to $X^{13}$ are not methylene groups at the same time; W is a single bond or a straight, branched or cyclic (t+2)-valent hydrocarbon group having 1 to 5 carbon atoms, in which at least one methylene group may be substituted with an oxygen atom to form a chain-like or cyclic ether or two hydrogen atoms on a common carbon may be substituted with an oxygen atom to form a ketone; $k^1$ to $k^3$ each are independently 0 or 1, t is 0, 1 or 2, "a," "b" and "c" representative of compositional ratios of the corresponding recurring units are such numbers that 0<a<1, 0≦b<1, 0≦c<1 and a+b+c=1. The recurring units introduced in the respective compositional ratios "a," "b" and "c" each may be of one or more types.

More particularly, $R^{101}$ is hydrogen, methyl or $CH_2CO_2R^{103}$. $R^{102}$ is hydrogen, methyl or $CO_2R^{103}$. $R^{103}$ stands for straight, branched or cyclic alkyl groups of 1 to 15 carbon atoms, such as, for example, methyl, ethyl, propyl, -isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl and butyladamantyl. $R^{104}$ stands for acid labile groups to be described later.

$R^{105}$ is a halogen atom, a hydroxyl group, a straight, branched or cyclic alkoxy, acyloxy or alkylsulfonyloxy group of 1 to 15 carbon atoms, or a straight, branched or cyclic alkoxycarbonyloxy or alkoxyalkoxy group of 2 to 15 carbon atoms, in which some or all of the hydrogen atoms on constituent carbon atoms may be substituted with halogen atoms. Exemplary of $R^{105}$ are fluoro, chloro, bromo, hydroxy, methoxy, ethoxy, propoxy, isopropoxy, n-butoxy, sec-butoxy, tert-butoxy, tert-amyloxy, n-pentoxy, n-hexyloxy, cyclopentyloxy, cyclohexyloxy, ethylcyclopentyloxy, butylcyclopentyloxy, ethylcyclohexyloxy, butylcyclohexyloxy, adamantyloxy, ethyladamantyloxy, butyladamantyloxy, formyloxy, acetoxy, ethylcarbonyloxy, pivaloyloxy, methanesulfonyloxy, ethanesulfonyloxy, n-butanesulfonyloxy, trifluoroacetoxy, trichloroacetoxy, 2,2,2-trifluoroethylcarbonyloxy, methoxymethoxy, 1-ethoxyethoxy, 1-ethoxypropoxy, 1-tert-butoxyethoxy, 1-cyclohexyloxyethoxy, 2-tetrahydrofuranyloxy, 2-tetrahydropyranyloxy, methoxycarbonyloxy, ethoxycarbonyloxy, and tert-butoxycarbonyloxy.

At least one of $R^{106}$ to $R^{109}$ represents a monovalent hydrocarbon group of 1 to 15 carbon atoms containing a carboxyl or hydroxyl group while the remainders of $R^{106}$ to $R^{109}$ independently represent hydrogen or a straight, branched or cyclic alkyl group of 1 to 15 carbon atoms. Examples of the carboxyl or hydroxyl-bearing monovalent hydrocarbon group of 1 to 15 carbon atoms include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. Examples of the straight, branched or cyclic alkyl group of 1 to 15 carbon atoms are the same as exemplified for $R^{103}$. Alternatively, a pair of $R^{106}$ and $R^{107}$, $R^{107}$ and $R^{108}$, or $R^{108}$ and $R^{109}$, taken together, may form a ring with the carbon atom or atoms to which they are bonded, and in that event, one of $R^{106}$ and $R^{107}$, $R^{107}$ and $R^{108}$, or $R^{108}$ and $R^{109}$ is a divalent hydrocarbon group of 1 to 15 carbon atoms having a carboxyl or hydroxyl group while the other is a single bond or a straight, branched or cyclic alkylene group of 1 to 15 carbon atoms. Examples of the carboxyl or hydroxyl-bearing divalent hydrocarbon group of 1 to 15 carbon atoms include the groups exemplified as the carboxyl or hydroxyl-bearing monovalent hydrocarbon group, with one hydrogen atom eliminated therefrom. Examples of the straight, branched or cyclic alkylene groups of 1 to 15 carbon atoms include the groups exemplified for $R^{103}$, with one hydrogen atom eliminated therefrom.

At least one of $R^{110}$ to $R^{113}$ is a monovalent hydrocarbon group of 2 to 15 carbon atoms containing at least one partial structure selected from among ether, aldehyde, ketone, ester, carbonate, acid anhydride, amide and imide, while the remainders of $R^{110}$ to $R^{113}$ are independently hydrogen or straight, branched or cyclic alkyl groups of 1 to 15 carbon atoms. Examples of the monovalent hydrocarbon group of 2 to 15 carbon atoms containing at least one partial structure selected from among ether, aldehyde, ketone, ester, carbonate, acid anhydride, amide and imide include methoxymethyl, methoxymethoxymethyl, formyl, methylcarbonyl, formyloxy, acetoxy, pivaloyloxy, formyloxymethyl, acetoxymethyl, pivaloyloxymethyl, methoxycarbonyl, 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic alkyl groups of 1 to 15 carbon atoms are the same as exemplified for $R^{103}$. Alternatively, a pair of $R^{110}$ and $R^{111}$, $R^{111}$ and $R^{112}$, or $R^{112}$ and $R^{113}$, taken together, may form a ring with the carbon atom or atoms to which they are bonded, and in that event, one of $R^{110}$ and $R^{111}$, $R^{111}$ and $R^{112}$, or $R^{112}$ and $R^{113}$ is a divalent hydrocarbon group of 1 to 15 carbon atoms containing at least one partial structure selected from among ether, aldehyde, ketone, ester, carbonate, acid anhydride, amide and imide, while the other is a single bond or a straight, branched or cyclic alkylene group of 1 to 15 carbon atoms. Examples of the divalent hydrocarbon group of 1 to 15 carbon atoms containing at least one partial structure selected from among ether, aldehyde, ketone, ester, carbonate, acid anhydride, amide and imide include 2-oxapropane-1,3-diyl, 1,1-dimethyl-2-oxapropane-1,3-diyl, 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group of 1 to 15 carbon atoms containing at least one partial structure selected from among ether, aldehyde, ketone, ester, carbonate, acid anhydride, amide and imide, with one hydrogen atom eliminated therefrom. Examples of the straight, branched or cyclic alkylene groups of 1 to 15 carbon atoms include the groups exemplified for $R^{103}$, with one hydrogen atom eliminated therefrom.

$X^{11}$ to $X^{13}$ each are independently a methylene group or an oxygen atom, with the proviso that all $X^{11}$ to $X^{13}$ are not methylene groups at the same time.

W is a single bond or a straight, branched or cyclic (t+2)-valent hydrocarbon group having 1 to 5 carbon atoms, in which at least one methylene group may be substituted with an oxygen atom to form a chain-like or cyclic ether or two hydrogen atoms on a common carbon may be substituted with an oxygen atom to form a ketone. In case of t=0, for example, exemplary W groups are methylene, ethylene, trimethylene, tetramethylene, pentamethylene, 1,2-propanediyl, 1,3-butanediyl, 1-oxo-2-oxapropane-1,3-diyl, and 3-methyl-1-oxo-2-oxabutane-1,4-diyl. In case of t≠0, exemplary W groups are (t+2)-valent groups obtained by eliminating one or two hydrogen atoms from the above-exemplified groups.

Letters $k^1$ to $k^3$ each are independently 0 or 1; t is 0, 1 or 2; "a," "b" and "c" representative of compositional ratios of the corresponding recurring units are such numbers that $0<a<1$, $0 \leq b<1$, $0 \leq c<1$ and $a+b+c=1$. The preferred ranges of "a," "b" and "c" are:

$0.1 \leq a \leq 0.9$, $0 \leq b \leq 0.8$, and $0 \leq c \leq 0.8$, more preferably $0.2 \leq a \leq 0.8$, $0 \leq b \leq 0.7$, and $0 \leq c \leq 0.7$, and most preferably $0.3 \leq a \leq 0.7$, $0 \leq b \leq 0.6$, and $0 \leq c \leq 0.6$.

The recurring units introduced in the respective compositional ratios "a," "b" and "c" each may be of one or more types. As the compositional ratio of the respective recurring units changes, various properties including developer affinity, substrate adhesion and etch resistance change as well. Then a proper choice of a, b and c values allows for fine adjustment of the resist composition's performance.

The acid labile groups represented by $R^{104}$ are as defined for $R^{AL}$.

Illustrative, non-limiting, examples of the recurring units introduced in compositional ratio "a" in the hydrogenated product of ring-opening metathesis polymer of formula (I) are given below.

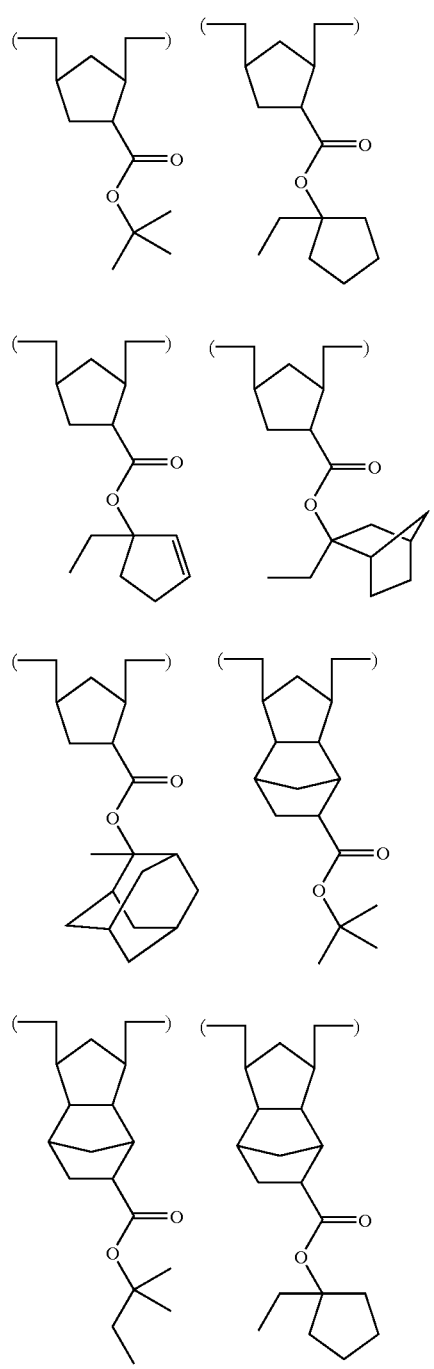

-continued

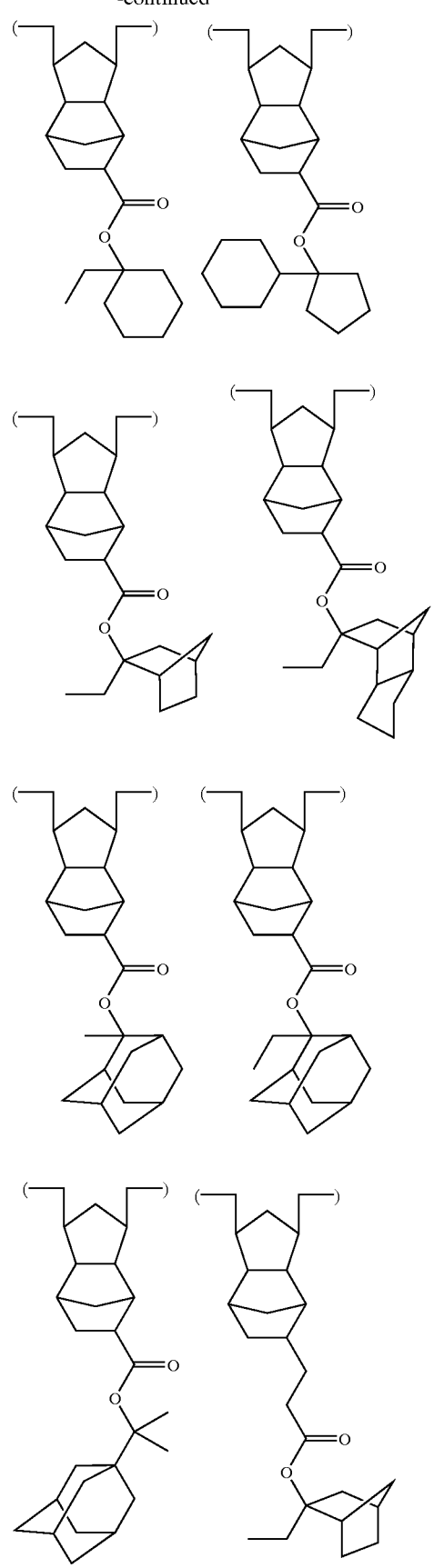

-continued
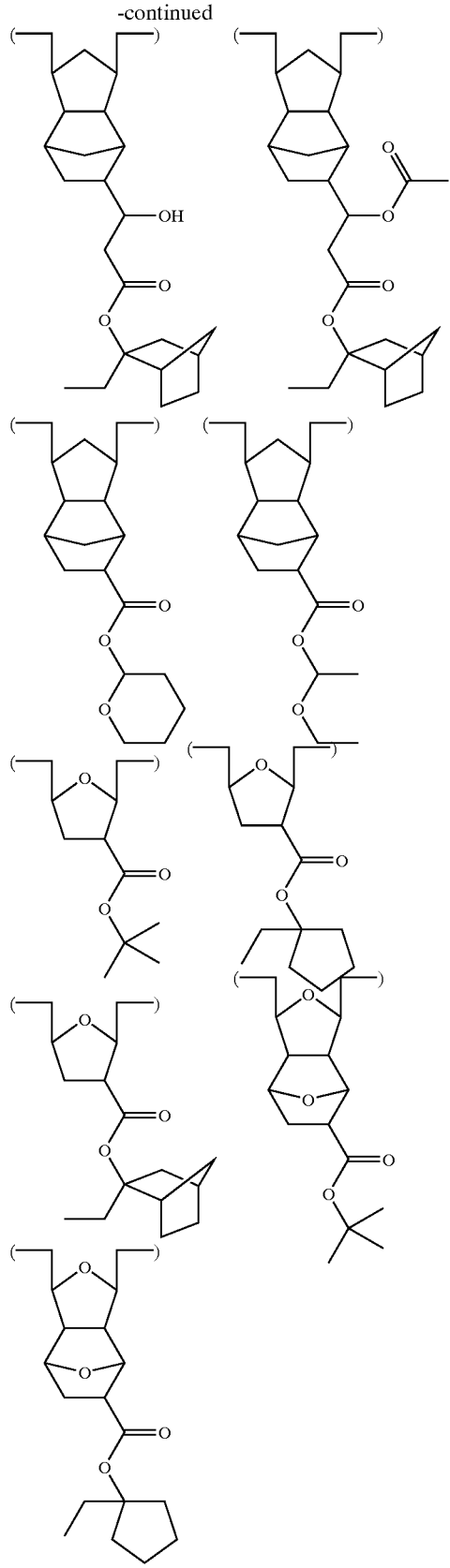
Illustrative, non-limiting, examples of the recurring units introduced in compositional ratio "b" in the hydrogenated product of ring-opening metathesis polymer of formula (I) are given below.
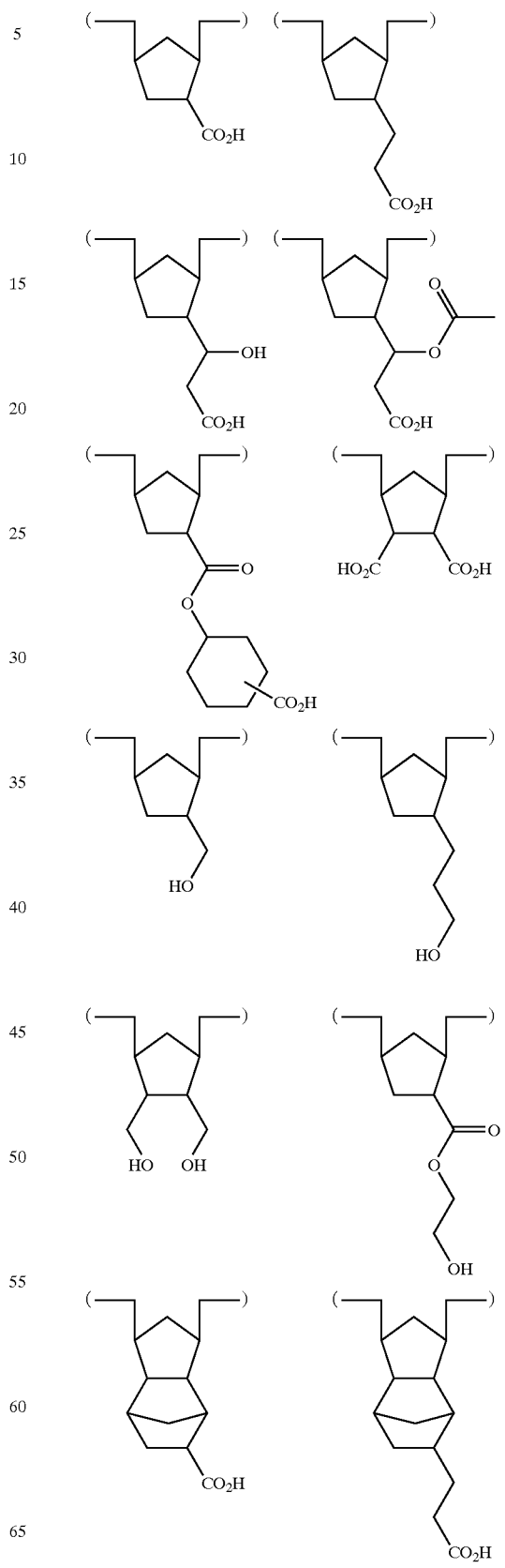

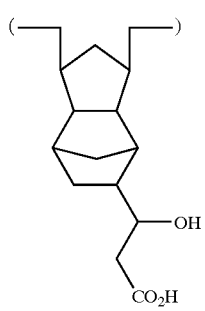 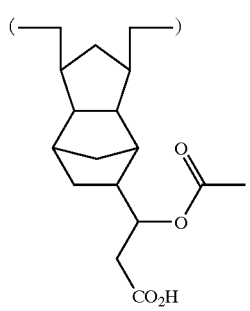
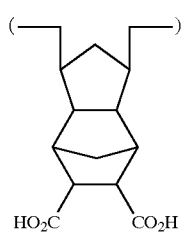 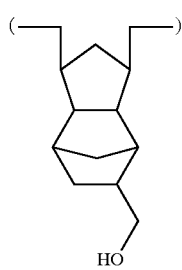
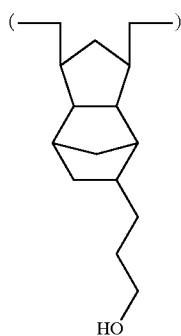 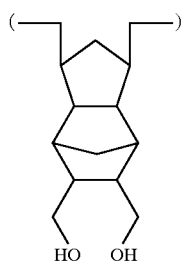
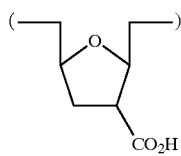 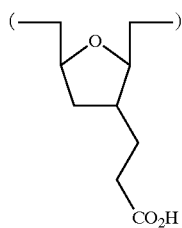
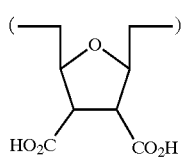 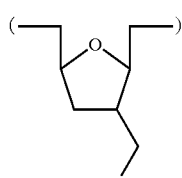
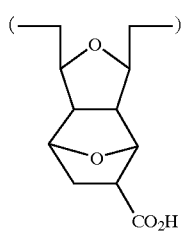 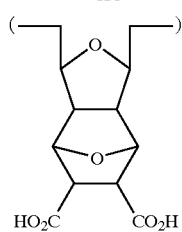
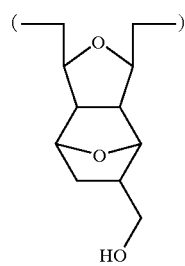
Illustrative, non-limiting, examples of the recurring units introduced in compositional ratio "c" in the hydrogenated product of ring-opening metathesis polymer of formula (I) are given below.
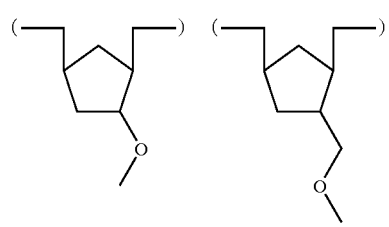
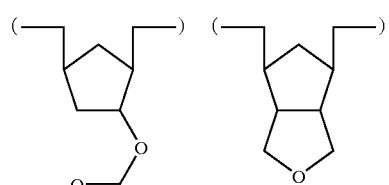
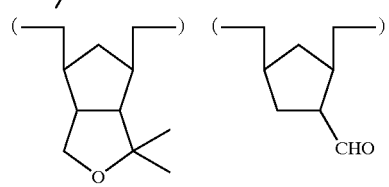
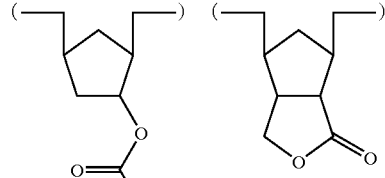
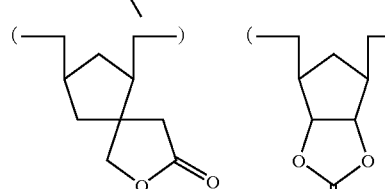
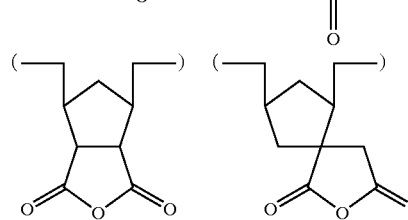

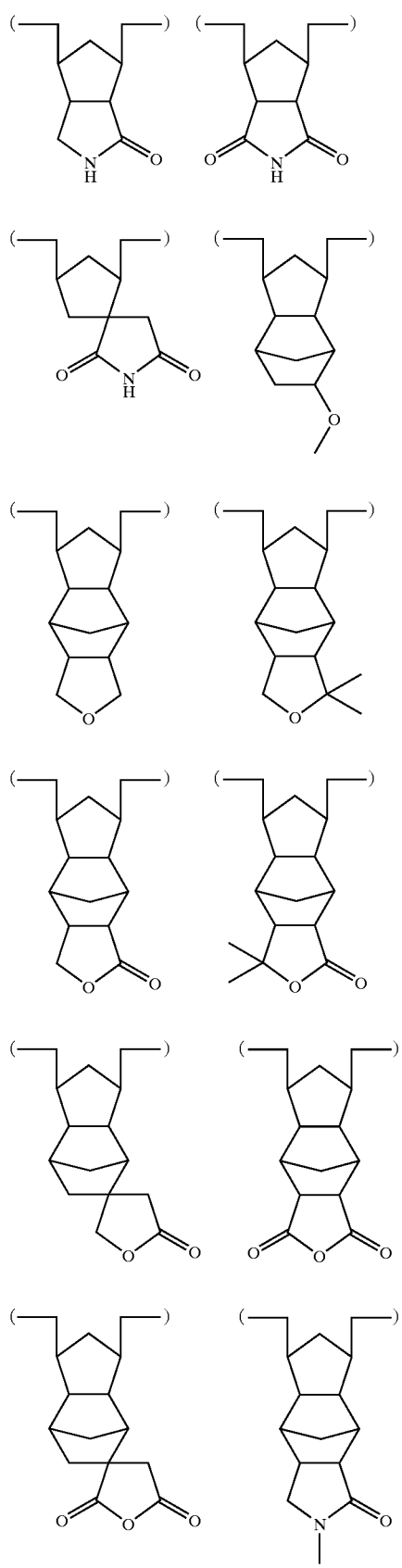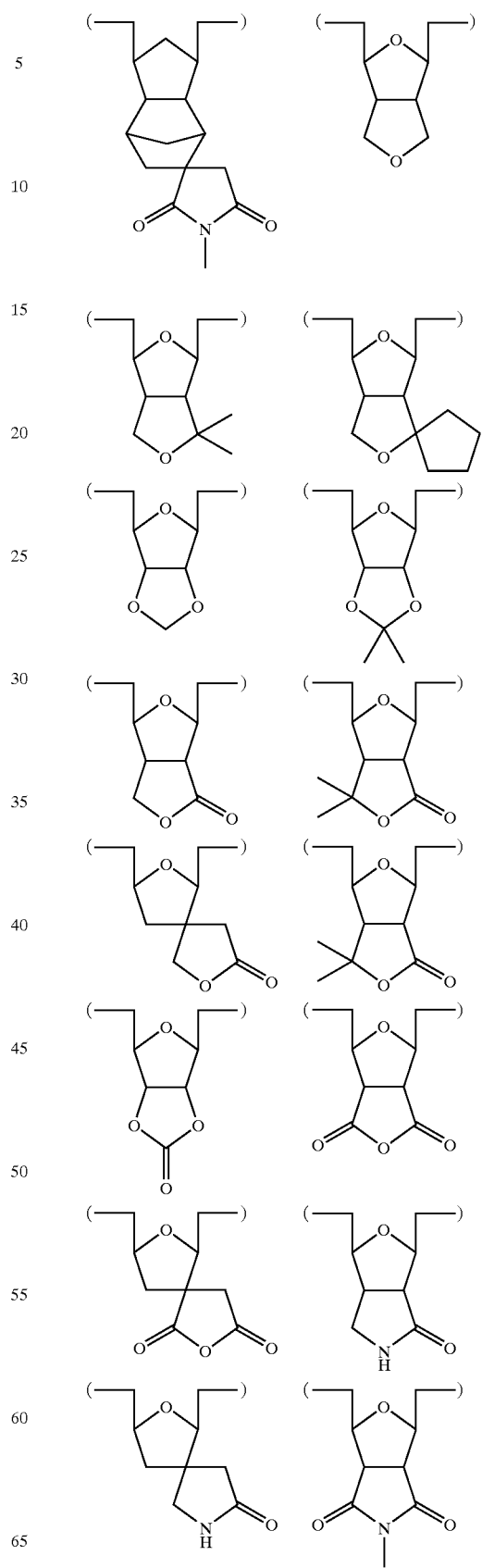

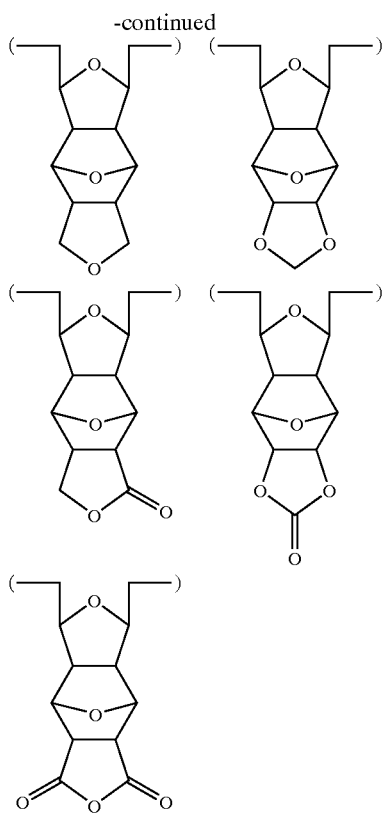

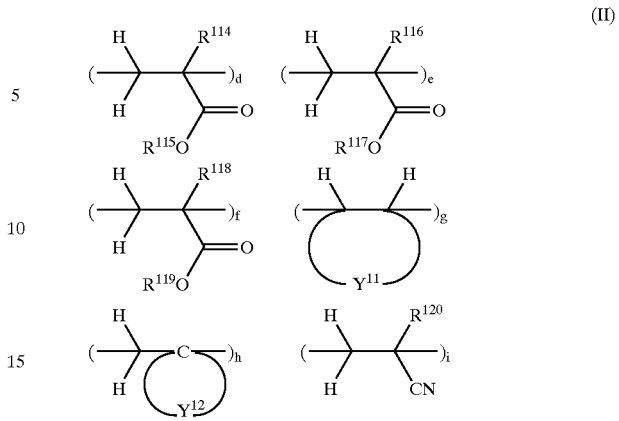

Herein, $R^{114}$, $R^{116}$, $R^{118}$ and $R^{120}$ each are independently hydrogen or methyl. $R^{115}$ is an acid labile group. $R^{117}$ is hydrogen or a monovalent hydrocarbon group of 1 to 15 carbon atoms containing a carboxyl or hydroxyl group. $R^{119}$ is a monovalent hydrocarbon group of 2 to 15 carbon atoms containing at least one partial structure selected from among ether, aldehyde, ketone, ester, carbonate, acid anhydride, amide and imide. $Y^{11}$ is a group of atoms forming a 5- or 6-membered ring with the two carbon atoms to which it is attached, the ring containing at least one partial structure selected from among ester, carbonate, acid anhydride, amide and imide. $Y^{12}$ is a group of atoms forming a 5- or 6-membered ring with the carbon atom to which it is attached, the ring containing at least one partial structure selected from among ester, carbonate, acid anhydride, amide and imide. The letters d, e, f, g, h and i representative of compositional ratios of the corresponding recurring units are such numbers that d is from more than 0 to less than 1, each of e, f, g, h and i is from 0 to less than 1, satisfying d+e+f+g+h+i=1. The recurring units introduced in the respective compositional ratios d, e, f, g, h and i each may be of one or more types.

More particularly, $R^{114}$, $R^{116}$, $R^{118}$ and $R^{120}$ each are independently hydrogen or methyl. $R^{115}$ is an acid labile group as exemplified above for $R^{104}$ or $R^{AL}$, $R^{117}$ is hydrogen or a monovalent hydrocarbon group of 1 to 15 carbon atoms containing a carboxyl or hydroxyl group, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl.

$R^{119}$ is a monovalent hydrocarbon group of 2 to 15 carbon atoms containing at least one partial structure selected from among ether, aldehyde, ketone, ester, carbonate, acid anhydride, amide and imide, for example, such as methoxymethyl, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

$Y^{11}$ is a group of atoms forming a 5- or 6-membered ring with the two carbon atoms to which it is attached, which ring contains at least one partial structure selected from among ester, carbonate, acid anhydride, amide and imide, for example, such as 1-oxo-2-oxapropane-1,3-diyl, 1-oxo-2-oxabutane-1,4-diyl, 2-oxo-1,3-dioxapropane-1,3-diyl, 1,3-dioxo-2-oxapropane-1,3-diyl, 1-oxo-2-azapropane-1,3-diyl, 1-oxo-2-methyl-2-azapropane-1,3-diyl, 1-oxo-2-azabutane-1,4-diyl, 1,3-dioxo-2-azapropane-1,3-diyl, and 1,3-dioxo-2-methyl-2-azapropane-1,3-diyl, $Y^{12}$ is a group of atoms forming a 5- or 6-membered ring with the carbon atom to which it is attached, which ring contains at least one partial structure selected from among ester, carbonate, acid anhydride, amide and imide, for example, such as 1-oxo-2-oxabutane-1,4-diyl, 1-oxo-2-oxapentane-1,5-diyl, 1-oxo-2-azabutane-1,4-diyl, 1-oxo-2-methyl-2-azabutane-1,4-diyl, 1-oxo-2-azapentane-1,5-diyl, and 1-oxo-2-methyl-2-azapentane-1,5-diyl.

The letters d, e, f, 9, h and i representative of compositional ratios of the corresponding recurring units are such numbers that d is from more than 0 to less than 1, each of e, f, 9, h and i is from 0 to less than 1, satisfying d+e+f+g+h+i=1. The preferred ranges of d, e, f, g, h and i are:

$0.1 \leq d \leq 0.9$, $0 \leq e \leq 0.8$, $0 \leq f \leq 0.8$, $0 \leq g \leq 0.8$, $0 \leq h \leq 0.8$, and $0 \leq i \leq 0.8$, more preferably $0.2 \leq d \leq 0.8$, $0 \leq e \leq 0.7$, $0 \leq f \leq 0.7$, $0 \leq g \leq 0.7$, $0 \leq h \leq 0.7$, and $0 \leq i \leq 0.7$, and most preferably $0.3 \leq d \leq 0.7$, $0 \leq e \leq 0.6$, $0 \leq f \leq 0.6$, $0 \leq g \leq 0.6$, $0 \leq h \leq 0.6$, and $0 \leq i \leq 0.6$.

The recurring units introduced in the respective compositional ratios d, e, f, 9, h and i each may be of one or more types. As the compositional ratio of the respective recurring units changes, various properties including developer affinity, substrate adhesion and etch resistance change as well. Then a proper choice of d, e, f, g, h and i values allows for fine adjustment of the resist composition's performance.

The poly(meth)acrylic acid derivatives used in the resist composition of the invention preferably have a weight average molecular weight (Mw) of about 1,000 to 500,000, and preferably about 3,000 to 100,000, as measured by GPC relative to polystyrene. Outside the range, the etch resistance may become extremely low and the resolution may become low because a substantial difference in rate of dissolution before and after exposure is lost.

The poly(meth)acrylic acid derivatives used in the resist composition of the invention preferably have a polydispersity index Mw/Mn in a relatively narrow range of 1.0 to 3.0. Outside the range, a higher polydispersity index suggests a less uniformity of the polymer, leading to a reduction of imaging resolution and sometimes a lowering of etch resistance.

For the preparation of the poly(meth)acrylic acid derivatives used in the resist composition of the invention, the method used may be, for example, that of JP-A 2000-159758, but not limited thereto.

In the resist composition according to the second embodiment of the invention, the second hydrogenated product of ring-opening metathesis polymer and the poly(meth)acrylic acid derivative are preferably mixed in a weight ratio of from 90:10 to 10:90 and more preferably from 80:20 to 20:80. Outside the range, too lower a proportion of the hydrogenated product of ring-opening metathesis polymer may lead to lower etch resistance, whereas too lower a proportion of the poly(meth)acrylic acid derivative may fail, to achieve resolution enhancing effects.

Resist Composition

The resist composition comprising the hydrogenated ring-opening metathesis polymer of the specific structure according to the invention as the base resin is suited as a positive resist composition and especially as a chemically amplified positive resist composition. In addition to the hydrogenated ring-opening metathesis polymer, the resist composition further includes a photoacid generator, an organic solvent, and other optional components.

Photoacid Generator

The photoacid generator is a compound capable of generating an acid upon exposure to high energy radiation or electron beams and includes the following:
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail.
(i) Onium Salts of Formula (P1a-1), (P1a-2) or (P1b):

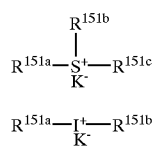

Herein, $R^{151a}$, $R^{151b}$, and $R^{151c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{151b}$ and $R^{151c}$, taken together, may form a ring. $R^{151b}$ and $R^{151c}$ each are alkylene groups of 1 to 6 carbon atoms when they form a ring. $K^-$ is a non-nucleophilic counter ion.

$R^{151a}$, $R^{151b}$, and $R^{151c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

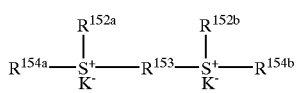

P1b

Herein, $R^{152a}$ and $R^{152b}$ independently represent straight, branched or cyclic alkyl groups of 1 to 8 carbon atoms. $R^{153}$ represents a straight, branched or cyclic alkylene group of 1 to 10 carbon atoms. $R^{154a}$ and $R^{154b}$ independently represent 2-oxoalkyl groups of 3 to 7 carbon atoms. $K^-$ is a non-nucleophilic counter ion.

Illustrative of the groups represented by $R^{152a}$ and $R^{152b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{153}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{154a}$ and $R^{154b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane Derivatives of Formula (P2)

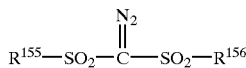

P2

Herein, $R^{155}$ and $R^{156}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{155}$ and $R^{156}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

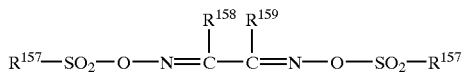

P3

Herein, $R^{157}$, $R^{158}$, and $R^{159}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{158}$ and $R^{159}$, taken together, may form a ring. $R^{158}$ and $R^{159}$ each are straight or branched alkylene groups of 1 to 6 carbon atoms when they form a ring.

Illustrative examples of the alkyl, halogenated alkyl, aryl, halogenated aryl, and aralkyl groups represented by $R^{157}$, $R^{158}$, and $R^{159}$ are the same as exemplified for $R^{155}$ and $R^{156}$. Examples of the alkylene groups represented by $R^{158}$ and $R^{159}$ include methylene, ethylene, propylene, butylene, and hexylene.

(iv) Bissulfone Derivatives of Formula (P4)

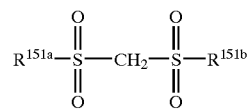

P4

Herein, $R^{151a}$ and $R^{151b}$ are as defined above.

(v) Sulfonic Acid Esters of N-Hydroxyimide Compounds of Formula (P5)

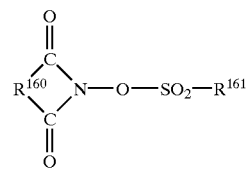

P5

Herein, $R^{160}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{161}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{160}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{161}$, exemplary alkyl groups are as exemplified for $R^{151a}$ to $R^{151c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium, p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylstilfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-O-dimethylglyoxime, and bis-O-(camphorsulfonyl)-Q-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene. 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide enzenesulfonate, N-hydroxysuccinimide 2,4,6-trimethylenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluencsulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyl- tetrahydrothiophenium triflate; diazomethane derivatives such as bis(benzenesulfonyl)diazomethane, bis (p-toluenesulfonyl)diazomethane, bis(cyclohexylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of 0.1 to 15 parts, and especially 0.5 to 8 parts by weight, per 100 parts by weight of the base resin (all parts are by weight, hereinafter). Less than 0.1 part of the photoacid generator would provide a poor sensitivity whereas more than 15 parts of the photoacid generator would adversely affect transparency and resolution.

Organic Solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether and 1-ethoxy-2-propanol because the photoacid generator is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

Other Polymer

To the resist composition of the invention, another polymer other than the hydrogenated product of ring-opening metathesis polymer and the poly(meth)acrylic acid derivative according to the preferred embodiment of the invention may also be added. The other polymers that can be added to the resist composition are, for example, those polymers comprising units of the following formula (R1) and/or (R2) and having a weight average molecular weight of about 1,000 to about 500,000, especially about 5,000 to about 100,000 although the other polymers are not limited thereto.

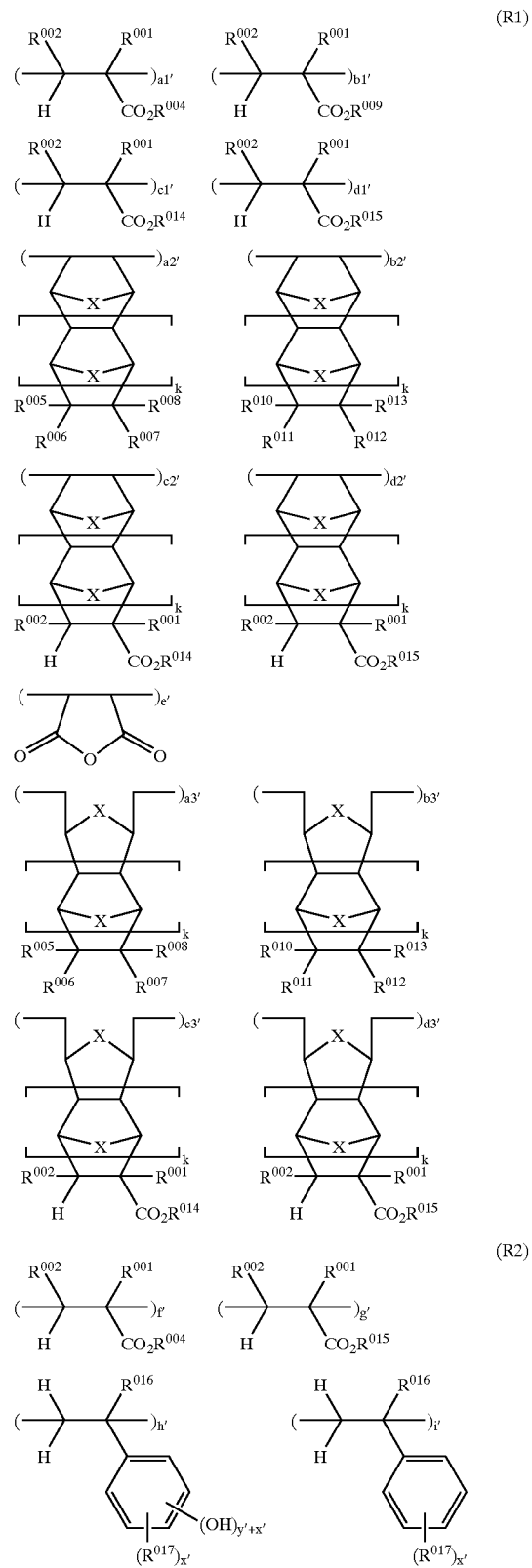

-continued

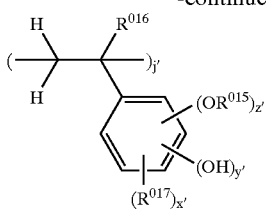

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic alkyl group of 1 to 15 carbon atoms. $R^{004}$ is hydrogen or a monovalent hydrocarbon group of 1 to 15 carbon atoms having a carboxyl or hydroxyl group. At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. $R^{009}$ is a monovalent hydrocarbon group of 2 to 15 carbon atoms containing at least one partial structure selected from among ether, aldehyde, ketone, ester, carbonate, acid anhydride, amide and imide. At least one of $R^{010}$ to $R^{013}$ is a monovalent hydrocarbon group of 2 to 15 carbon atoms containing at least one partial structure selected from among ether, aldehyde, ketone, ester, carbonate, acid anhydride, amide and imide, while the remaining R's are independently hydrogen or straight, branched or cyclic alkyl groups of 1 to 15 carbon atoms. $R^{010}$ to $R^{013}$, taken together, may form a ring, and in that event, at least one of $R^{010}$ to $R^{013}$ is a divalent hydrocarbon group of 1 to 15 carbon atoms containing at least one partial structure selected from among ether, aldehyde, ketone, ester, carbonate, acid anhydride, amide and imide, while the remaining R's are independently single bonds or straight, branched or cyclic alkylene groups of 1 to 15 carbon atoms. $R^{014}$ is a polycyclic hydrocarbon group having 7 to 15 carbon atoms or an alkyl group containing a polycyclic hydrocarbon group. $R^{015}$ is an acid labile group. $R^{016}$ is hydrogen or methyl. $R^{017}$ is a straight, branched or cyclic alkyl group of 1 to 8 carbon atoms. X is $CH_2$ or an oxygen atom. Letter k' is equal to 0 or 1; a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1; x', y' and z' each are an integer of 0 to 3, satisfying $1 \leq x'+y'+z' \leq 5$ and $1 \leq y'+z' \leq 3$.

Exemplary groups of these R's are as exemplified above.

The other polymer is added for the purpose of fine adjustment of resist performance. It is recommended to add a small amount of the other polymer in order that the advantages of the invention be not compromised. Specifically, the inventive base resin (the hydrogenated product of ring-opening metathesis polymer plus the poly(meth)acrylic acid derivative) and the other polymer are blended in a weight ratio from 100:0 to 70:30, more preferably from 100:0 to 80:20. If the other polymer is blended too much beyond this range, the resist composition would lose some of the desired properties such as by giving rise to phase separation during film formation and partial film stripping during pattern formation.

The other polymer is not limited to one type and a mixture of two or more other polymers may be added. The use of plural polymers allows for adjustment of resist properties.

Dissolution Regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

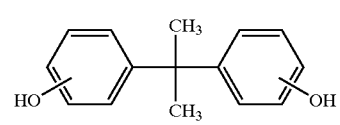

D1

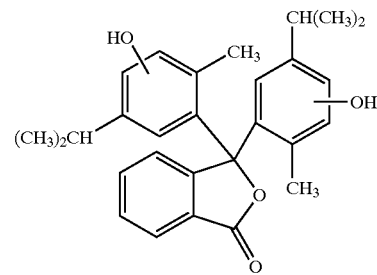

D2

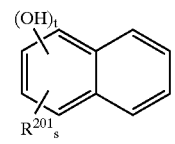

D3

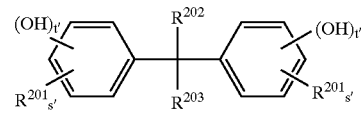

D4

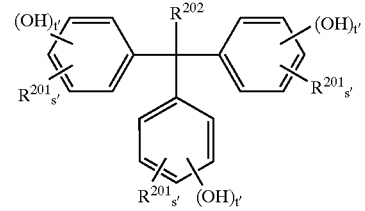

D5

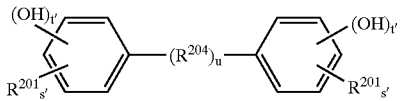

D6

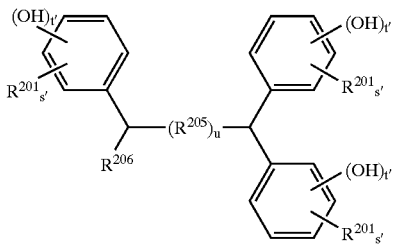

D7

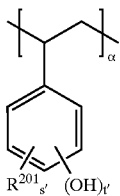

D8

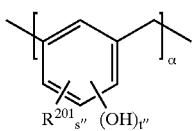

D9

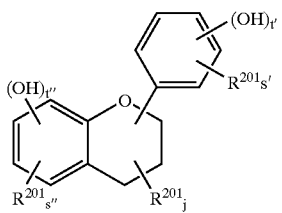

D10

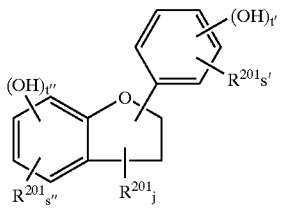

D11

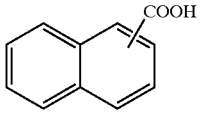

D12

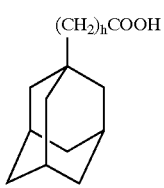

D13

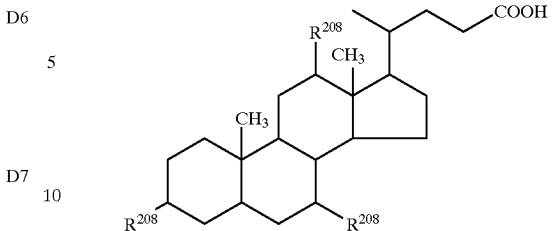

D14

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or $-(R^{207})_h-COOH$; $R^{204}$ is $-(CH_2)_i-$ (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 or 1; S, t, s', t', s", and t" are each numbers which satisfy s+t=8, s'+t' 5, and s"+t"=4, and are such that each phenyl skeleton has at least one hydroxyl group; and a is a number such that the compounds of formula (D8) or (D9) have a molecular weight of from 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as $-COOH$ and $-CH_2COOH$; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxyl-substituted phenyl or naphthyl.

Exemplary acid labile groups on the dissolution regulator include groups of the following general formulae (L1) to (L4), tertiary alkyl groups of 4 to 20 carbon atoms, trialkyl-silyl groups in which each of the alkyls has 1 to 6 carbon atoms, and oxoalkyl groups of 4 to 20 carbon atoms.

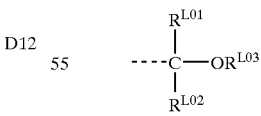

(L1)

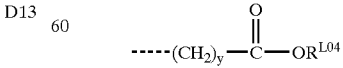

(L2)

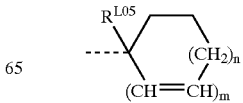

(L3)

-continued

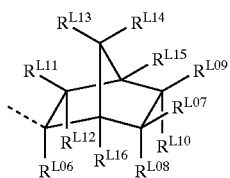

(L4)

In these formulas, $R^{L01}$ and $R^{L02}$ are each hydrogen or a straight, branched or cyclic alkyl having 1 to 18 carbon atoms; and $R^{L03}$ is a monovalent hydrocarbon group of 1 to 18 carbon atoms which may contain a heteroatom (e.g., oxygen). A pair of $R^{L01}$ and $R^{L02}$, a pair of $R^{L01}$ and $R^{L03}$, or a pair of $R^{L02}$ and $R^{L03}$ may together form a ring, with the proviso that $R^{L01}$, $R^{L02}$, and $R^{L03}$ are each a straight or branched alkylene of 1 to 18 carbon atoms when they form a ring. $R^{L04}$ is a tertiary alkyl group of 4 to 20 carbon atoms, a trialkysilyl group in which each of the alkyls has 1 to 6 carbon atoms, an oxoalkyl group of 4 to 20 carbon atoms, or a group of the formula (L1). $R^{L05}$ is a monovalent hydrocarbon group of 1 to 8 carbon atoms which may contain a hetero atom or a substituted or unsubstituted aryl group of 6 to 20 carbon atoms. $R^{L06}$ is a monovalent hydrocarbon groups of 1 to 8 carbon atoms which may contain a hetero atom or a substituted or unsubstituted aryl group of 6 to 20 carbon atoms. $R^{L07}$ to $R^{L16}$ independently represent hydrogen or monovalent hydrocarbon groups of 4 to 15 carbon atoms which may contain a hetero atom. Alternatively, $R^{L07}$ to $R^{L16}$, taken together, may form a ring. Each of $R^{L07}$ to $R^{L16}$ represents a divalent $C_1$–$C_{15}$ hydrocarbon group which may contain a hetero atom, when they form a ring. Two of $R^{L07}$ to $R^{L16}$ which are attached to adjoining carbon atoms may bond together directly to form a double bond. Letter y is an integer of 0 to 6. Letter m is equal to 0 or 1, n is equal to 0, 1, 2 or 3, and 2 m+n is equal to 2 or 3. Illustrative examples of these groups are as previously exemplified.

The dissolution regulator may be formulated in an amount of 0 to 50 parts, preferably 0 to 40 parts, and more preferably 0 to 30 parts, per 100 parts of the base resin, and may be used singly or as a mixture of two or more thereof. The use of more than 50 parts would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Basic Compound

In the resist composition of the invention, a basic compound may be blended. A suitable basic compound used herein is a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-isopropylamine, di-n-butylamine, di-iso-butylamine, di-secbutylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline. 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B1) may also be included alone or in admixture.

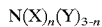
N(X)$_n$(Y)$_{3-n}$  B1

In the formula, n is equal to 1, 2 or 3; Y is independently hydrogen or a straight, branched or cyclic alkyl group of 1 to 20 carbon atoms which may contain a hydroxyl group or ether; and X is independently selected from groups of the following general formulas (X1) to (X3), and two or three X's may bond together to form a ring.

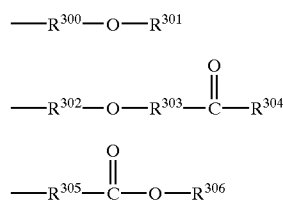

In the formulas, $R^{300}$, $R^{302}$ and $R^{305}$ are independently straight or branched alkylene groups of 1 to 4 carbon atoms; $R^{301}$, $R^{304}$ and $R^{306}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms.

Illustrative examples of the basic compounds of formula (B1) include tris(2-methoxymethoxyethyl)amine, tris(2-(methoxyethoxy)ethyl)amine, tris(2-(2-methoxyethoxy-methoxy)ethyl)amine, tris(2-(1-methoxyethoxy)ethyl)amine, tris{2-(1-ethoxyethoxy)ethyl}amine, tris{(2-(1-ethoxypropoxy)ethyl}amine, tris{2-(2-(2-hydroxyethoxy)ethoxy)ethyl}amine, 4,7,13,16,21,24-hexaoxa-1,10-diazabicyclo-[8.8.8]hexacosane, 4,7,13,18-tetraoxa-1,10-diazabicyclo-[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethylbis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-b-valerolactone.

Also useful are one or more of cyclic structure-bearing basic compounds having the following general formula (B2).

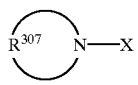
B2

Herein X is as defined above, and $R^{307}$ is a straight or branched alkylene group of 2 to 20 carbon atoms which may contain one or more carbonyl groups, ether structures, ester structures or sulfide structures.

Illustrative examples of the cyclic structure-bearing basic compounds having formula (B2) include 1-[2-(methoxymethoxy)ethyl]pyrrolidine, 1-[2-(methoxymethoxy)ethyl]-piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]-morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B3) to (B6) may be blended.

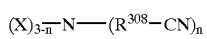
B3

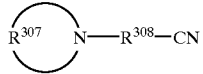
B4

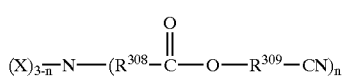
B5

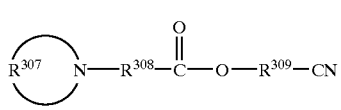
B6

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds having formulae (B3) to (B6) include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-meth oxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethyl)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl) aminoacetonitrile. N,N-bis(2-acetoxyethyl) aminoacetonitrile, N,N-bis(2-formyloxyethyl) aminoacetonitrile, N,N-bis(2-methoxyethyl) aminoacetonitrile, N,N-bis[2-(methoxymethoxy)ethyl] aminoacetonitrile, methyl N-cyanomethyl-N-(2-methoxyethyl)-3-aminopripionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl] aminoacetonitrile. N-cyanomethyl-N-(3-hydroxy-1-propyl) aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably formulated in an amount of 0.001 to 10 parts, and especially 0.01 to 1 part, per part of the photoacid generator. Less than 0.001 part of the basic compound may fail to achieve the desired effects thereof, while the use of more than 10 parts would result in too low a sensitivity and resolution.

Other Components

In the resist composition, a compound bearing a ≡C—COOH group in a molecule may be blended. Exemplary, non-limiting compounds bearing a ≡C—COOH group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced with —R$^{401}$—COOH (wherein R$^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

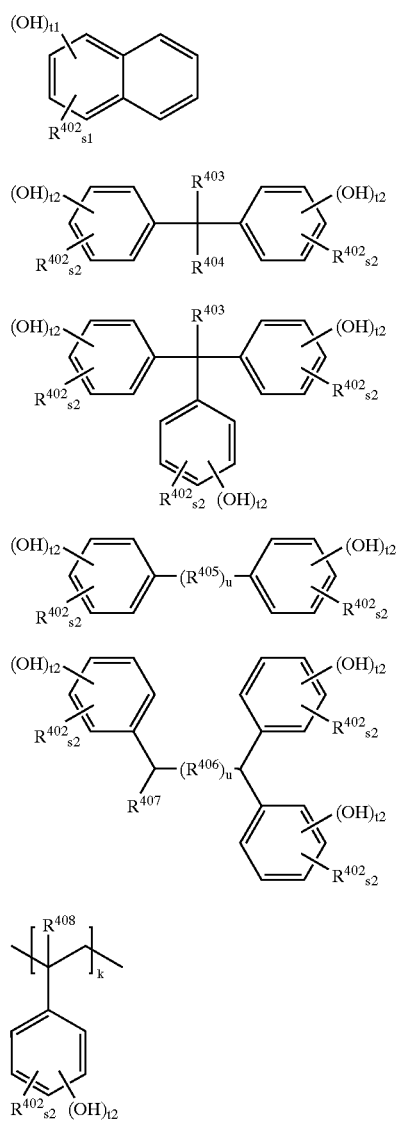

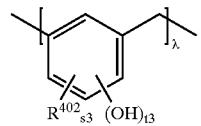

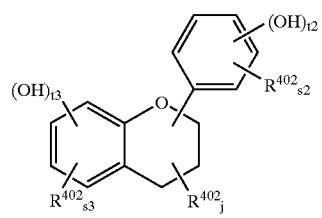

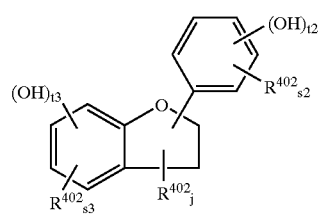

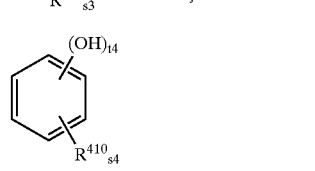

In these formulas, R$^{408}$ is hydrogen or methyl; R$^{402}$ and R$^{403}$ are each hydrogen or a straight or branched alkyl or alkenyl of 1 to 8 carbon atoms; R$^{404}$ is hydrogen, a straight or branched alkyl or alkenyl of 1 to 8 carbon atoms, or a —(R$^{409}$)$_h$—COOR' group (R' being hydrogen or —R$^{409}$—COOH); R$^{405}$ is —(CH$_2$)$_i$— (wherein i is 2 to 10), an arylene of 6 to 10 carbon atoms, carbonyl, sulfonyl, an oxygen atom, or a sulfur atom; R$^{406}$ is an alkylene of 1 to 10 carbon atoms, an arylene of 6 to 10 carbon atoms, carbonyl, sulfonyl, an oxygen atom, or a sulfur atom; R$^{407}$ is hydrogen, a straight or branched alkyl or alkenyl of 1 to 8 carbon atoms, or a hydroxyl-substituted phenyl or naphthyl; R$^{409}$ is a straight or branched alkylene of 1 to 10 carbon atoms; R$^{410}$ is hydrogen, a straight or branched alkyl or alkenyl of 1 to 8 carbon atoms, or a —R$^{411}$—COOH group; R$^{411}$ is a straight or branched alkylene of 1 to 10 carbon atoms; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

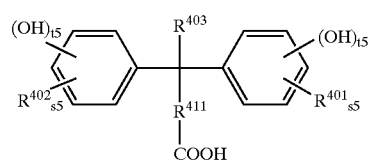

-continued
A12
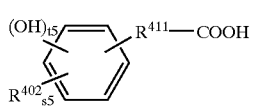
A13
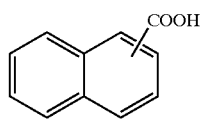
A14
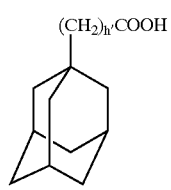
A15
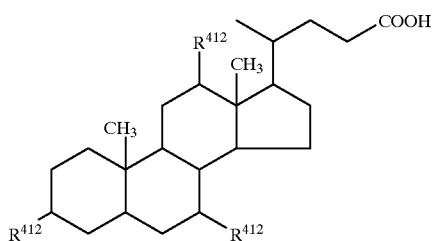
In these formulas, $R^{402}$, $R^{403}$, and $R^{411}$ are as defined above; $R^{412}$ is hydrogen or hydroxyl; s5 and t5 are numbers which satisfy $s5 \geq 0$, $t5 \geq 0$, and $s5+t5=5$; and h' is equal to 0 or 1.
Illustrative, non-limiting examples of the compound bearing a ≡C—COOH group include compounds of the general formulas AI-1 to AI-14 and AII-1 to AII-10 below.
AI-1
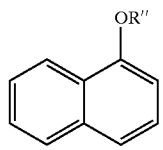
AI-2
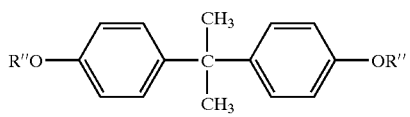
AI-3
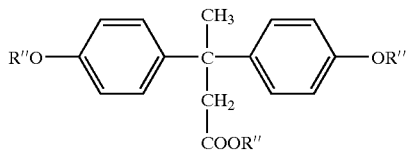
AI-4
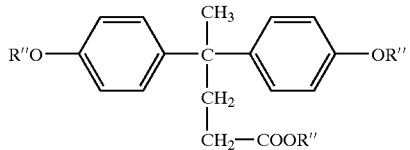
AI-5
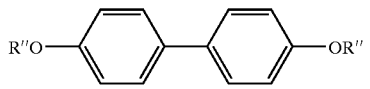
AI-6
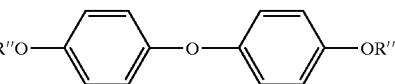
AI-7
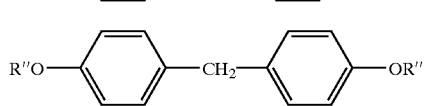
AI-8
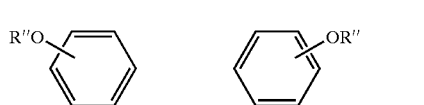
AI-9
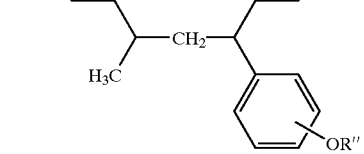
AI-10
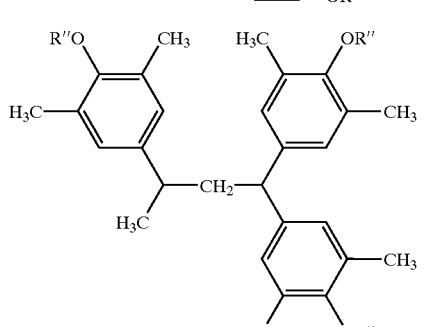
AI-11
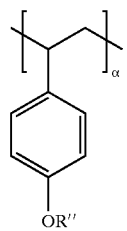
AI-12
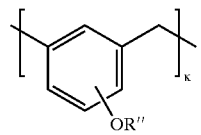
AI-13
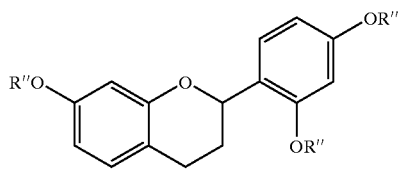
AI-14
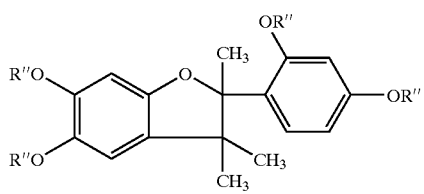

In the above formulas, R" is hydrogen or a CH₂COOH group such that the CH₂COOH group accounts for 10 to 100 mol % of R" in each compound, α and κ are as defined above.

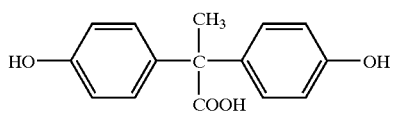
AII-1

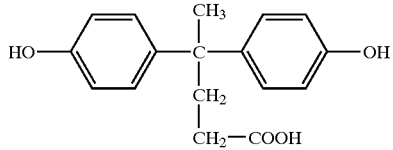
AII-2

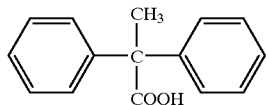
AII-3

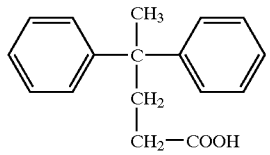
AII-4

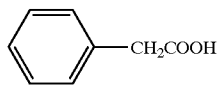
AII-5

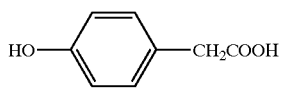
AII-6

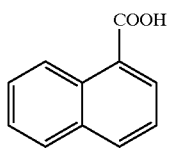
AII-7

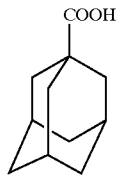
AII-8

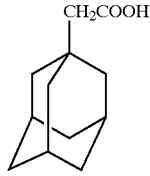
AII-9

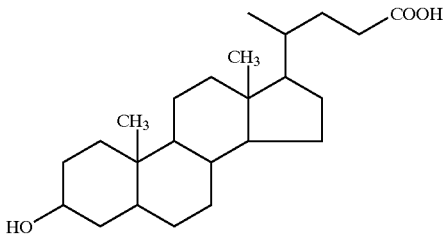
AII-10

The compound bearing a ≡C—COOH group within the molecule may be used singly or as combinations of two or more thereof.

The compound bearing a ≡C—COOH group within the molecule is added in an amount ranging from 0 to 5 parts, preferably 0.1 to 5 parts, more preferably 0.1 to 3 parts, further preferably 0.1 to 2 parts, per 100 parts of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below.

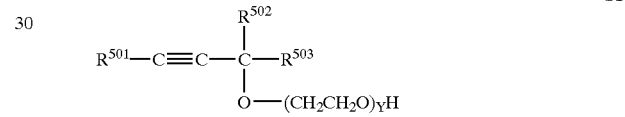
S1

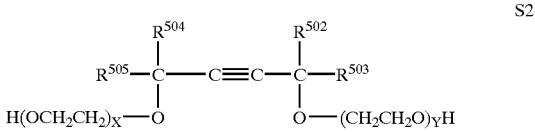
S2

In the formulas, $R^{501}$, $R^{502}$, $R^{503}$, $R^{504}$, and $R^{505}$ are each hydrogen or a straight, branched, or cyclic alkyl of 1 to 8 carbon atoms; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nissin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Florade FC-430 and FC-431 from Sumitomo 3M, Ltd., Surflon S-141 and S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Florade FC-430 from Sumitomo 3M, Ltd., KH-20 and KH-30 from Asahi Glass Co., Ltd., and X-70-093 from Shin-Etsu Chemical Co., Ltd.

According to the present invention, using the above-described resist composition, a resist pattern is formed by a process comprising:

(a) the first step of applying a resist composition onto a substrate to form a resist film thereon, the resist composition comprising a hydrogenated ring-opening metathesis polymer or a mixture thereof with a poly(meth)acrylic acid derivative as a base resin and a photoacid generator capable of generating acid upon exposure to radiation, (b) the second step of prebaking the resist film, (c) the third step of exposing the prebaked resist film to a pattern of radiation, (d) the fourth step of post-exposure baking the exposed resist film, (e) the fifth step of developing the post-exposure baked resist film to form a resist pattern, and (f) the sixth step of post baking the resist pattern for causing thermal flow thereto.

The first to fifth steps may be carried out by a known lithographic technique. For example, the resist composition is applied onto a substrate such as a silicon wafer by spin coating or the like to form a resist film having a thickness of 0.2 to 2.0 $\mu$m, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm$^2$, and preferably about 5 to 100 mJ/cm$^2$, then post-exposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 248 to 193 nm, an excimer laser, x-rays, or an electron beam. The desired pattern may not be obtainable outside the upper and lower limits of the above range.

Following the resist pattern formation, thermal flow is induced by the following technique. Any desired heater such as a hot plate or oven may be used as long as it can heat the resist pattern. The heater may be either of contact type or non-contact type. By reason of temperature uniformity, a hot plate of non-contact type is preferred. The heating temperature is preferably in the range of 100 to 220° C. at which thermal flow takes place on the resist film, and more preferably in the range of 130 to 180° C., within which the hot plate can readily control the temperature constant. No thermal flow may occur at temperatures below 100° C. Temperatures above 220° C. are undesirable by reason is of excessive thermal flow or more thermal decomposition of the photoacid generator and the polymer, and the difficulty of thermal flow control. The heating time is preferably from 30 seconds to 10 minutes, and more preferably from 45 seconds to 120 seconds from the throughput standpoint. The heating method may be a single stage of heating or multiple stages (two or more stages) of heating. The single stage of heating is to achieve the desired hole size by a single step of thermal flow. The multiple stages of heating are to gradually approach to the desired hole size by repeating thermal flow steps.

EXAMPLE

Examples are given below by way of illustration and not by way of limitation. The abbreviation SEM is a scanning electron microscope, and Mw is a weight average molecular weight as measured by GPC using a polystyrene standard.

Examples 1–2 & Comparative Examples 1–2

Resist compositions were prepared according to the formulation shown in Table 1 and filtered through a Teflon® filter having a pore diameter of 0.2 $\mu$m, thereby giving resist solutions. The solvent used herein contained 0.05% by weight of a surfactant KH-20 (Asahi Glass Co., Ltd.). These resist solutions were spin-coated onto silicon wafers having an organic anti-reflection film (ARC19 by Shipley, 82 nm) coated thereon, forming coatings of 0.4 $\mu$m thick. The coated silicon wafers were prebaked (PB) for 60 seconds on a hot plate at a temperature adjusted so as to provide an optimum pattern. The resist films were exposed using an ArF excimer laser stepper (Nikon Corporation; NA 0.55), then baked (PEB) for 60 seconds at a temperature adjusted so as to provide an optimum pattern, and developed with an aqueous solution of 2.38% tetramethylammonium hydroxide, thereby giving positive patterns.

The resist compositions were examined by the following tests. The sensitivity was the exposure dose (mJ/cm$^2$) at which contact holes with a diameter of 200 nm spaced at a pitch of 500 nm were resolvable. This resist was then baked at 150° C. for 90 seconds, after which the diameter of contact holes was measured using SEM. A diameter (nm) of contact holes after 150° C. baking which is closer to the target size (160 nm) is better.

The etching rate of the resist film was determined by etching the film under oxide film etching conditions (specified below) using CHF$_3$/CF$_4$ gas, and measuring a slimming of the film in unexposed area. The etching rate is expressed relative to an etching rate of 1 for KrF resist SEPR-430S (Shin-Etsu Chemical Co., Ltd.), with a smaller value of etching rate being better. The surface roughness Rms (nm) of the resist film as etched was determined using an atomic force microscope (AFM). A smaller value of Rms is better.

The composition and test results of the resist materials are shown in Tables 1 and 2. The structure of the resins used is identified below together with their Mw.

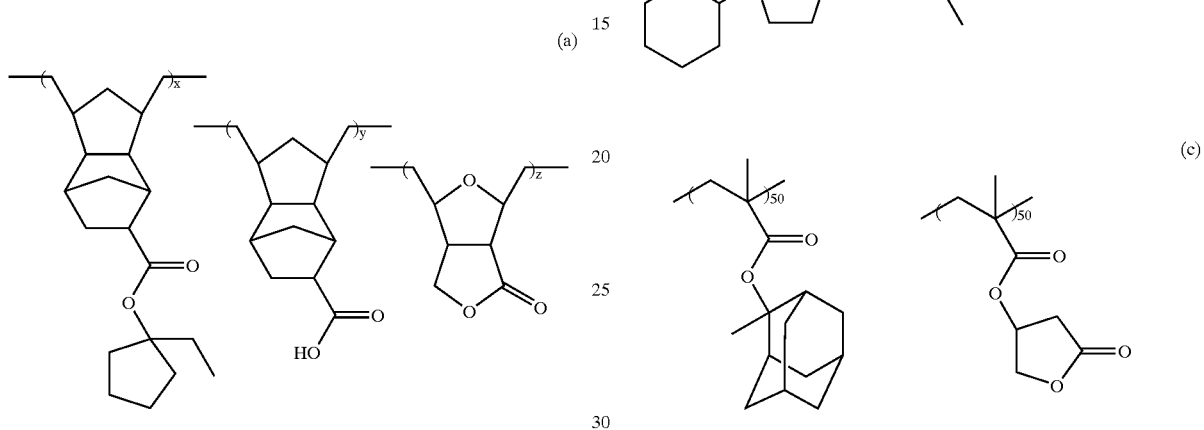

TABLE 1

|  | Resin | x/y/z | Mw | Mw/Mn | Photoacid generator | Basic compound | Solvent |
| --- | --- | --- | --- | --- | --- | --- | --- |
| Example 1 | formula (a)-1 (80) | 35/19/46 | 14000 | 1.5 | PAG1 (1) | TMMEA (0.12) | PG/BL (550) |
| Example 2 | formula (a)-2 (80) | 35/15/50 | 14000 | 1.5 | PAG1 (1) | TMMEA (0.12) | PG/BL (550) |
| Comparative Example 1 | formula (b) (80) | — | 7000 | 1.8 | PAG1 (1) | TMMEA (0.12) | PG/BL (550) |
| Comparative Example 2 | formula (c) (80) | — | 12000 | 1.5 | PAG1 (1) | TMMEA (0.12) | PG/BL (550) |

PG/BL: a solvent mixture of 90 wt % propylene glycol methyl ether acetate and 10 wt % γ-butyrolactone
PAG1: triphenylsulfonium nonafluorobutylsulfonate
TMMEA: tris(2-methoxymethoxyethyl)amine In the Table, the figure in parentheses represents an addition amount in parts by weight.

TABLE 2

|  | PB (° C.) | PEB (° C.) | Sensitivity (mJ/cm$^2$) | Diameter of contact hole after 150° C. baking (nm) | Etching rate | Rms (nm) |
| --- | --- | --- | --- | --- | --- | --- |
| Example 1 | 100 | 110 | 56 | 162 | 0.98 | 1.1 |
| Example 2 | 100 | 110 | 58 | 158 | 0.98 | 1.1 |
| Comparative Example 1 | 130 | 110 | 55 | 199 | 1.05 | 1.6 |
| Comparative Example 2 | 130 | 130 | 62 | 173 | 1.33 | 16.0 |

Examples 3–10 & Comparative Examples 3–5

Resist compositions were prepared according to the formulation shown in Table 3 and filtered through a Teflon® filter having a pore diameter of 0.2 μm, thereby giving resist solutions. The solvent used herein contained 0.05% by weight of a surfactant KH-20 (Asahi Glass Co., Ltd.). These resist solutions were spin-coated onto silicon wafers having an organic anti-reflection film (ARC19 by Shipley, 82 nm) coated thereon, forming coatings of 0.4 μm thick. The coated silicon wafers were prebaked (PB) for 60 seconds on a hot plate at a temperature adjusted so as to provide an optimum pattern. The resist films were exposed using an ArF excimer laser stepper (Nikon Corporation; NA 0.55), then baked (PEB) for 60 seconds at a temperature adjusted so as to provide an optimum pattern, and developed with an aqueous solution of 2.38% tetramethylammonium hydroxide, thereby giving positive patterns.

The resist compositions were examined by the following tests. The sensitivity is the exposure dose (mJ/cm$^2$) at which contact holes with a diameter of 200 nm spaced at a pitch of 500 nm and 1200 nm were resolvable. This resist was then baked at 145° C. for 90 seconds, after which the diameter of contact holes spaced at a pitch of 500 nm and 1200 nm was measured using SEM. The difference in diameter between the different pitch contact holes is an index of pitch dependency. A sample in which the diameter (nm) of the different pitch contact holes after thermal flow is closer to 190 nm and the difference in diameter between the different pitch contact holes is smaller is considered better by reason of minimized pitch dependency on flow temperature.

The etching rate of the resist film was determined by etching the film under oxide film etching conditions (specified below) using CHF$_3$/CF$_4$ gas, and measuring a slimming of the film in unexposed area. The etching rate is expressed relative to an etching rate of 1 for KrF resist SEPR-430S (Shin-Etsu Chemical Co., Ltd.), with a smaller value of etching rate being better. The surface roughness Rms (nm) of the resist film as etched was determined using an atomic force microscope (AFM). A smaller value of Rms is better.

The composition and test results of the resist materials are shown in Tables 3 to 6. The structure of the resins used is identified below together with their Mw.

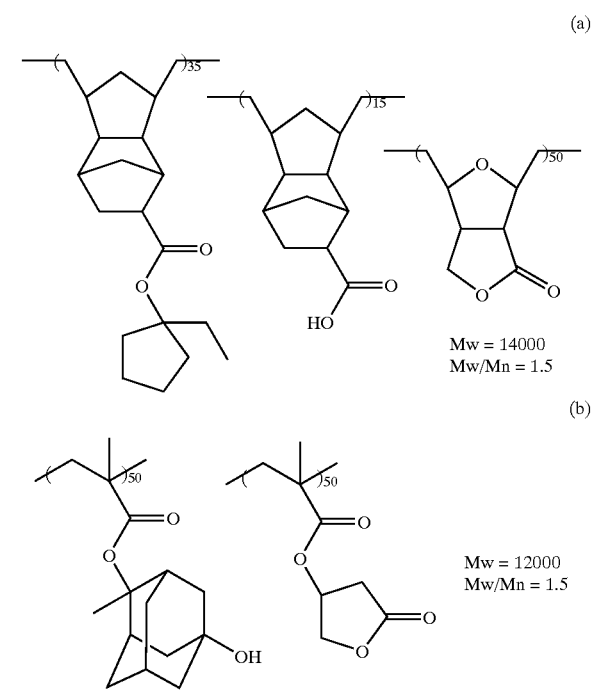

TABLE 3

|  | Resin 1 | Resin 2 | Photoacid generator | Basic compound | Solvent |
| --- | --- | --- | --- | --- | --- |
| Example 3 | formula (a) (64) | formula (b) (16) | PAG1 (1) | TMMEA (0.12) | PG/CyHo (550) |
| Example 4 | formula (a) (40) | formula (b) (40) | PAG1 (1) | TMMEA (0.12) | PG/CyHo (550) |
| Comparative Example 3 | formula (a) (80) | — | PAG1 (1) | TMMEA (0.12) | PG/CyHo (550) |
| Comparative Example 4 | formula (b) (80) | — | PAG1 (1) | TMMEA (0.12) | PG/CyHo (550) |

PG/CyHo: a solvent mixture of 70 wt % propylene glycol methyl ether acetate and 30 wt % cyclohexanone
PAG1: triphenylsulfonium nonafluorobutylsulfonate
TMMEA: tris(2-methoxymethoxyethyl)amine In the Table, the figure in parentheses represents an addition amount in parts by weight.

TABLE 4

|  | PB (°C.) | PEB (°C.) | Sensitivity (mJ/cm²) at pitch 500 nm/ 1200 nm | Diameter of contact hole at pitch 500 nm/ 1200 nm after 145° C. baking/ their difference (nm) | Etching rate | Rms (nm) |
|---|---|---|---|---|---|---|
| Example 3 | 100 | 110 | 56/67 | 193/189/4 | 1.02 | 1.9 |
| Example 4 | 100 | 110 | 56/63 | 192/189/3 | 1.07 | 5.9 |
| Comparative Example 3 | 100 | 110 | 56/72 | 190/169/31 | 0.98 | 1.1 |
| Comparative Example 4 | 130 | 130 | 40/45 | 200/200/0 (did not flow) | 1.33 | 16.0 |

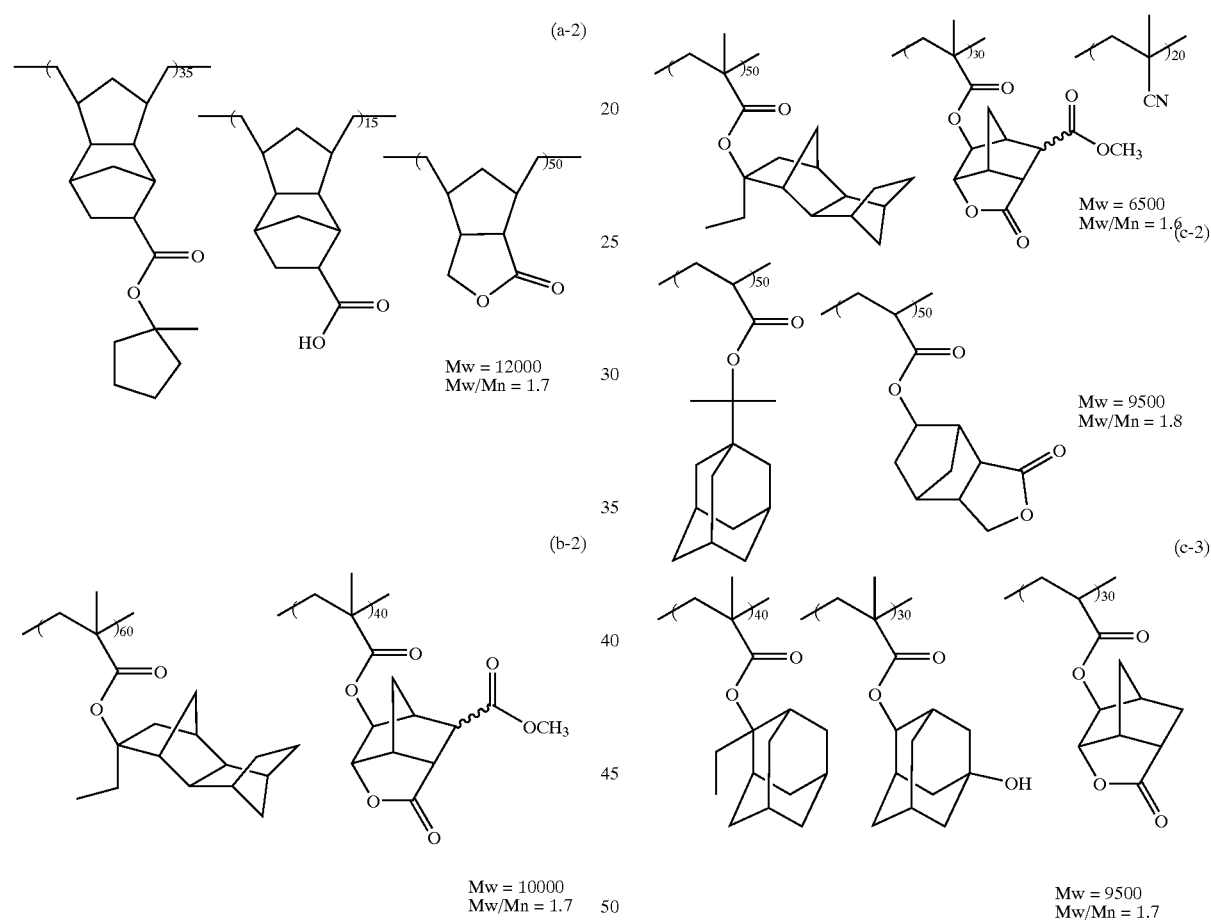

TABLE 5

|  | Resin 1 | Resin 2 | Photoacid generator | Basic compound | Solvent |
|---|---|---|---|---|---|
| Example 5 | formula (a) (40) | formula (b-2) (40) | PAG1 (1) | TMMEA (0.12) | PG/GBL (550) |
| Example 6 | formula (a) (40) | formula (b-3) (40) | PAG1 (1) | TMMEA (0.12) | PG/GBL (550) |
| Example 7 | formula (a) (40) | formula (c-2) (40) | PAG1 (1) | TMMEA (0.12) | PG/GBL (550) |
| Example 8 | formula (a) (40) | formula (c-3) (40) | PAG1 (1) | TMMEA (0.12) | PG/GBL (550) |
| Example 9 | formula (a-2) (40) | formula (b-2) (40) | PAG1 (1) | TMMEA (0.12) | PG/GBL (550) |

TABLE 5-continued

|  | Resin 1 | Resin 2 | Photoacid generator | Basic compound | Solvent |
|---|---|---|---|---|---|
| Example 10 | formula (a-2) (40) | formula (b-3) (40) | PAG1 (1) | TMMEA (0.12) | PG/GBL (550) |
| Comparative Example 5 | formula (c-3) (80) | — | PAG1 (1) | TMMEA (0.12) | PG/GBL (550) |

PG/GBL: a solvent mixture of 90 wt % propylene glycol methyl ether acetate and 10 wt % γ-butyrolactone
PAG1: triphenylsulfonium nonafluorobutylsulfonate
TMMEA: tris(2-methoxymethoxyethyl)amine In the Table, the figure in parentheses represents an addition amount in parts by weight.

TABLE 6

|  | PB (° C.) | PEB (° C.) | Sensitivity (mJ/cm$^2$) at pitch 500 nm/ 1200 nm | Diameter of contact hole at pitch 500 nm/ 1200 nm after 145° C. baking/ their difference (nm) | Etching rate | Rms (nm) |
|---|---|---|---|---|---|---|
| Example 5 | 130 | 100 | 52/58 | 191/185/6 | 0.95 | 5.5 |
| Example 6 | 130 | 100 | 58/64 | 191/188/3 | 0.94 | 5.4 |
| Example 7 | 130 | 100 | 55/71 | 185/160/25 | 0.94 | 4.4 |
| Example 8 | 130 | 100 | 56/73 | 188/169/19 | 0.93 | 4.4 |
| Example 9 | 130 | 110 | 52/57 | 192/188/4 | 0.94 | 5.4 |
| Example 10 | 130 | 110 | 58/63 | 193/189/4 | 0.94 | 5.3 |
| Comparative Example 5 | 110 | 110 | 50/60 | 120/71/49 | 1.10 | 7.2 |

It is seen that the invention is effective for improving the degree of integration of semiconductor LSI, that is, the fineness of microfabrication.

Japanese Patent Application Nos. 2001-213015, 2001-295653 and 2002-045588 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist patterning process, comprising:

(a) applying a resist composition onto a substrate to form a resist film thereon, said resist composition comprising a base resin in the form of a polymer or copolymer comprising structural units of the following general formula [I]:

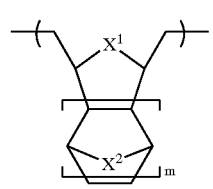

[I]

wherein $X^1$ and $X^2$ are independently selected from the group consisting of —O—, —S—, —NR—, —PR—, and —CR$_2$—, R is hydrogen or an alkyl group of 1 to 20 carbon atoms, and m is 0 or an integer of 1 to 3, in a backbone and partially having acid labile groups on side chains and a photoacid generator capable of generating acid upon exposure to radiation, (b) prebaking the resist film, (c) exposing the prebaked resist film to a pattern of radiation, (d) post-exposure baking the exposed resist film, (e) developing the post-exposure baked resist film to form a resist pattern, and (f) post baking the resist pattern for causing thermal flow thereto.

2. The resist patterning process of claim 1, wherein the base resin is a hydrogenated product of a ring-opening metathesis polymer comprising structural units [A] of the general formula [1], and structural units [B] of the general formula [3] and/or structural units [C] of the general formula [4]:

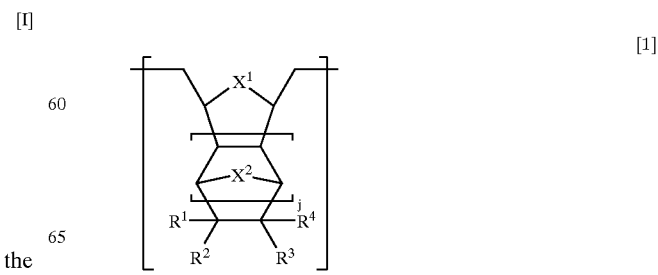

[1]

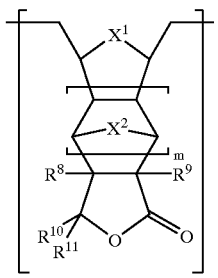

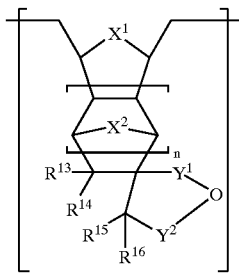

wherein at least one of $R^1$ to $R^4$ is a group having an acid labile group of the following general formula [2]:

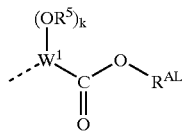

wherein the broken line denotes a free valence bond, $R^5$ is hydrogen, a straight, branched or cyclic alkyl group of 1 to 10 carbon atoms, a straight, branched or cyclic alkoxyalkyl group of 2 to 10 carbon atoms, or a straight, branched or cyclic acyl group of 1 to 10 carbon atoms, $W^1$ is a single bond or a (k+2)-valent hydrocarbon group of 1 to 10 carbon atoms, $R^{AL}$ is an acid labile group, and k is 0 or 1, the remainder of $R^1$ to $R^4$ is independently selected from the group consisting of hydrogen, a straight, branched or cyclic alkyl group of 1 to 20 carbon atoms, a halogen atom, a straight, branched or cyclic halo-alkyl group of 1 to 20 carbon atoms, a straight, branched or cyclic alkoxy group of 1 to 20 carbon atoms, a straight, branched or cyclic alkoxyalkyl group of 2 to 20 carbon atoms, a straight, branched or cyclic alkylcarbonyloxy group of 2 to 20 carbon atoms, an arylcarbonyloxy group of 7 to 20 carbon atoms, a straight, branched or cyclic alkylsulfonyloxy group of 1 to 20 carbon atoms, an arylsulfonyloxy group of 6 to 20 carbon atoms, a straight, branched or cyclic alkoxycarbonyl group of 2 to 20 carbon atoms, and a straight, branched or cyclic alkoxycarbonylalkyl group of 3 to 20 carbon atoms, $R^8$ to $R^{11}$ each are hydrogen or a straight, branched or cyclic alkyl group of 1 to 10 carbon atoms, $R^{13}$ to $R^{16}$ each are hydrogen or a straight, branched or cyclic alkyl group of 1 to 10 carbon atoms, one of $Y^1$ and $Y^2$ is —(C=O)— and the other is —$CR^{18}_2$— wherein $R^{18}$ is hydrogen or a straight or branched alkyl group of 1 to 10 carbon atoms, and j and n each are 0 or an integer of 1 to 3.

3. The resist patterning process according to claim 2, wherein $R^{AL}$ is a group of the formulae:

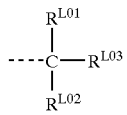

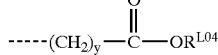

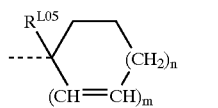

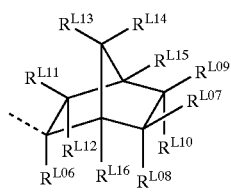

$R^{L01}$ and $R^{L02}$ are hydrogen or straight, branched or cyclic alkyl groups of 1–18 carbon atoms;

$R^{L03}$ is a monovalent hydrocarbon group of 1–18 carbon atoms, which may contain a hetero atom such as oxygen;

wherein a pair of $R^{L01}$ and $R^{L02}$, $R^{L01}$ and $R^{L03}$, or $R^{L02}$ and $R^{L03}$ may bond together to form a ring, wherein each of $R^{L01}$, $R^{L02}$ and $R^{L03}$ is a straight or branched alkylene group of 1–18 carbon atoms;

$R^{L04}$ is a tertiary alkyl group of 4–20 carbon atoms, a trialkylsilyl group in which each alkyl moiety has 1–6 carbon atoms, an oxoalkyl group of 4–20 carbon atoms, or a group of formula (L1);

letter y is an integer of 0–6;

$R^{L05}$ is a monovalent hydrocarbon group of 1–8 carbon atoms which may contain a hetero atom or a substituted or unsubstituted aryl group of 6–20 carbon atoms;

letter m is equal to 0 or 1, n is equal to 0, 1, 2 or 3, and 2 m+n is equal to 2 or 3;

$R^{L06}$ is a monovalent hydrocarbon group of 1–8 carbon atoms which may contain a hetero atom or a substituted or unsubstituted aryl group of 6–20 carbon atoms;

$R^{L07}$–$R^{L16}$, independently, are hydrogen or monovalent hydrocarbon groups of 1–15 carbon atoms which may contain a hetero atom, or $R^{L07}$–$R^{L16}$, taken together, form a ring where each of $R^{L07}$–$R^{L16}$ is a divalent $C_1$–$C_{15}$ hydrocarbon group which may contain a hetero atom;

or a tertiary alkyl group of 4–20 carbon atoms, a trialkylsilyl group wherein each alkyl moiety has 1–6 carbon atoms, or an oxoalkyl group of 4–20 carbon atoms.

4. The resist patterning process according to claim 2, wherein the remainder of $R^1$–$R^4$ is a halo-alkyl group of fluoromethyl, chloromethyl, bromomethyl, difluoromethyl, dichloromethyl, or dibromomethyl.

5. A resist patterning process, comprising:
(a) applying a resist composition onto a substrate to form a resist film thereon, said resist composition comprising a base resin in the form of a mixture of a hydrogenated product of a ring-opening metathesis polymer and a poly(meth)acrylic acid derivative and a photoacid generator capable of generating acid upon exposure to radiation, (b) prebaking the resist film,
(c) exposing the prebaked resist film to a pattern of radiation,
(d) post-exposure baking the exposed resist film,
(e) developing the post-exposure baked resist film to form a resist pattern, and
(f) post baking the resist pattern for causing thermal flow thereto.

6. The resist patterning process of claim 5, wherein the hydrogenated product of ring-opening metathesis polymer is a polymer comprising recurring units of the following general formula (I) and having a weight average molecular weight of 500 to 200,000,

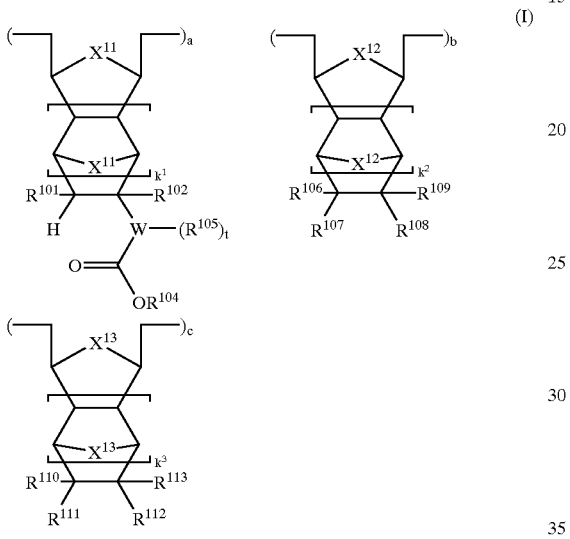

wherein $R^{101}$ is hydrogen, methyl or $CH_2CO_2R^{103}$;
$R^{102}$ is hydrogen, methyl or $CO_2R^{103}$;
$R^{103}$, which may be identical or different to $R^{101}$ and $R^{102}$, is a straight, branched or cyclic alkyl group of 1 to 15 carbon atoms;
$R^{104}$ is an acid labile group;
$R^{105}$ is a halogen atom, a hydroxyl group, a straight, branched or cyclic alkoxy, acyloxy or alkylsulfonyloxy group having 1 to 15 carbon atoms, or a straight, branched or cyclic alkoxycarbonyloxy or alkoxyalkoxy group having 2 to 15 carbon atoms, in which some or all of the hydrogen atoms on constituent carbon atoms may be substituted with halogen atoms;
at least one of $R^{106}$ to $R^{109}$ is a monovalent hydrocarbon group of 1 to 15 carbon atoms having a carboxyl or hydroxyl group while the remainder of $R^{106}$ to $R^{109}$ is, independently, hydrogen or straight, branched or cyclic alkyl groups of 1 to 15 carbon atoms, or a pair of $R^{106}$ and $R^{107}$, $R^{107}$ and $R^{108}$, or $R^{108}$ and $R^{109}$, taken together, may form a ring with the carbon atom or atoms to which they are bonded, and in that event, one of $R^{106}$ and $R^{107}$, $R^{107}$ and $R^{108}$, or $R^{108}$ and $R^{109}$ is a divalent hydrocarbon group of 1 to 15 carbon atoms having a carboxyl or hydroxyl group while the other is a single bond or a straight, branched or cyclic alkylene group of 1 to 15 carbon atoms;
at least one of $R^{110}$ to $R^{113}$ is a monovalent hydrocarbon group of 2 to 15 carbon atoms containing at least one partial structure of an ether, an aldehyde, a ketone, an ester, a carbonate, an acid anhydride, an amide or an imide while the remainder of $R^{110}$ to $R^{113}$ is, independently, hydrogen or straight, branched or cyclic alkyl groups of 1 to 15 carbon atoms, or a pair of $R^{110}$ and $R^{111}$, $R^{111}$ and $R^{112}$, or $R^{112}$ and $R^{113}$, taken together, may form a ring with the carbon atom or atoms to which they are bonded, and in that event, one of $R^{110}$ and $R^{111}$, $R^{111}$ and $R^{112}$, or $R^{112}$ and $R^{113}$ is a divalent hydrocarbon group of 1 to 15 carbon atoms containing at least one partial structure of an ether, an aldehyde, a ketone, an ester, a carbonate, an acid anhydride, an amide or an imide, while the other is a single bond or straight, branched or cyclic alkylene group of 1 to 15 carbon atoms;
$X^{11}$ to $X^{13}$ each are, independently, a methylene group or oxygen atom, with the proviso that all $X^{11}$ to $X^{13}$ are not methylene groups at the same time;
W is a single bond or a straight, branched or cyclic (t+2)-valent hydrocarbon group having 1 to 5 carbon atoms, in which at least one methylene group may be substituted with an oxygen atom to form a chain-like or cyclic ether or two hydrogen atoms on a common carbon may be substituted with an oxygen atom to form a ketone;
$k^1$ to $k^3$ each are independently 0 or 1, t is 0, 1 or 2, "a," "b" and "c" representative of compositional ratios of the corresponding recurring units are such numbers that $0<a<1$, $0 \leqq b<1$, $0 \leqq c<1$ and $a+b+c=1$, the recurring units introduced in the respective compositional ratios "a," "b" and "c" each may be of one or more types.

7. The resist patterning process according to claim 6, wherein $R^{104}$ is a group of the formulae:

 (L1)

 (L2)

 (L3)

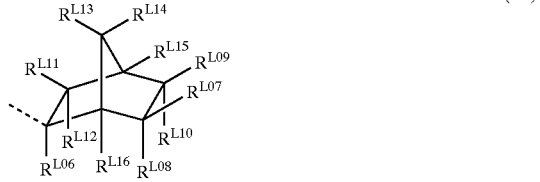 (L4)

$R^{L01}$ and $R^{L02}$ are hydrogen or straight, branched or cyclic alkyl groups of 1–18 carbon atoms;
$R^{L03}$ is a monovalent hydrocarbon group of 1–18 carbon atoms, which may contain a hetero atom such as oxygen;
wherein a pair of $R^{L01}$ and $R^{L02}$, $R^{L01}$ and $R^{L03}$, or $R^{L02}$ and $R^{L03}$ may bond together to form a ring, wherein each of $R^{L01}$, $R^{L02}$ and $R^{L03}$ is a straight or branched alkylene group of 1–18 carbon atoms;

$R^{L04}$ is a tertiary alkyl group of 4–20 carbon atoms, a trialkylsilyl group in which each alkyl moiety has 1–6 carbon atoms, an oxoalkyl group of 4–20 carbon atoms, or a group of formula (L1);

letter y is an integer of 0–6;

$R^{L05}$ is a monovalent hydrocarbon group of 1–8 carbon atoms which may contain a hetero atom or a substituted or unsubstituted aryl group of 6–20 carbon atoms;

letter m is equal to 0 or 1, n is equal to 0, 1, 2 or 3, and 2 m+n is equal to 2 or 3;

$R^{L06}$ is a monovalent hydrocarbon group of 1–8 carbon atoms which may contain a hetero atom or a substituted or unsubstituted aryl group of 6–20 carbon atoms;

$R^{L07}$–$R^{L16}$, independently, are hydrogen or monovalent hydrocarbon groups of 1–15 carbon atoms which may contain a hetero atom, or $R^{L07}$–$R^{L16}$, taken together, form a ring where each of $R^{L07}$–$R^{L16}$ is a divalent $C_1$–$C_{15}$ hydrocarbon group which may contain a hetero atom;

or a tertiary alkyl group of 4–20 carbon atoms, a trialkylsilyl group wherein each alkyl moiety has 1–6 carbon atoms, or an oxoalkyl group of 4–20 carbon atoms.

\* \* \* \* \*